United States Patent
Park et al.

(10) Patent No.: US 9,508,727 B2
(45) Date of Patent: Nov. 29, 2016

(54) INTEGRATED CIRCUIT DEVICE AND METHOD OF MANUFACTURING THE SAME

(71) Applicants: Hong-bae Park, Seoul (KR); Ja-hum Ku, Seoul (KR); Myeong-cheol Kim, Suwon-si (KR); Jin-wook Lee, Seoul (KR); Sung-kee Han, Seoul (KR)

(72) Inventors: Hong-bae Park, Seoul (KR); Ja-hum Ku, Seoul (KR); Myeong-cheol Kim, Suwon-si (KR); Jin-wook Lee, Seoul (KR); Sung-kee Han, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/853,442

(22) Filed: Sep. 14, 2015

(65) Prior Publication Data

US 2016/0133632 A1    May 12, 2016

(30) Foreign Application Priority Data

Nov. 12, 2014  (KR) .......................... 10-2014-0157335

(51) Int. Cl.
| | |
|---|---|
| H01L 21/336 | (2006.01) |
| H01L 29/78 | (2006.01) |
| H01L 27/088 | (2006.01) |
| H01L 29/66 | (2006.01) |
| H01L 27/11 | (2006.01) |
| H01L 27/092 | (2006.01) |
| H01L 27/02 | (2006.01) |

(52) U.S. Cl.
CPC ....... *H01L 27/1104* (2013.01); *H01L 27/0207* (2013.01); *H01L 27/0924* (2013.01)

(58) Field of Classification Search
CPC ............ H01L 27/1104; H01L 27/0207; H01L 27/0924
USPC ........................................................ 257/369
See application file for complete search history.

(56) References Cited

U.S. PATENT DOCUMENTS

| | | | |
|---|---|---|---|
| 6,660,596 B2 | 12/2003 | Adkisson et al. | |
| 7,037,790 B2 | 5/2006 | Chang et al. | |
| 7,512,017 B2 | 3/2009 | Chang | |
| 7,825,482 B2 | 11/2010 | Okazaki et al. | |
| 7,923,337 B2 | 4/2011 | Chang et al. | |
| 8,741,722 B2 | 6/2014 | Chang et al. | |
| 2005/0026377 A1* | 2/2005 | Kawasaki | H01L 21/845 438/301 |
| 2005/0124120 A1* | 6/2005 | Du | H01L 21/823437 438/283 |
| 2005/0205932 A1* | 9/2005 | Cohen | H01L 21/823412 257/347 |

(Continued)

FOREIGN PATENT DOCUMENTS

| | | |
|---|---|---|
| JP | 2008-021903 | 1/2008 |
| KR | 10-2005-0024099 | 3/2005 |

*Primary Examiner* — Vongsavanh Sengdara
*Assistant Examiner* — Thai T Vuong
(74) *Attorney, Agent, or Firm* — Muir Patent Law, PLLC

(57) ABSTRACT

A method includes providing a plurality of active regions on a substrate, and at least a first device isolation layer between two of the plurality of active regions, wherein the plurality of active regions extend in a first direction; providing a gate layer extending in a second direction, the gate layer forming a plurality of gate lines including a first gate line and a second gate line extending in a straight line with respect to each other and having a space therebetween, each of the first gate line and second gate line crossing at least one of the active regions, providing an insulation layer covering the first device isolation layer and covering the active region around each of the first and second gate lines; and providing an inter-gate insulation region in the space between the first gate line and the second gate line.

23 Claims, 48 Drawing Sheets

(56) References Cited

U.S. PATENT DOCUMENTS

| | | | |
|---|---|---|---|
| 2005/0239242 A1* | 10/2005 | Zhu | H01L 21/845 438/199 |
| 2005/0242406 A1* | 11/2005 | Hareland | H01L 29/1054 257/401 |
| 2005/0272192 A1* | 12/2005 | Oh | H01L 29/66553 438/197 |
| 2006/0076625 A1* | 4/2006 | Lee | H01L 29/7851 257/353 |
| 2007/0057325 A1* | 3/2007 | Hsu | H01L 29/785 257/347 |
| 2008/0079094 A1* | 4/2008 | Jin | H01L 29/66628 257/401 |
| 2009/0001464 A1* | 1/2009 | Booth, Jr. | H01L 29/785 257/347 |
| 2009/0008705 A1* | 1/2009 | Zhu | H01L 29/66795 257/327 |
| 2009/0095980 A1* | 4/2009 | Yu | H01L 29/66795 257/190 |
| 2010/0144121 A1* | 6/2010 | Chang | H01L 29/7851 438/478 |
| 2014/0153322 A1 | 6/2014 | Liaw | |
| 2014/0153323 A1 | 6/2014 | Liaw | |

\* cited by examiner

C - C'

D - D'

C - C'

D - D'

PC – PC'

PC – PC'

C - C'

PB - PB'

PC – PC'

C - C'

PB - PB'

C - C'

PB - PB'

C - C'

PC - PC'

C - C'

PC - PC'

INTEGRATED CIRCUIT DEVICE AND METHOD OF MANUFACTURING THE SAME

CROSS-REFERENCE TO RELATED APPLICATION

This application claims the benefit of Korean Patent Application No. 10-2014-0157335, filed on Nov. 12, 2014, in the Korean Intellectual Property Office, the disclosure of which is incorporated herein in its entirety by reference.

BACKGROUND

This disclosure relates to an integrated circuit device and a method of manufacturing the same, and more particularly, to an integrated circuit device including a field effect transistor (FET) and a method of manufacturing the integrated circuit device.

As feature size of a metal oxide semiconductor (MOS) transistor is reduced, a length of a gate and a length of a channel formed under the gate are also reduced. Accordingly, in order to improve operational stability and reliability of transistors, which are important factors that decide performance of integrated circuit devices, various attempts are being made to improve a manufacturing process and a structure of the integrated circuit devices.

SUMMARY

Example embodiments provide an integrated circuit device including a plurality of gate lines which may prevent problems from occurring near an isolation region of the gate lines.

Example embodiments provide a method of manufacturing an integrated circuit device including a plurality of gate lines formed using a replacement metal gate (RMG) process, in which problems occurring near an isolation region of the gate lines may be prevented.

According to an aspect of the inventive concept, an integrated circuit device includes: a plurality of active regions formed on a substrate and extending in a first direction; a first gate line and a second gate line formed on the substrate, extending in a straight line in a second direction and crossing the plurality of active regions, wherein the first gate line and the second gate line are spaced apart from each other; a first gate insulation layer extending in the second direction and covering a first surface of the first gate line facing a portion of the plurality of active regions and a first long-axis sidewall of the first gate line, while not covering a first short-axis sidewall of the first gate line facing the second gate line; a second gate insulation layer extending in the second direction and covering a second surface of the second gate line facing another portion of the plurality of active regions and a second long-axis sidewall of the second gate line, while not covering a second short-axis sidewall of the second gate line facing the first gate line; and an inter-gate insulation region interposed between the first gate line and the second gate line and abutting the first short-axis sidewall and the second short-axis sidewall.

The first gate line and the second gate line may each include a metal.

The plurality of active regions may be formed of a plurality of fin-type active regions protruding from the substrate. The first gate line may extend to cover a first group active region including at least one fin-type active region selected from the plurality of fin-type active regions, and the second gate line may extend to cover a second group active region including at least one fin-type active region selected from the plurality of fin-type active regions and spaced apart from the first group active region.

The first gate line and the second gate line may each have a planar upper surface, and the planar surfaces may be positioned at a first level on the substrate.

The first gate insulation layer and the second gate insulation layer may be spaced apart from each other, and the inter-gate insulation region may be between the first gate insulation layer and the second gate insulation layer.

The first gate insulation layer and the second gate insulation layer may be integrally connected to each other.

The integrated circuit device may further include a third gate insulation layer interposed between the substrate and the inter-gate insulation region. The first gate insulation layer and the second gate insulation layer may be integrally connected to each other via the third gate insulation layer.

The integrated circuit device may further include: a first insulation spacer covering the first long-axis sidewall of the first gate line, wherein the first gate insulation layer is between the first insulation spacer and the first long-axis sidewall; and a second insulation spacer covering the second long-axis sidewall of the second gate line, wherein the second gate insulation layer is between the second insulation spacer and the second long-axis sidewall. The first insulation spacer and the second insulation spacer may be integrally connected to each other. The integrated circuit device may further include a third insulation spacer covering a portion of the inter-gate insulation region, wherein the first insulation spacer and the second insulation spacer are integrally connected to each other via the third insulation spacer.

The integrated circuit device may further include: a first insulation spacer covering the first long-axis sidewall of the first gate line, wherein the first gate insulation layer is between the first insulation spacer and the first long-axis sidewall; and a second insulation spacer covering the second long-axis sidewall of the second gate line, wherein the second gate insulation layer is between the second insulation spacer and the second long-axis sidewall, wherein the first insulation spacer and the second insulation spacer are spaced apart from each other, and the inter-gate insulation region is between the first insulation spacer and the second insulation spacer.

According to certain aspects of the inventive concept, the plurality of active regions, first gate line, second gate line, first gate insulating layer, second gate insulating layer, and inter-gate insulation region form part of a static random access memory (SRAM) array comprising a plurality of SRAM cells formed on the substrate.

The SRAM array may further include: a plurality of inverters each including a pull up transistor and a pull down transistor; a plurality of pass transistors respectively connected to output nodes of the plurality of inverters, wherein the first gate line is shared by a pull up transistor and a pull down transistor of a first inverter selected from the plurality of inverters, and the second gate line is shared by two pass transistors selected from the plurality of pass transistors.

The SRAM array may further include: a plurality of inverters each including a pull up transistor and a pull down transistor; a plurality of pass transistors respectively connected to output nodes of the plurality of inverters, wherein the first gate line is shared by a pull up transistor and a pull down transistor of a first inverter selected from the plurality of inverters, and the second gate line is shared by a pull up transistor and a pull down transistor of a second inverter selected from the plurality of inverters.

The SRAM array may further include a plurality of NMOS transistors and a plurality of PMOS transistors, wherein the first gate line and the second gate line are each shared by a plurality of transistors including channels of the same conductivity type as one another, selected from the plurality of NMOS transistors and the plurality of PMOS transistors.

The SRAM array may further include a plurality of NMOS transistors and a plurality of PMOS transistors, wherein the first gate line and the second gate line are each shared by a plurality of transistors including channels of different conductivity types, selected from the plurality of NMOS transistors and the plurality of PMOS transistors.

The SRAM array may further include a plurality of NMOS transistors and a plurality of PMOS transistors, wherein one of the first gate line and the second gate line is shared by a plurality of transistors including channels of the same conductivity type as one another, selected from the plurality of NMOS transistors and the plurality of PMOS transistors, and the other of the first gate line and the second gate line is shared by a plurality of transistors including channels of different conductivity types, selected from the plurality of NMOS transistors and the plurality of PMOS transistors.

The plurality of active regions may be formed of a plurality of fin-type active regions protruding from the substrate, wherein the first gate line extends to cover two sidewalls and an upper surface of a first fin-type active region selected from the plurality of active regions, and the second gate line extends to cover two sidewalls and an upper surface of a second fin-type active region selected from the plurality of active regions and spaced apart from the first fin-type active region.

The first gate line and the second gate line may each include a metal layer extending in the second direction and having a planar upper surface parallel to the substrate, and the metal layers are positioned at a first level on the substrate.

According to certain aspects of the inventive concept, the substrate includes a plurality of cells each having a cell boundary and including at least one logic circuit, the plurality of active regions are included among a first cell and a second cell adjacent to each other among the plurality of cells, the first gate line is included in the first cell, and the second gate line is included in the second cell.

The inter-gate insulation region may be disposed between the cell boundary of the first cell and the cell boundary of the second cell.

The plurality of active regions may be formed of a plurality of fin-type active regions protruding from the substrate, and the first gate line and the second gate line may be shared by a plurality of fin field effect transistors (FinFET) formed on the substrate.

The first gate line and the second gate line may be shared by a plurality of planar metal oxide semiconductor field effect transistors (MOSFET) formed on the substrate.

The first gate line and the second gate line may each include a metal layer extending in the second direction and having a planar upper surface parallel to the substrate, wherein the metal layers are positioned at a first level on the substrate.

According to certain aspects of the inventive concept, a method of manufacturing an integrated circuit device includes: forming a plurality of active regions on a substrate and a device isolation layer defining the plurality of active regions, wherein the plurality of active regions extend in a first direction; forming a dummy gate line on the device isolation layer, wherein the dummy gate line extends in a second direction and crosses the plurality of active regions; forming a first source/drain region and a second source/drain region on portions of the plurality of active regions respectively exposed at opposite sides of the dummy gate line; forming an insulation layer covering the device isolation layer and the first and second source/drain regions around the dummy gate line; forming a gate hole extending between the first and second source/drain regions by removing the dummy gate line; forming a gate insulation layer and a gate layer in the gate hole; and dividing the gate layer into a plurality of gate lines by removing a portion of the gate layer on the device isolation layer.

The dividing of the gate layer into a plurality of gate lines may include dividing the gate layer into a first gate line and a second gate line having a space therebetween. The method may further include, after the dividing of the gate layer into a plurality of gate lines, forming an inter-gate insulation region in the space.

The inter-gate insulation region may include a silicon oxide, a silicon nitride, air space, or a combination thereof.

A portion of the gate insulation layer may be exposed in the space after the dividing of the gate layer, but before the forming of the inter-gate insulation region, and the inter-gate insulation region may be formed to contact the exposed portion of the gate insulation layer.

The method may further include dividing the gate insulation layer into a first gate insulation layer and a second gate insulation layer spaced apart from each other, by removing a portion of the gate insulation layer on the device isolation layer while dividing the gate layer into a plurality of gate lines. The inter-gate insulation region may be formed between and contacts the first gate insulation layer and the second gate insulation layer.

A portion of the device isolation layer may be exposed in the space after the dividing of the gate layer, but before the forming of the inter-gate insulation region, and the inter-gate insulation region may be formed to contact the exposed portion of the device isolation layer.

The method may further include forming an insulation spacer on two sidewalls of the dummy gate line after the forming of the dummy gate line, but before the forming of the pair of source/drain regions, wherein after the dividing of the gate layer into a plurality of gate lines, the device isolation layer and the insulation spacer in areas between the plurality of gate lines are exposed.

The method may further include forming an inter-gate insulation region in a space between adjacent gates lines among the plurality of gate lines, wherein the inter-gate insulation region contacts the device isolation layer and the insulation spacer.

The method may further include dividing the insulation spacer into a first insulation spacer and a second insulation spacer spaced apart from each other, by removing a portion of the insulation spacer on the device isolation layer while dividing the gate layer into a plurality of gate lines. The inter-gate insulation region may be formed between and contacts the first insulation spacer and the second insulation spacer.

The forming of the plurality of active regions and the device isolation layer defining the plurality of active regions may include: forming a plurality of fin-type active regions protruding from the substrate; forming an insulation layer covering the plurality of fin-type active regions; and removing a portion of the insulation layer such that the plurality of fin-type active regions protrude so as to form the device isolation layer that is formed of a remaining portion of the insulation layer.

The dividing of the gate layer into a plurality of gate lines may include dividing the gate layer into a first gate line and a second gate line spaced apart from each other. The first gate line and the second gate line may cross at least two of the plurality of active regions.

According to certain aspects of the inventive concept, a method includes: providing a plurality of active regions on a substrate, and at least a first device isolation layer between two of the plurality of active regions, wherein the plurality of active regions extend in a first direction; providing a first source/drain region and a second source/drain region on portions of each of the plurality of active regions; providing a gate layer extending in a second direction, the gate layer forming a plurality of gate lines including a first gate line and a second gate line extending in a straight line with respect to each other and having a space therebetween, each of the first gate line and second gate line crossing at least one of the active regions, wherein first source/drain region and second source/drain region each are respectively disposed on opposite sides of a respective gate line; providing an insulation layer covering the first device isolation layer and covering the first and second source/drain regions around each of the first and second gate lines; and providing an inter-gate insulation region in the space between the first gate line and the second gate line.

The method may further include, prior to providing the gate layer, forming a dummy gate line on the device isolation layer, wherein: the dummy gate line extends in the second direction and crosses the plurality of active regions, and the dummy gate line is formed between a plurality of first source/drain regions and respective second source/drain regions on portions of the plurality of active regions respectively exposed at two opposite sides of the dummy gate line. The method may further include forming a gate hole extending between the respective first and second source/drain regions by removing the dummy gate line; and forming a gate insulation layer and the gate layer in the gate hole.

Forming the first and second gate lines and the space therebetween may include removing a portion of the gate layer on the device isolation layer.

Forming the inter-gate insulation region may include filling an insulative material in the space created by removing the portion of the gate layer.

The inter-gate insulation region may include a silicon oxide, a silicon nitride, air space, or a combination thereof.

The method may include providing an insulation spacer on a sidewall of the gate layer, the insulation spacer extending continuously between the first gate line and the second gate line.

BRIEF DESCRIPTION OF THE DRAWINGS

Example embodiments of the inventive concept will be more clearly understood from the following detailed description taken in conjunction with the accompanying drawings in which:

FIGS. 10A through 20C are cross-sectional views illustrating a method of manufacturing an integrated circuit device according to example embodiments of the inventive concept in a process order; FIGS. 10A through 20A are cross-sectional views illustrating a portion of an integrated circuit device corresponding to the cross-section cut along line C-C' of FIG. 1B; FIGS. 10B through 20B are respective cross-sectional views of the integrated circuit device of FIGS. 10A through 20A cut along line PB-PB'; FIGS. 10C through 20C are respective cross-sectional views of the integrated circuit device of FIGS. 10A through 20A cut along line PC-PC;

FIGS. 21A through 25B are cross-sectional views illustrating a method of manufacturing an integrated circuit device according to certain example embodiments of the inventive concept in a process order; FIGS. 21A through 25A are cross-sectional views illustrating a portion of an integrated circuit device corresponding to the cross-section cut along line C-C' of FIG. 1B; FIGS. 21B through 25B are respective cross-sectional views of the integrated circuit device of FIGS. 21A through 25A cut along line PC-PC';

Figure 1A:
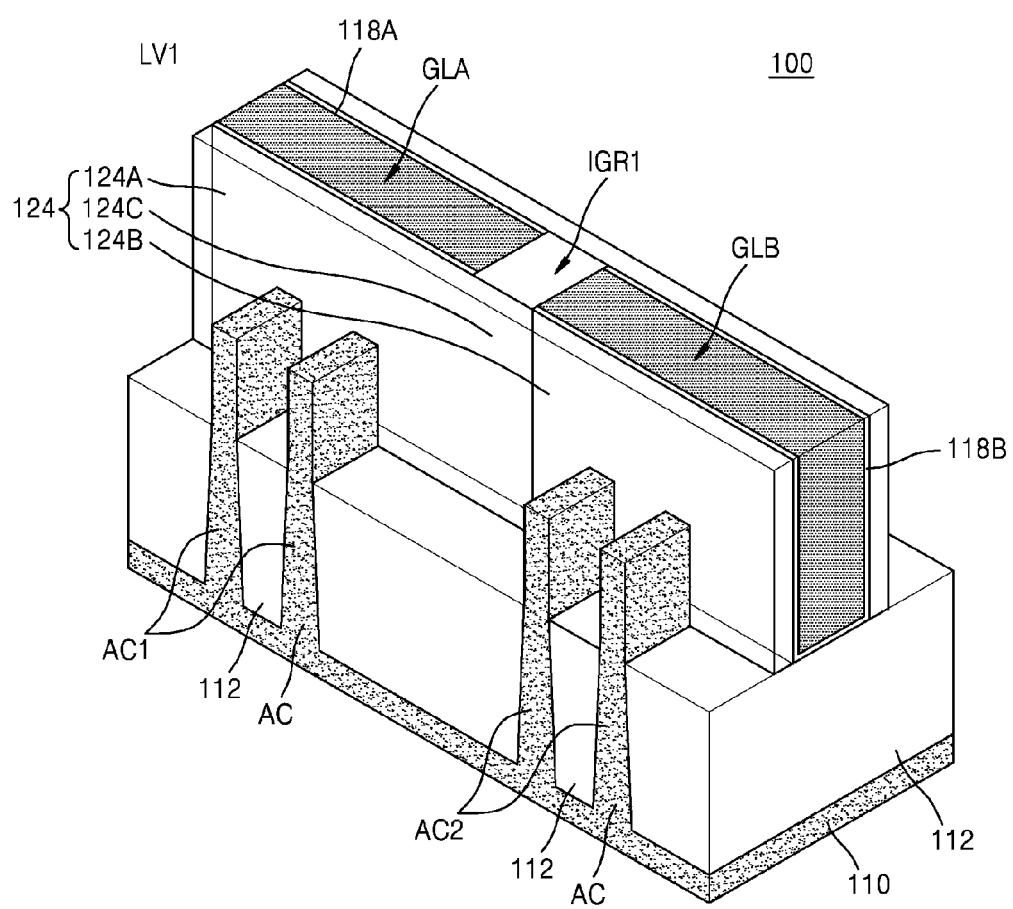
FIG. 1A is a perspective view of particular elements of an integrated circuit device according to example embodiments of the inventive concept.

These figures are exemplary only, and therefore show examples of certain embodiments. Therefore, figures illustrating a more detailed view or a different view of an item from a previous figure are only showing examples of that feature and do not limit that feature to the examples shown. Thus, the figures are not intended to limit the scope of the invention to any particular examples.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

Hereinafter, the inventive concept will be described more fully with reference to the accompanying drawings, in which example embodiments of the invention are shown. In the drawings, like elements are labeled with like reference numerals and repeated description thereof will be omitted.

This inventive concept may, however, be embodied in many different forms and should not be construed as limited to the example embodiments set forth herein.

In the present description, terms such as 'first', 'second', etc. are used to describe various members, areas, layers, regions, and/or components. However, the members, areas, layers, regions, and/or components should not be defined by these terms. Unless the context indicates otherwise, these terms should not be construed as indicating any particular order or whether an element is at the upper or lower side or superior or inferior, and are used only for distinguishing one member, area, layer, region, or component from another member, area, layer, region, or component. Thus, a first member, area, layer, region, or component described in one part of the specification may also be referred to as a second member, area, layer, region, or component, in another part of the specification, without departing from the teaching of the inventive concept. Also, without departing from the scope of the inventive concept, a first component may be referred to as a second component, and similarly, a second component may be referred to as a first component. Further, the terms "first," "second," etc., may be used in the claims to differentiate different components or steps from each other, for example as a naming convention, even though those terms "first," "second," etc., are not explicitly recited in the specification to refer to those components or steps.

Unless defined differently, all terms used in the description including technical and scientific terms have the same meaning as generally understood by those skilled in the art. Terms that are commonly used and defined in a dictionary should be construed as having the same meaning as in an associated technical context, and unless defined apparently in the description, the terms are not ideally or excessively construed as having formal meaning.

When an example embodiment is implementable in another manner, a predetermined process order may be different from a described one. For example, two processes that are consecutively described may be substantially simultaneously performed or may be performed in an opposite order to the described order.

In the drawings, for example, according to the manufacturing techniques and/or tolerances, shapes of the illustrated elements may be modified. Thus, the inventive concept should not be construed as being limited to the example embodiments set forth herein, and should include, for example, shape variations caused during manufacture.

It will be understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the example views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

FIG. 1A is a perspective view of particular elements of an integrated circuit device 100 according to example embodiments of the inventive concept.

Figure 1B:
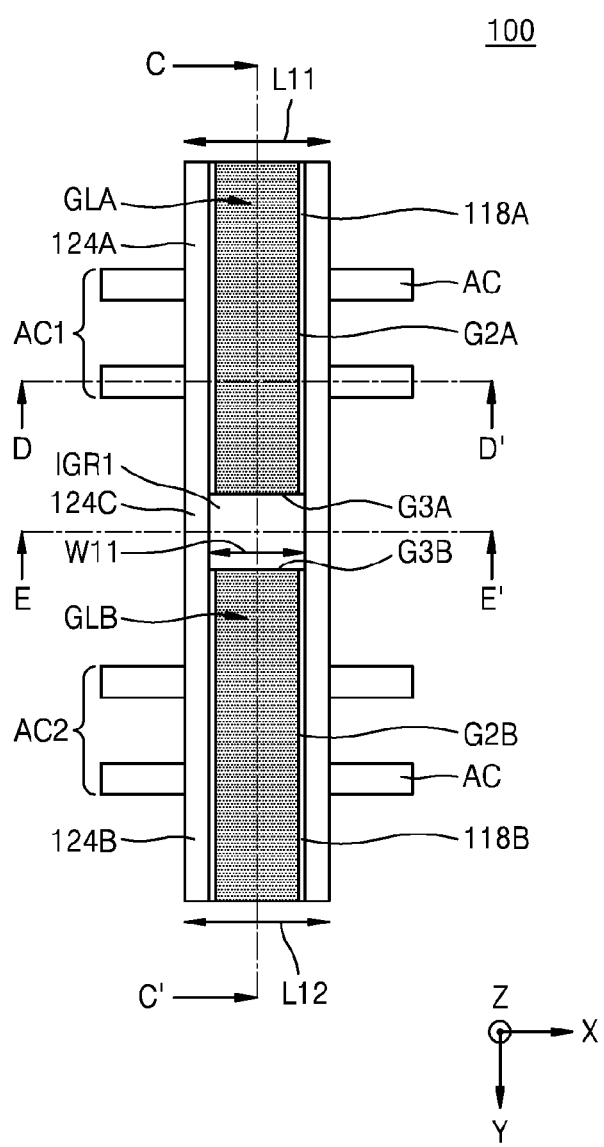
FIG. 1B is a plan view of the particular elements of the integrated circuit device of FIG. 1A.
Figure 1C:
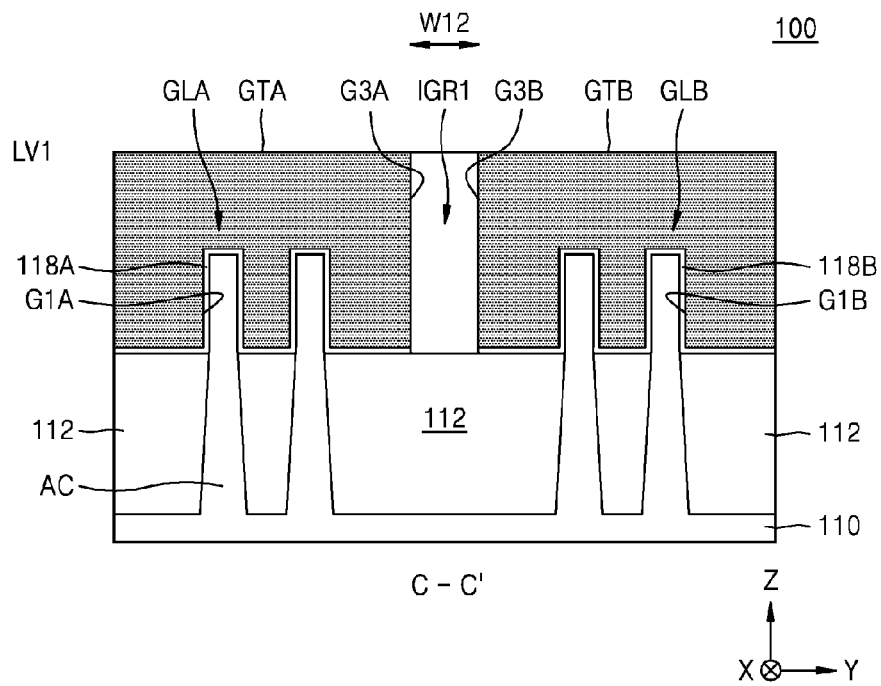
FIG. 1C is a cross-sectional view of the integrated circuit device cut along line C-C' of FIG. 1B.
Figure 1D:
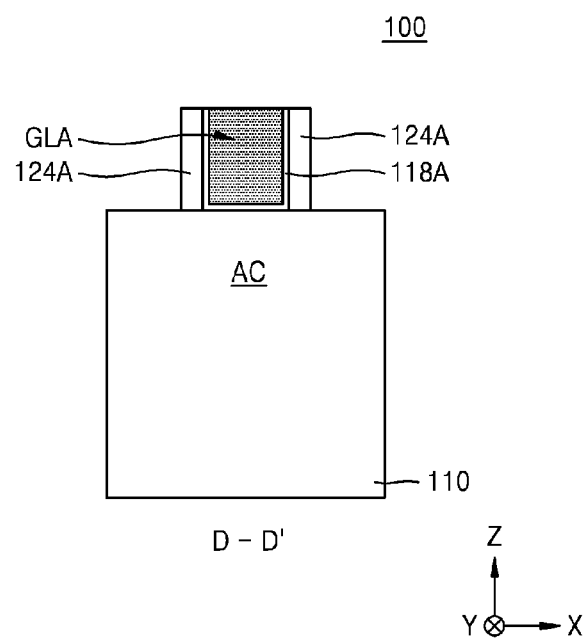
FIG. 1D is a cross-sectional view of the integrated circuit device cut along line D-D' of FIG. 1B.
Figure 1E:
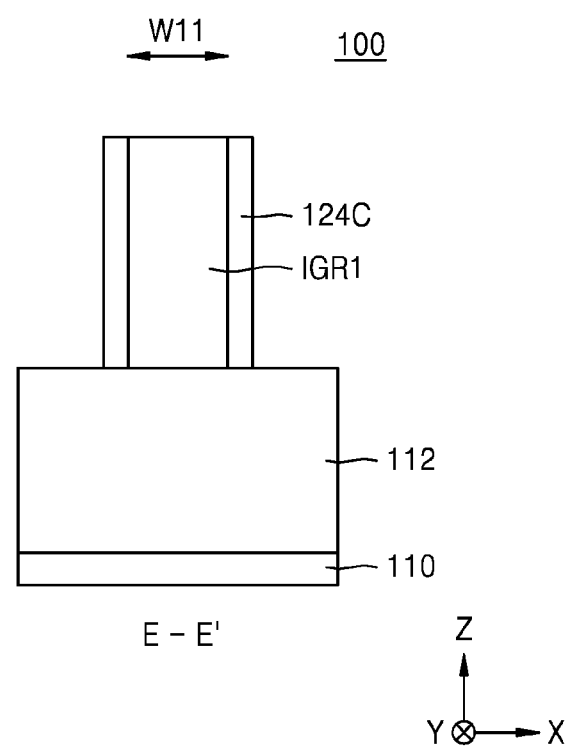
FIG. 1E is a cross-sectional view of the integrated circuit device cut along line E-E' of FIG. 1B.

FIG. 1B is a plan view of the particular elements of the integrated circuit device 100 of FIG. 1A. FIG. 1C is a cross-sectional view of the integrated circuit device 100 cut along line C-C' of FIG. 1B. FIG. 1D is a cross-sectional view of the integrated circuit device 100 cut along line D-D' of FIG. 1B. FIG. 1E is a cross-sectional view of the integrated circuit device 100 cut along line E-E' of FIG. 1B.

Because the integrated circuit devices described herein may be formed of semiconductor materials, they may be referred to herein as semiconductor devices. As used herein, an integrated circuit device, or semiconductor device, may refer to a transistor, or a group of transistors or an integrated circuit including such a group of transistors such as depicted in various of the figures herein. A semiconductor device or integrated circuit device may also refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to any of these semiconductor devices, but may additionally include products that include these devices, such as a memory module, a hard drive including additional components, or a mobile phone, laptop, tablet, desktop, camera, or other consumer electronic device, etc.

Referring to FIGS. 1A through 1E, the integrated circuit device 100 may be provided to include a plurality of active regions AC extending on a substrate 110 in a first direction (X direction).

In some embodiments, the substrate 110 may include a semiconductor such as Ge or a compound semiconductor such as SiGe, SiC, GaAs, InAs or InP. According to certain example embodiments, the substrate 110 may have a silicon on insulator (SOI) structure. The substrate 110 may include a conductive region such as an impurity-doped well or an impurity-doped structure.

The plurality of active regions AC extend in parallel to one another in the first direction (X direction). The plurality of active regions AC may be formed of a plurality of fin-type active regions protruding from the substrate 110.

A device isolation layer 112 is formed between two adjacent active regions AC among the plurality of active regions AC on the substrate 110. The plurality of active regions AC may protrude from the device isolation layer 112 in the form of fins. The device isolation layer between two fins or two active regions may be referred to as a device isolation region. The device isolation regions may each separate active regions from each other.

A first gate line GLA and a second gate line GLB extend across the substrate 110 in a straight line in a second direction (Y direction) to cross the plurality of active regions AC. The first gate line GLA and the second gate line GLB extend across the device isolation layer 112 to cross the plurality of active regions AC while covering an upper surface and two sidewalls of each of the plurality of active regions AC.

In some embodiments, the first gate line GLA may extend to cover a first group active region AC1 including at least one active region AC selected from the plurality of active regions AC. The second gate line GLB may extend to cover a second group active region AC2 including at least one active region AC selected from the plurality of active regions AC and separated from the first group active region AC1. Although the first group active region AC1 and the second group active region AC2 each including two active regions AC are illustrated in FIGS. 1A through 1E, the inventive concept is not limited thereto. For example, the first group active region AC1 and the second group active region AC2 may each include one active region AC or three or more active regions AC.

In certain embodiments, the first gate line GLA and the second gate line GLB may each include a metal. The first gate line GLA and the second gate line GLB may respectively include upper surfaces GTA and GTB, which may be planar, each upper surface extending in the second direction (Y direction) and extending in parallel to the substrate 110 at a first level LV1 on the substrate 110. The upper surfaces GTA and GTB may be portions of a metal layer, which the first gate line GLA and the second gate line GLB are formed of. The upper surfaces GTA and GTB may extend in parallel to an extension direction of the substrate 110, for example, an extension direction of an X-Y plane.

In some embodiments, the first gate line GLA and the second gate line GLB may have a structure in which a metal nitride layer, a metal layer, a conductive capping layer, and a gap-fill metal layer are sequentially stacked. For example, the metal nitride layer and the metal layer may include at least one of Ti, Ta, W, Ru, Nb, Mo, and Hf. The metal layer and the metal nitride layer may be formed using an atomic layer deposition (ALD) process, a metal organic ALD (MOALD) process, or a metal organic CVD (MOCVD) process. The conductive capping layer may function as a protection layer that prevents oxidation of a surface of the metal layer. Also, the conductive capping layer may function as an adhesive layer (wetting layer) to facilitate deposition of another conductive layer on the metal layer. The conductive capping layer may be formed of a metal nitride, for example, TiN, TaN, or a combination of these, but is not limited thereto. The gap-fill metal layer may extend on the conductive capping layer while filling space between the plurality of active regions AC. For example, the gap-fill metal layer may be formed of a W layer or a TiN layer. The gap-fill metal layer may be formed, for example, using an ALD process, a chemical vapor deposition (CVD) process or a physical vapor deposition (PVD) process. The gap-fill metal layer may fill recess space formed by a step portion on an upper surface of the conductive capping layer in the space between the plurality of active regions AC without void.

A first gate insulation layer 118A is interposed between the first gate line GLA and some of the plurality of active regions AC. Also, a second gate insulation layer 118B is interposed between the second gate line GLB and some of the plurality of active regions AC.

The integrated circuit device 100 may further include an interface layer (not shown) that is interposed between the first gate insulation layer 118A and/or the second gate insulation layer 118B and the plurality of active regions AC. In some embodiments, the interface layer may be obtained by oxidizing a surface of the plurality of active regions AC, but is not limited thereto. The interface layer may prevent a defect interface between the plurality of active regions AC and the first gate insulation layer 118A and/or the second gate insulation layer 118B. In some embodiments, the interface layer may be formed of a low-k dielectric material layer having a permittivity of 9 or less, for example, of a silicon oxide layer, a silicon oxynitride layer or a combination of these. In some another example embodiments, the interface layer may be formed of a silicate or a combination of silicate and the materials of the above-described insulation material layers.

The first gate insulation layer 118A covers a portion of the first gate line GLA. According to the example embodiment of FIGS. 1A through 1E, the first gate insulation layer 118A covers a first surface G1A of the first gate line GLA facing a portion of the plurality of active regions AC and a first long-axis sidewall G2A of the first gate line GLA extending in the second direction (Y direction) but does not cover a first short-axis sidewall G3A of the first gate line GLA facing the second gate line GLB.

The second gate insulation layer 118B covers a portion of the second gate line GLB. According to the example embodiment of FIGS. 1A through 1E, the second gate insulation layer 118B covers a second surface G1B of the second gate line GLB facing a portion of the plurality of active regions AC and a second long-axis sidewall G2B of the second gate line GLB extending in the second direction (Y direction) but does not cover a second short-axis sidewall G3B of the second gate line GLB facing the first gate line GLA.

The first gate line GLA and the second gate line GLB are spaced apart from each other with an inter-gate insulation region IGR1 included therebetween. The inter-gate insulation region IGR1 may be disposed not to vertically overlap the plurality of active regions AC. The inter-gate insulation region IGR1 may be disposed on the device isolation layer 112.

The inter-gate insulation region IGR1 may be formed of a single insulation material or a plurality of insulation materials. In some embodiments, the inter-gate insulation region IGR1 may be formed of a silicon oxide, a silicon nitride, air space or a combination of these.

The inter-gate insulation region IGR1 may abut on the first short-axis sidewall G3A of the first gate line GLA and the second short-axis sidewall G3B of the second gate line GLB.

A plurality of metal oxide semiconductor (MOS) transistors may be formed along the first gate line GLA and the second gate line GLB. In some embodiments, the plurality of MOS transistors may be formed of three-dimensional MOS transistors in which a channel is formed on two side walls and an upper surface of each of a plurality of active regions AC. In some another example embodiments, channels of the plurality of MOS transistors may be formed on two sidewalls of a plurality of active regions AC but not on an upper surface of the plurality of active regions AC.

The first gate insulation layer 118A and the second gate insulation layer 118B are spaced apart from each other with the inter-gate insulation region IGR1 included therebetween.

The first gate insulation layer 118A and the second gate insulation layer 118B may be formed of a silicon oxide layer, a high-k dielectric layer, or a combination of these. The high-k dielectric layer may be formed of a material having a higher dielectric constant than a silicon oxide layer. For example, the gate insulation layer 118 may have a dielectric constant of about 10 to about 25. In certain embodiments, the high-k dielectric layer may be formed of a material selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination of these, but the high-k dielectric layer is not limited thereto. The first gate insulation layer 118A and the second gate insulation layer 118B may be formed using, for example, an ALD process, a CVD process, or a PVD process.

The first long-axis sidewalls G2A on two sides of the first gate line GLA are covered by a first insulation spacer 124A, and the first gate insulation layer 118A is interposed between the first insulation spacer 124A and the first long-axis sidewalls G2A. Also, the second long-axis sidewalls G2B on two sides of the second gate line GLB are covered by a second insulation spacer 124B, and the second gate insulation layer 118B is interposed between the second insulation spacer 124B and the second long-axis sidewalls G2B. Two sidewalls of the inter-gate insulation region IGR1 (e.g., opposite sidewalls that extend in the same direction as the first and second long-axis sidewalls G2A and G2B) are covered by a third insulation spacer 124C. In one embodiment, the first insulation spacer 124A and the second insulation spacer 124B are integrally connected to each other via the third insulation spacer 124C to form a single insulation spacer 124. The single insulation spacer 124 may be continuously formed of a same material throughout, which may be a homogenous material. In addition, each single insulation spacer 124, and/or two opposite single insulation spacers 124 may be formed in a single process. In some embodiments, the first through third insulation spacers 124A, 124B, and 124C forming the insulation spacer 124 may be formed of a silicon nitride layer, but are not limited thereto.

A width W11 of the inter-gate insulation region IGR1 in the first direction (X direction) (refer to FIGS. 1B and 1E) may be defined by the third insulation spacers 124C respectively disposed on two sides of the inter-gate insulation region IGR1. A width W12 of the inter-gate insulation region IGR1 in the second direction (Y direction) (refer to FIG. 1C) may be defined by the first gate line GLA and the second gate line GLB.

In certain embodiments, the width W11 of the inter-gate insulation region IGR1 in the first direction (X direction) (refer to FIGS. 1B and 1E) is smaller than a first distance L11 (refer to FIG. 1B) in the first direction (X direction) between external sidewalls of the pair of first insulation spacers 124A covering the first long-axis sidewall G2A on two sides of the first gate line GLA, and smaller than a second distance L12 (refer to FIG. 1B) in the first direction (X direction) between external sidewalls of the pair of second insulation spacers 124B covering the second long-axis sidewall G2B on two sides of the second gate line GLB.

Figure 2A:
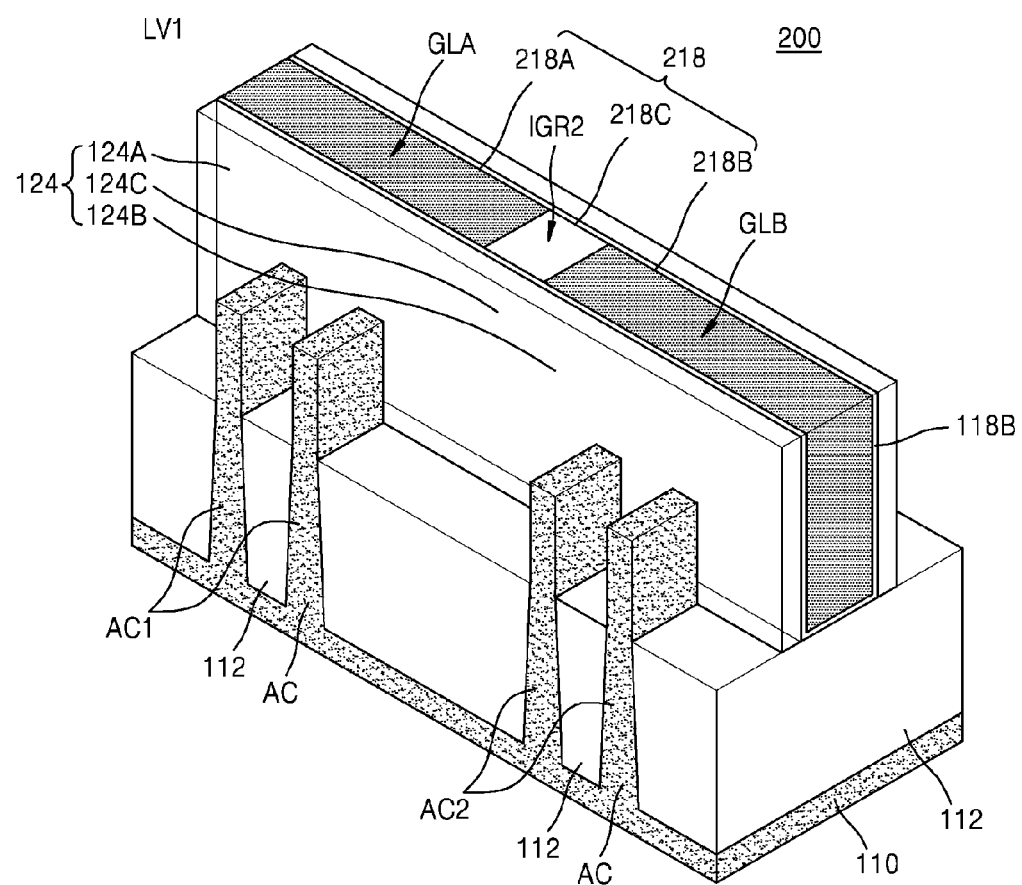
FIG. 2A is a perspective view of particular elements of an integrated circuit device according to certain example embodiments of the inventive concept.

FIG. 2A is a perspective view of particular elements of an integrated circuit device 200 according to certain example embodiments of the inventive concept.

Figure 2B:
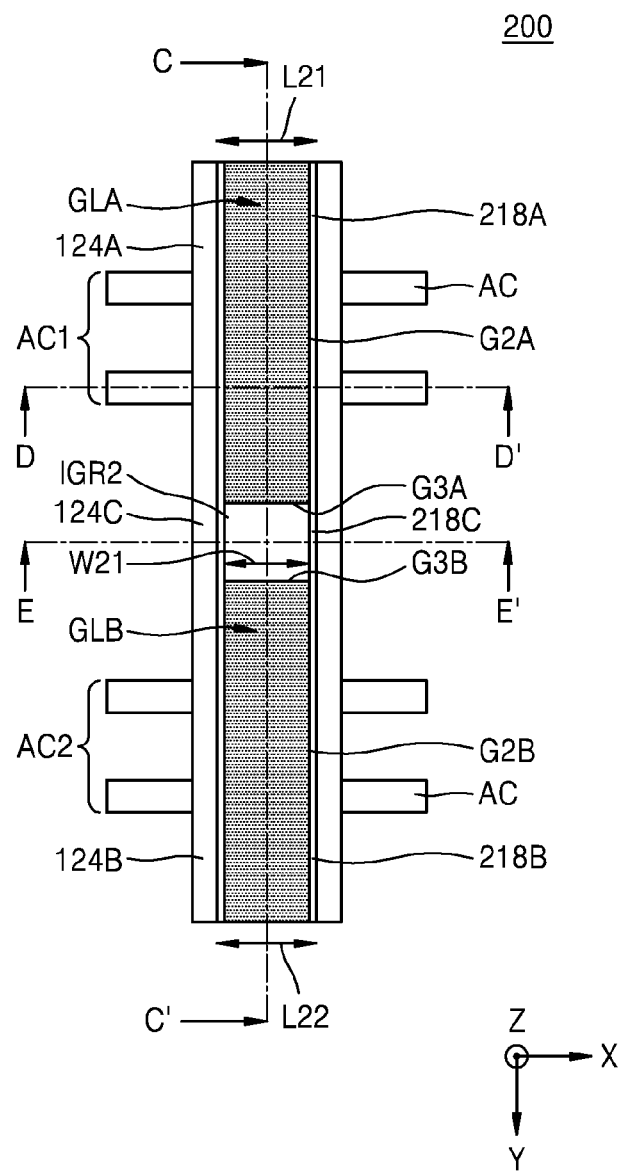
FIG. 2B is a plan view of the particular elements of the integrated circuit device of FIG. 2A.
Figure 2C:
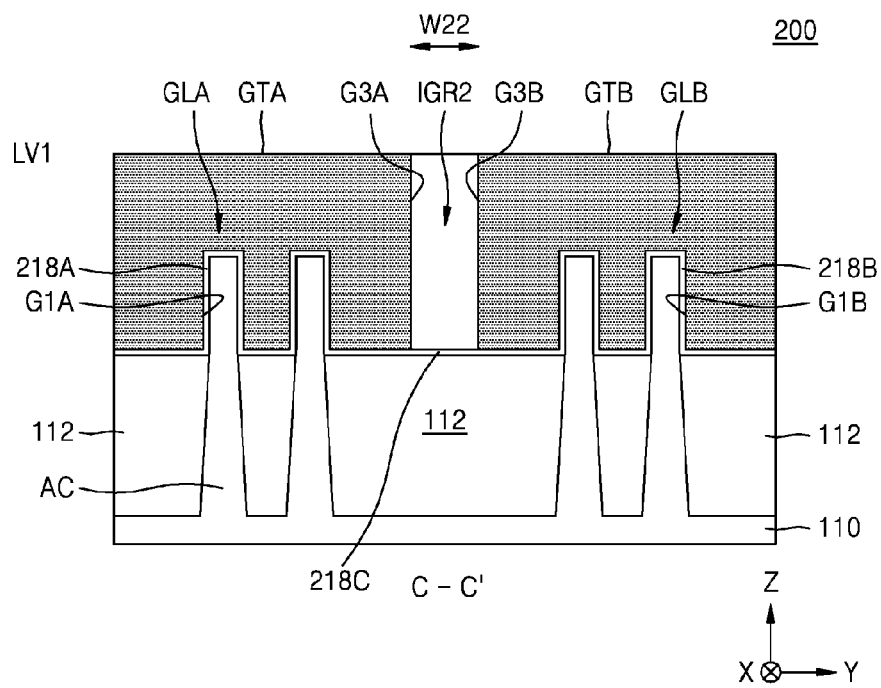
FIG. 2C is a cross-sectional view of the integrated circuit device cut along line C-C' of FIG. 2B.
Figure 2D:
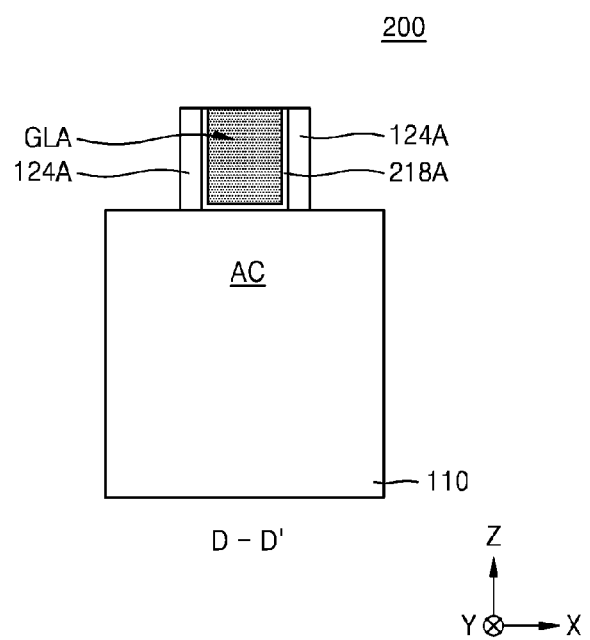
FIG. 2D is a cross-sectional view of the integrated circuit device cut along line D-D' of FIG. 2B.
Figure 2E:
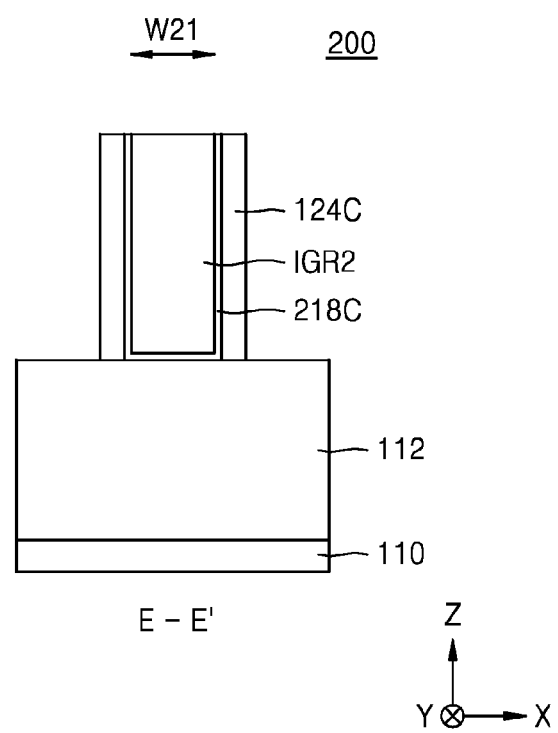
FIG. 2E is a cross-sectional view of the integrated circuit device cut along line E-E' of FIG. 2B.

FIG. 2B is a plan view of the particular elements of the integrated circuit device 200 of FIG. 2A. FIG. 2C is a cross-sectional view of the integrated circuit device 200 cut along line C-C' of FIG. 2B. FIG. 2D is a cross-sectional view of the integrated circuit device 200 cut along line D-D' of FIG. 2B. FIG. 2E is a cross-sectional view of the integrated circuit device 200 cut along line E-E' of FIG. 2B.

Like reference numerals in FIGS. 2A through 2E denote like elements in FIGS. 1A through 1E, and descriptions thereof will be omitted.

Referring to FIGS. 2A through 2E, a first gate insulation layer 218A is interposed between the first gate line GLA and the first group active region AC1, which includes some active regions AC selected from among the plurality of active regions AC. Also, a second gate insulation layer 218B is interposed between the second gate line GLB and the second group active region AC2, which includes other active regions AC selected from among the plurality of active regions AC.

According to the example embodiment of FIGS. 2A through 2E, the first gate insulation layer 218A covers a first surface G1A facing a portion of the plurality of active regions AC and a second long-axis sidewall G2A of the first gate line GLA extending in the second direction (Y direction) but does not cover a first short-axis sidewall G3A of the first gate line GLA facing the second gate line GLB. The second gate insulation layer 218B covers a second surface G1B facing a portion of the plurality of active regions AC and a first long-axis sidewall G2B extending in the second direction (Y direction), of the second gate line GLB, but does not cover a second short-axis sidewall G3B of the second gate line GLB facing the first gate line GLA.

The first gate line GLA and the second gate line GLB are spaced apart from each other with an inter-gate insulation region IGR2 included therebetween.

The inter-gate insulation region IGR2 may be formed of a single insulation material or a plurality of insulation materials. In some embodiments, the inter-gate insulation region IGR2 may be formed of a silicon oxide, a silicon nitride, air space or a combination of these.

The inter-gate insulation region IGR2 may abut on the first short-axis sidewall G3A of the first gate line GLA and the second short-axis sidewall G3B of the second gate line GLB.

The integrated circuit device 200 further includes a third gate insulation layer 218C interposed between the substrate 110 and the inter-gate insulation region IGR2. The first gate insulation layer 218A and the second gate insulation layer 218B are integrally connected to each other via the third gate insulation layer 218C. The integrally formed first, second, and third gate insulating layers 218A, 218B, and 218C may be continuously formed of a same material throughout, which may be a homogenous material. In addition, the three gate insulating layers may be formed in a single process.

In regard to further details of the first through third gate insulation layers 218A, 218B, and 218C, descriptions of the first and second gate insulation layers 118A and 118B provided with reference to FIGS. 1A through 1E also apply to the first through third gate insulation layers 218A, 218B, and 218C.

A width W21 of the inter-gate insulation region IGR2 in the first direction (X direction) (refer to FIGS. 2B and 2E) may be defined by the third gate insulation layers 218C respectively disposed on two sides of the inter-gate insulation region IGR2. A width W22 of the inter-gate insulation region IGR2 in the second direction (Y direction) (refer to FIG. 2C) may be defined by the first gate line GLA and the second gate line GLB.

The width W21 of the inter-gate insulation region IGR2 in the first direction (X direction) (refer to FIGS. 2B and 2E) is smaller than a first distance L21 (refer to FIG. 2B) in the first direction (X direction) between external sidewalls of the pair of first gate insulation layers 218A covering the first long-axis sidewall G2A on two sides of the first gate line GLA, and smaller than a second distance L22 (refer to FIG. 2B) in the first direction (X direction) between external sidewalls of the pair of second gate insulation layers 218B covering the second long-axis sidewall G2B on two sides of the second gate line GLB.

Figure 3A:
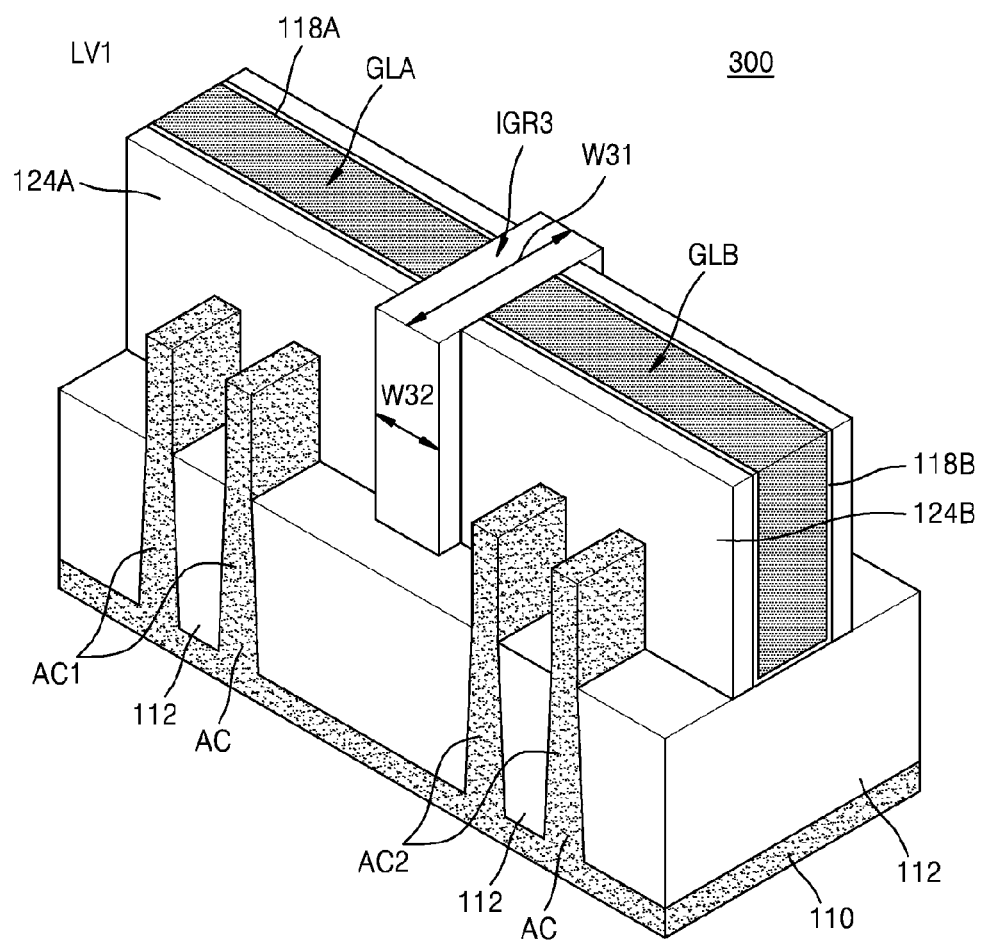
FIG. 3A is a perspective view of particular elements of an integrated circuit device according to certain example embodiments of the inventive concept.

FIG. 3A is a perspective view of particular elements of an integrated circuit device 300 according to certain example embodiments of the inventive concept.

Figure 3B:
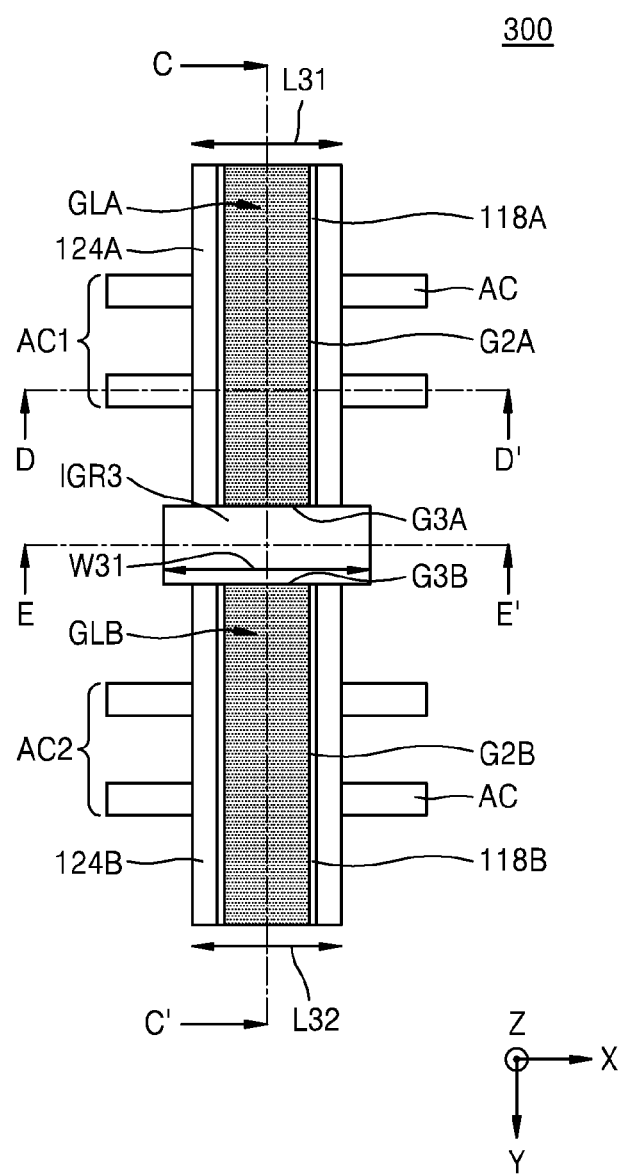
FIG. 3B is a plan view of the particular elements of the integrated circuit device of FIG. 3A.
Figure 3C:
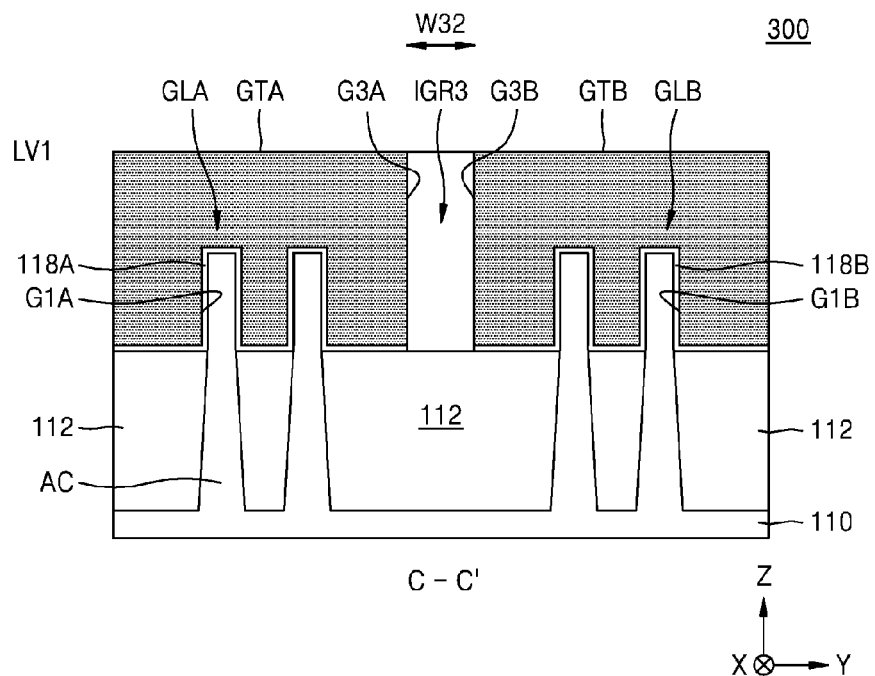
FIG. 3C is a cross-sectional view of the integrated circuit device cut along line C-C' of FIG. 3B.
Figure 3D:
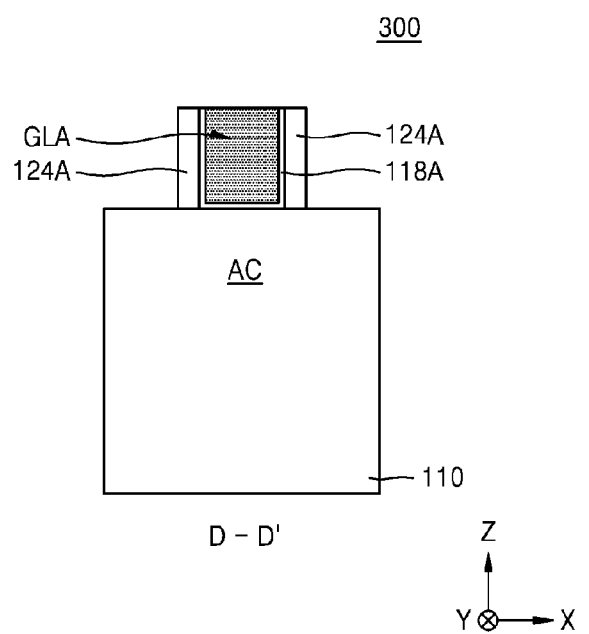
FIG. 3D is a cross-sectional view of the integrated circuit device cut along line D-D' of FIG. 3B.
Figure 3E:
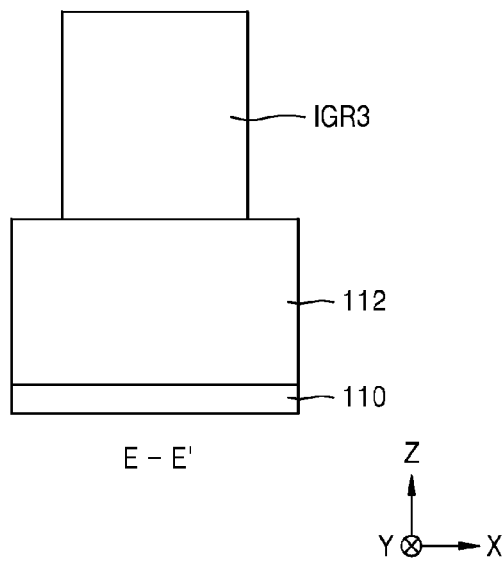
FIG. 3E is a cross-sectional view of the integrated circuit device cut along line E-E' of FIG. 3B.

FIG. 3B is a plan view of the particular elements of the integrated circuit device 300 illustrated in FIG. 3A. FIG. 3C is a cross-sectional view of the integrated circuit device 300 cut along line C-C' of FIG. 3B. FIG. 3D is a cross-sectional view of the integrated circuit device 300 cut along line D-D' of FIG. 3B. FIG. 3E is a cross-sectional view of the integrated circuit device 300 cut along line E-E' of FIG. 3B.

Like reference numerals in FIGS. 3A through 3E denote like elements as in FIGS. 1A through 1E, and description thereof will be omitted.

Referring to FIGS. 3A through 3E, the integrated circuit device 300 includes the first insulation spacer 124A covering the first long-axis sidewall G2A on two sides of the first gate line GLA with the first gate insulation layer 118A interposed between the first insulation spacer 124A and the first long-axis sidewall G2A. Also, the integrated circuit device 300 includes the second insulation spacer 124B covering the second long-axis sidewall G2B on two sides of the second gate line GLB with the second gate insulation layer 118B interposed between the second insulation spacer 124B and the second long-axis sidewall G2B.

The first gate insulation spacer 124A and the second insulation spacer 124B are spaced apart from each other with an inter-gate insulation region IGR3 included therebetween.

The width W31 of the inter-gate insulation region IGR3 in the first direction (X direction) (refer to FIGS. 3A and 3B) is greater than a first distance L31 (refer to FIG. 3B) in the first direction (X direction) between external sidewalls of the pair of first insulation spacers 124A covering the first long-axis sidewall G2A on two sides of the first gate line GLA, and greater than a second distance L32 (refer to FIG. 3B) in the first direction (X direction) between external sidewalls of the pair of second insulation spacers 124B covering the second long-axis sidewall G2B on two sides of the second gate line GLB.

A width W32 of the inter-gate insulation region IGR3 in the second direction (Y direction) (refer to FIG. 3C) may be defined by the first gate line GLA and the second gate line GLB. In this embodiment, in contrast to the embodiment shown in FIGS. 1A through 1E, the first insulating spacer 124A may be separated from the second insulating spacer 124B by the inter-gate insulation region IGR3, and no third insulating spacer (e.g., 124C in FIGS. 1A through 1E) may be formed.

Figure 4:
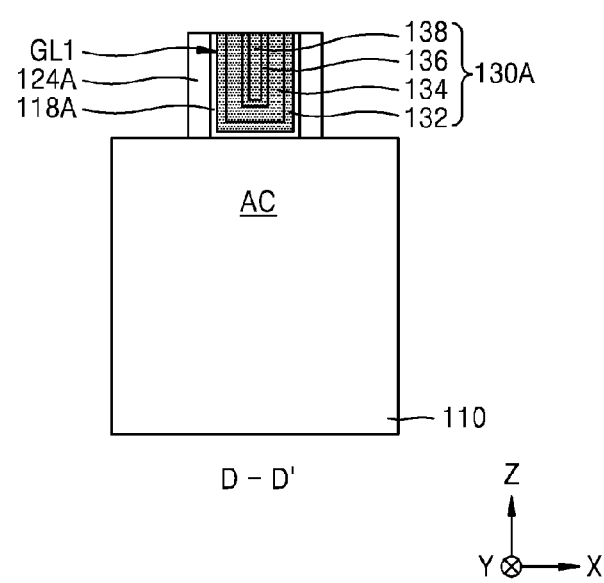
FIG. 4 is a cross-sectional view illustrating a structure of a gate line of an integrated circuit device according to certain example embodiments of the inventive concept.

FIG. 4 is a cross-sectional view illustrating a gate line GL1 having a structure illustrative of respective structures of the first gate line GLA and/or the second gate line GLB included in the integrated circuit devices 100, 200, and 300 illustrated in FIGS. 1A through 3E, according to another example embodiments of the inventive concept.

FIG. 4 illustrates a portion of the integrated circuit device 100 corresponding to the cross-sectional view of FIG. 1D cut along line D-D' of FIG. 1B. The first gate line GLA and the second gate line GLB included in the integrated circuit devices 100, 200, and 300 illustrated in FIGS. 1A through 3E may each have the same structure as the gate line GL1 illustrated in FIG. 4. While FIG. 4 illustrates a structure in which a portion of the gate line GL1 is covered by the first gate insulation layer 118A and the first insulation spacer 124A illustrated in FIGS. 1A through 1E, the example embodiments of the inventive concept are not limited thereto, and the structure may be modified or changed in various manners.

Referring to FIG. 4, the gate line GL1 may be formed of a metal-containing layer 130A including a metal nitride-containing layer 132, a work-function adjusting metal-containing layer 134, a conductive capping layer 136, and a gap-fill metal layer 138 that are sequentially formed on the first gate insulation layer 118A in a U-shape.

The metal nitride-containing layer 132 may be formed, for example, of a Ti nitride layer.

The work function adjusting metal-containing layer 134 may include, for example, at least one first metal of Ta and Ti. In some embodiments, the work function adjusting metal-containing layer 134 may include Al atoms or C atoms.

In certain embodiments, the conductive capping layer 136 may be formed of TiN, TaN, or a combination of these. In some embodiments, the conductive capping layer 136 may be omitted.

The gap-fill metal layer 138 may be formed, for example, of a metal having excellent gap-fill characteristics. In some embodiments, the gap-fill metal layer 138 may include W or TiN. The gap-fill metal layer 138 may fill recess space that may be formed on an upper surface of the conductive capping layer 136 without void.

In certain embodiments, when the gate line GL1 is used to form an NMOS transistor, the work-function adjusting metal-containing layer 134 may be formed to have a work function between about 4.1 eV to about 4.5 eV.

Figure 5:
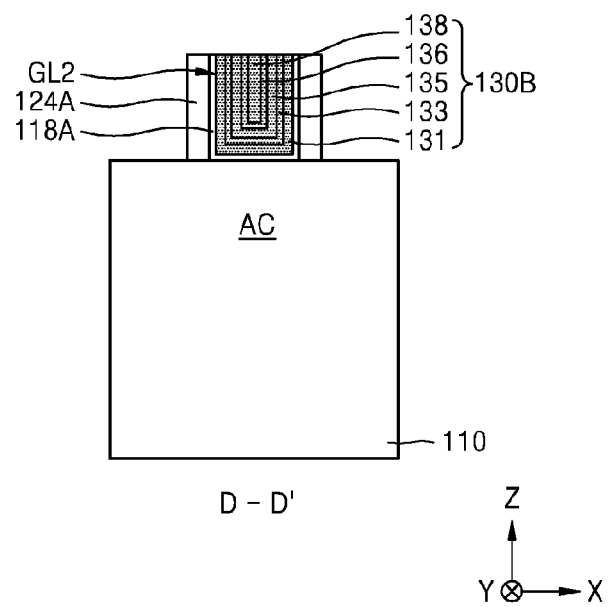
FIG. 5 is a cross-sectional view illustrating another example structure of a gate line of an integrated circuit device according to certain example embodiments of the inventive concept.

FIG. 5 is a cross-sectional view illustrating another example structure of a gate line GL2 that may be included in the first gate line GLA and/or the second gate line GLB included in the integrated circuit devices 100, 200, and 300 illustrated in FIGS. 1A through 3E, according to certain example embodiments of the inventive concept.

FIG. 5 illustrates a portion of the integrated circuit device 100 corresponding to the cross-sectional view of FIG. 1D cut along line D-D' of FIG. 1B. The first gate line GLA and the second gate line GLB included in the integrated circuit devices 100, 200, and 300 illustrated in FIGS. 1A through 3E may each have the same structure as the gate line GL2 illustrated in FIG. 5.

Like reference numerals in FIG. 5 denote like elements as in FIG. 4, and description thereof will be omitted.

Referring to FIG. 5, the gate line GL2 may be formed of a metal-containing layer 130B including a first metal nitride-containing layer 131, a second metal-nitride-containing layer 133, an Al-doped metal-containing layer 135, a conductive capping layer 136, and a gap-fill metal layer 138 that are sequentially formed on the first gate insulation layer 118A in a U-shape.

The first metal nitride-containing layer 131 and the second metal-nitride-containing layer 133 may be formed, for example, of metal nitride including at least one metal of Ti, Ta, W, Ru, Nb, Mo, and Hf. In some embodiments, the first metal nitride-containing layer 131 and the second metal nitride-containing layer 133 may be formed of a Ti nitride layer having an N content that is higher than a Ti content. The first metal nitride-containing layer 131 and the second metal nitride-containing layer 133 may each further include an O (oxygen) component.

In some embodiments, the first metal nitride-containing layer 131 and the second metal nitride-containing layer 133 may have different thicknesses. In some embodiments, a nitrogen content in the first metal nitride-containing layer 131 may be higher than a nitrogen content in the second metal nitride-containing layer 133, but the inventive concept is not limited thereto. In some embodiments, the first metal nitride-containing layer 131 includes a different metal element from the second metal-nitride-containing layer 133. In other embodiments, the first metal nitride-containing layer 131 has the same metal element as the second metal-nitride-containing layer 133.

In some embodiments, the second metal nitride-containing layer 133 may have the same composition and the same thickness as those of the metal-nitride-containing layer 132 described with reference to FIG. 4.

When the gate line GL2 is used to form a PMOS transistor, a work function may be determined based on the first metal nitride-containing layer 131 and the second metal nitride-containing layer 133. In some embodiments, the first metal nitride-containing layer 131 and the second metal nitride-containing layer 133 may be formed to have a work function between about 4.8 eV and about 5.2 eV.

The Al-doped metal-containing layer 135 may function as a barrier blocking diffusion of Al atoms into the first gate insulation layer 118A. In some embodiments, the Al-doped metal-containing layer 135 may have the same composition and the same thickness as those of the work-function adjusting metal-containing layer 134 described with reference to FIG. 4.

The different elements of the various integrated circuit devices described in FIGS. 1 through 5 may be provided as part of different electronic devices. Certain examples of these electronic devices will be described in connection with FIGS. 6 through 9 and 27 through 29 below.

Figure 6:
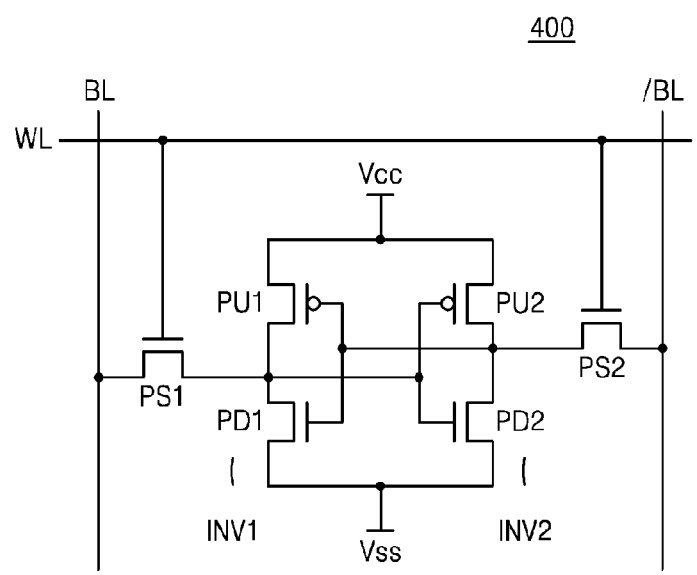
FIG. 6 is a circuit diagram illustrating an integrated circuit device according to certain example embodiments of the inventive concept.

FIG. 6 is a circuit diagram illustrating an integrated circuit device 400 according to certain example embodiments of the inventive concept. In FIG. 6, a 6T static random access memory (SRAM) including six transistors is illustrated.

Referring to FIG. 6, the integrated circuit device 400 may include a first inverter INV1 and a second inverter INV2 connected in parallel between a power supply node Vcc and a ground node Vss, and a first pass transistor PS1 and a second pass transistor PS2 respectively connected to output nodes of the first and second inverters INV1 and INV2. The first pass transistor PS1 and the second pass transistor PS2 may be connected to a bit line BL and a complementary bit line /BL, respectively. Gates of the first pass transistor PS1 and the second pass transistor PS2 may be connected to word lines WL.

The first inverter INV1 includes a first pull up transistor PU1 and a first pull down transistor PD1 connected in series, and the second inverter INV2 includes a second pull up transistor PU2 and a second pull down transistor PD2 connected in series. The first pull up transistor PU1 and the second pull up transistor PU2 may each be formed of a PMOS transistor, and the first pull down transistor PD1 and the second pull down transistor PD2 may each be formed of an NMOS transistor.

In order for the first inverter INV1 and the second inverter INV2 to form a latch circuit, an input node of the first inverter INV1 is connected to an output node of the second inverter INV2, and an input node of the second inverter INV2 is connected to an output node of the first inverter INV1.

Figure 7A:
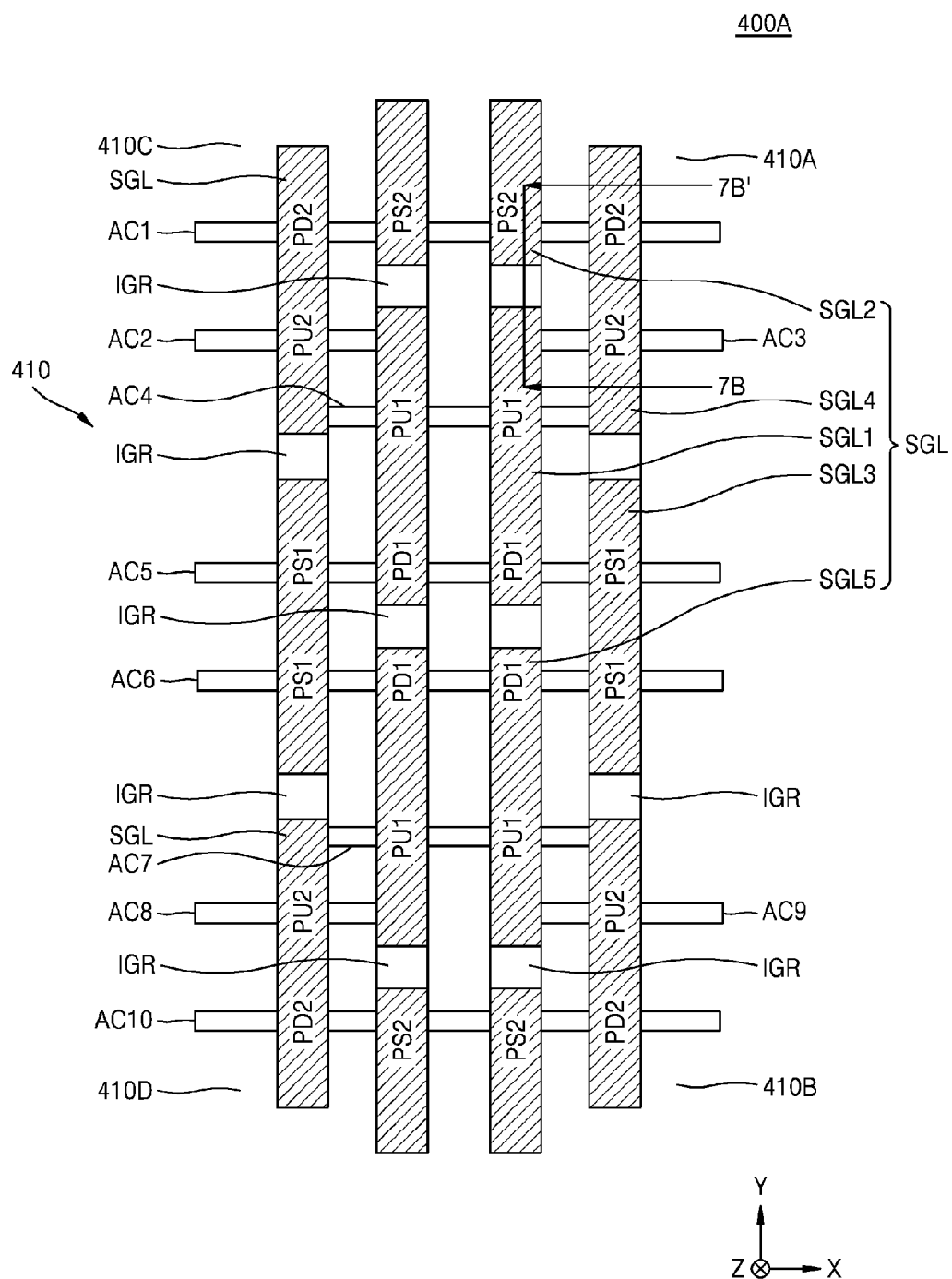
FIG. 7A is a plan view illustrating particular elements of an integrated circuit device according to example embodiments of the inventive concept.
Figure 7B:
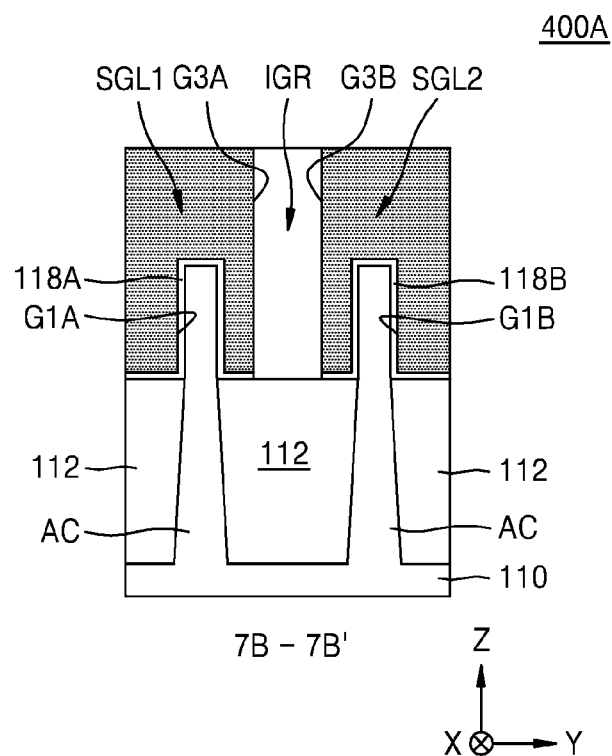
FIG. 7B is a cross-sectional view of the integrated circuit device of FIG. 7A cut along line 7B-7B.

FIG. 7A is a plan view illustrating particular elements of an integrated circuit device 400A according to example embodiments of the inventive concept. FIG. 7B is a cross-sectional view of the integrated circuit device 400A cut along line 7B-7B' of FIG. 7A. Like reference numerals in FIGS. 7A and 7B denote like elements as in FIGS. 1A through 6, and description thereof will be omitted.

Referring to FIGS. 7A and 7B, the integrated circuit device 400A includes a SRAM array 410 including a plurality of SRAM cells 410A, 410B, 410C, and 410D that are arranged in a matrix on a substrate. The four SRAM cells 410A, 410B, 410C, and 410D, each including six FinFETs, are illustrated in FIGS. 7A and 7B.

The SRAM array 410 may have the characteristics of the integrated circuit devices 100, 200, and 300 according to the inventive concept described with reference to FIGS. 1A through 5.

The plurality of SRAM cells 410A, 410B, 410C, and 410D may have the circuit structure illustrated in FIG. 6.

The plurality of SRAM cells 410A, 410B, 410C, and 410D include a plurality of active regions AC extending in parallel to one another in the first direction (X direction). The plurality of active regions AC may each be formed of a plurality of fin-type active regions protruding from the substrate 110.

Also, the plurality of SRAM cells 410A, 410B, 410C, and 410D may include a plurality of gate lines SGL extending and covering two sidewalls and an upper surface of the plurality of active regions AC and extending in the second direction (Y direction) across the first direction (X direction) and in parallel to one another. Two adjacent gate lines of the plurality of gate lines SGL may have a structure corresponding to the first gate line GLA or the second gate line GLB described with reference to FIGS. 1A through 3E.

An inter-gate insulation region IGR may be interposed between two adjacent gate lines of the plurality of gate lines SGL (e.g., in the Y direction). The inter-gate insulation region IGR may have the same or similar structure as the inter-gate insulation region IGR1 described with reference to FIGS. 1A through 1E, the inter-gate insulation region IGR2 described with reference to FIGS. 2A through 2E, or the inter-gate insulation region IGR3 described with reference to FIGS. 3A through 3E.

A first pull up transistor PU1, a first pull down transistor PD1, a first pass transistor PS1, a second pull up transistor PU2, a second pull down transistor PD2, and a second pass transistor PS2 that are used to form the plurality of SRAM cells 410A, 410B, 410C, and 410D may each be formed of a fin-type transistor. In detail, the first pull up transistor PU1 and the second pull up transistor PU2 may each be formed of a PMOS transistor, and the first pull down transistor PD1 and the second pull down transistor PD2 may each be formed of an NMOS transistor.

The plurality of gate lines SGL extend in parallel to one another in a direction to cross the plurality of active regions AC in the plurality of SRAM cells 410A, 410B, 410C, and 410D of the SRAM array 410.

A transistor may be formed at each point of intersection between the plurality of active regions AC and the plurality of gate lines SGL. For example, in the SRAM cell 410A, a transistor may be formed at each of six points of intersection between the plurality of active regions AC and the plurality of gate lines SGL; for example, six transistors may be formed in the SRAM cell 410A.

For example, in the SRAM cell 410A, the first pass transistor PS1 is formed at a point of intersection between an active region AC5 and a gate line SGL3. The second pass transistor PS2 is formed at a point of intersection between an active region AC1 and a gate line SGL2. The first pull down transistor PD1 is formed at a point of intersection between the active region AC5 and a gate line SGL1. The second pull down transistor PD2 is formed at a point of intersection between the active region AC1 and a gate line SGL4. The first pull up transistor PU1 is formed at a point of intersection between an active region AC4 and the gate line SGL1. The second pull up transistor PU2 is formed at a point of intersection between an active region AC3 and the gate line SGL4. Each of the plurality of gate lines SGL may be shared by two transistors.

For example, as in the SRAM cell 410A, the gate line SGL1 may be shared by the first pull down transistor PD1 and the first pull up transistor PU1. Also, the gate line SGL2 which forms a straight line with the gate line SGL1 and is adjacent thereto with the inter-gate insulation region IGR interposed therebetween may form the second pass transistor PS2.

In the two adjacent SRAM cells 410A and 410B, from among the two adjacent gate lines SGL that are in a straight line and include the inter-gate insulation region IGR therebetween, the gate line SGL1 in the SRAM cell 410A may be shared by the first pull up transistor PU1 and the first pull down transistor PD1 of the SRAM cell 410A, and the gate line SGL5 that is adjacent to the gate line SGL1 with the inter-gate insulation region IGR interposed therebetween may be shared by the first pull up transistor PU1 and the first pull down transistor PD1 of the SRAM cell 410B.

According to an example embodiment, from among the plurality of gate lines SGL, two gate lines SGL that are adjacent to each other with the inter-gate insulation region IGR interposed therebetween may be each shared by two transistors having channels of the same conductivity type.

According to another example embodiment, from among the plurality of gate lines SGL, two gate lines SGL that are adjacent to each other with the inter-gate insulation region IGR interposed therebetween may be each shared by two transistors having channels of different conductivity types.

According to another example embodiment, from among the plurality of gate lines SGL, one gate line SGL selected from two gate lines SGL that are adjacent to each other with the inter-gate insulation region IGR interposed therebetween may be shared by two transistors having channels of the same conductivity type, and the other gate line SGL may be shared by two transistors having channels of different conductivity types.

In the example embodiment of FIGS. 7A and 7B, the gate line SGL1 of the SRAM cell 410A may be shared by the first pull down transistor PD1 formed of an NMOS transistor and the first pull up transistor PU1 formed of a PMOS transistor. Also, the gate line SGL5 that is adjacent to the gate line SGL1 and, together with the inter-gate insulation region IGR disposed between the gate line SGL1 and the gate line SGL5, forms the SRAM 410B, may be shared by the first pull down transistor PD1 formed of an NMOS transistor and the first pull up transistor PU1 formed of a PMOS transistor.

Also, in the two adjacent SRAM cells 410A and 410B, from among the two gate lines SGL that are in a straight line and are adjacent to each other with the inter-gate insulation region IGR interposed therebetween, the gate line SGL4 in the SRAM cell 410A may be shared by the second pull up transistor PU2 formed of a PMOS transistor and the second pull down transistor PD2 formed of an NMOS transistor, and the gate line SGL3 that is adjacent to the gate line SGL4, with the inter-gate insulation region IGR included between the gate line SGL4 and the gate line SLG3, may be shared by two first pass transistors PS1 formed of NMOS transistors.

Figure 8:
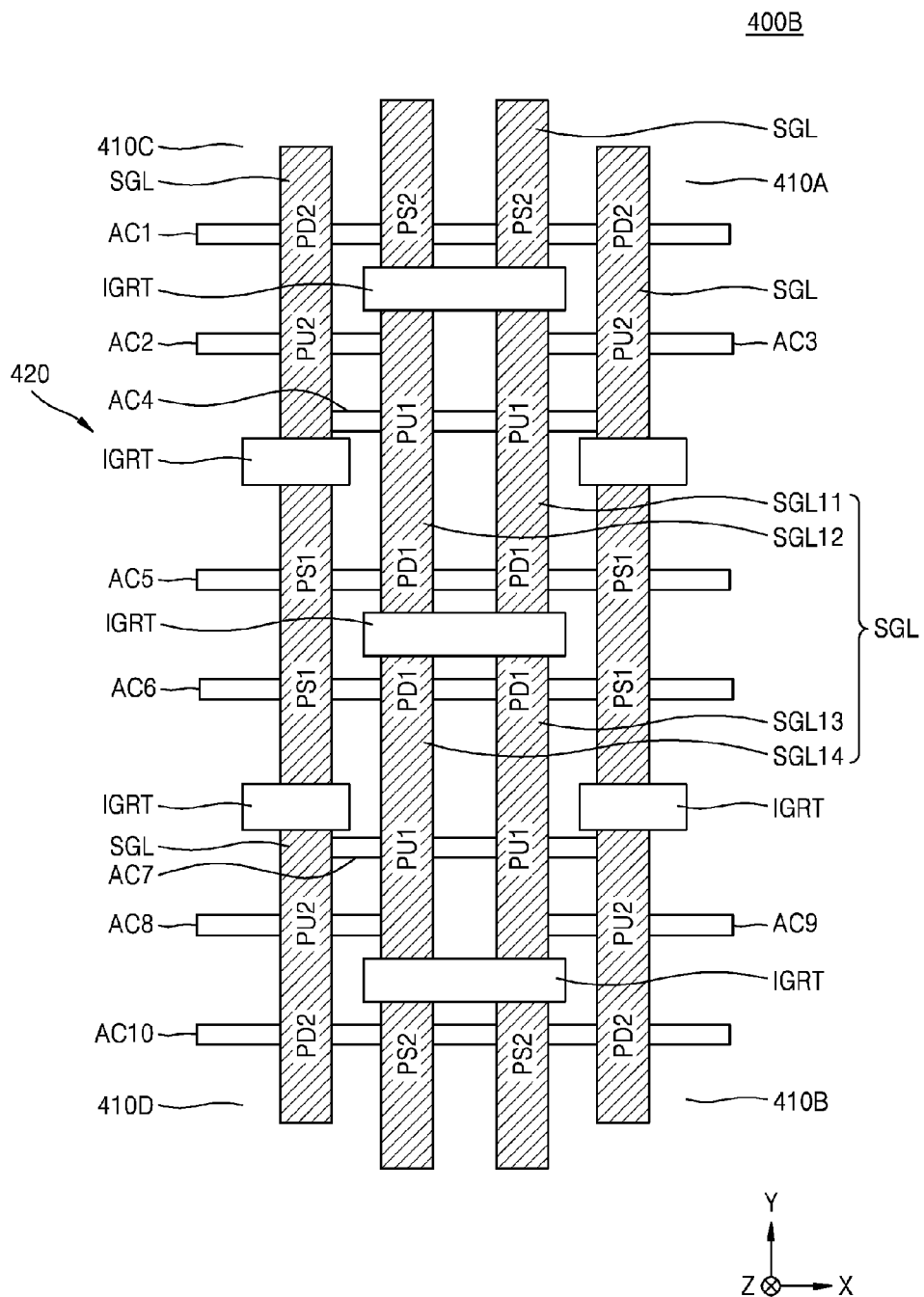
FIG. 8 is a plan view illustrating an integrated circuit device according to example embodiments of the inventive concept.

FIG. 8 is a plan view illustrating an integrated circuit device 400B according to example embodiments of the inventive concept.

The integrated circuit device 400B illustrated in FIG. 8 has overall the same structure as the integrated circuit device 400A illustrated in FIG. 7A. However, the integrated circuit device 400B of FIG. 8 includes an SRAM array 420 including an inter-gate insulation region IGRT extending in an X direction over two gate lines SGL, instead of the inter-gate insulation region IGR illustrated in FIG. 7A. The inter-gate insulation region IGRT has a long axis in the X direction and a short axis in the Y direction.

In the integrated circuit device 400B, a plurality of gate lines SGL include a pair of gate lines SGL11 and SGL12 adjacent to each other in the X direction and another pair of gate lines SGL13 and SGL14 that are spaced apart from the one pair of gate lines SGL11 and SGL12 in the Y direction and adjacent to each other in the X direction. The pair of gate lines SGL11 and SGL12 and the other pair of gate lines SGL13 and SGL14 are spaced apart from each other with the inter-gate insulation region IGRT disposed therebetween, and each include an end portion contacting the inter-gate insulation region IGRT.

The inter-gate insulation region IGRT may have the same or similar structure, for example, as the inter-gate insulation region IGR3 described with reference to FIGS. 3A through 3E.

Figure 9A:
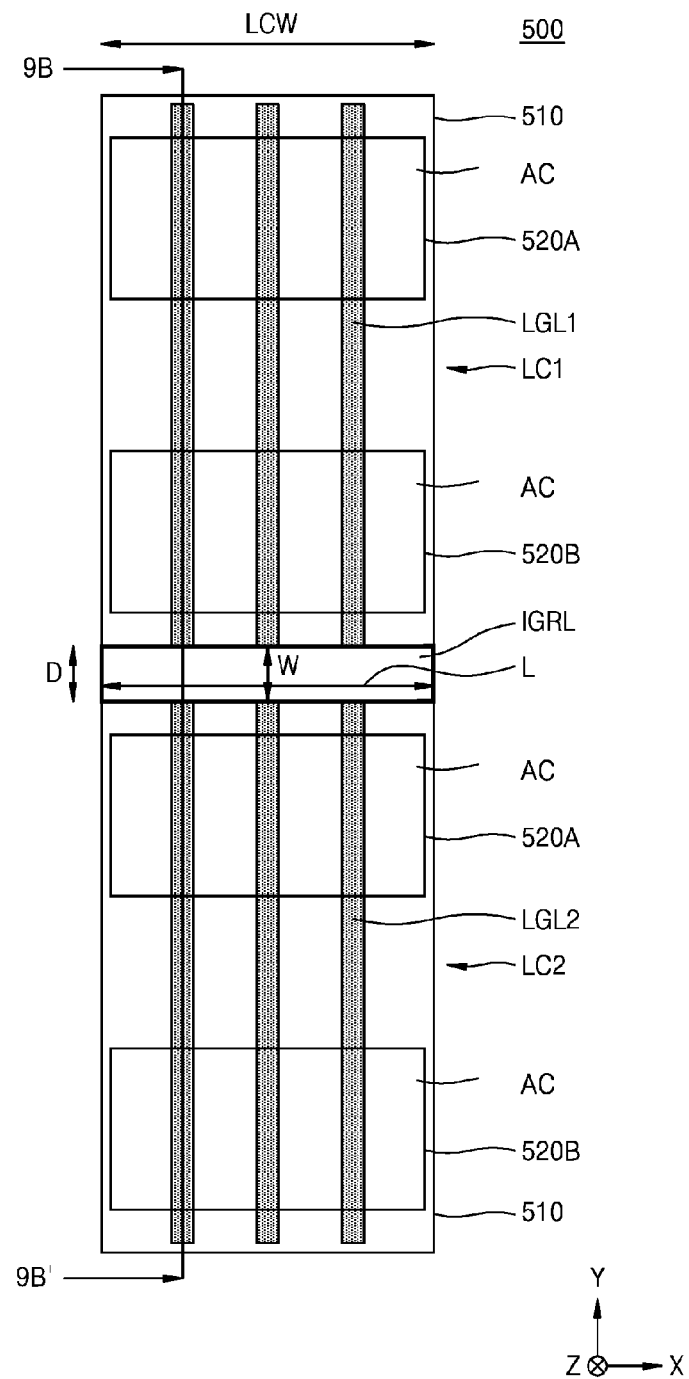
FIG. 9A is a plan view illustrating particular elements of an integrated circuit device according to example embodiments of the inventive concept.
Figure 9B:
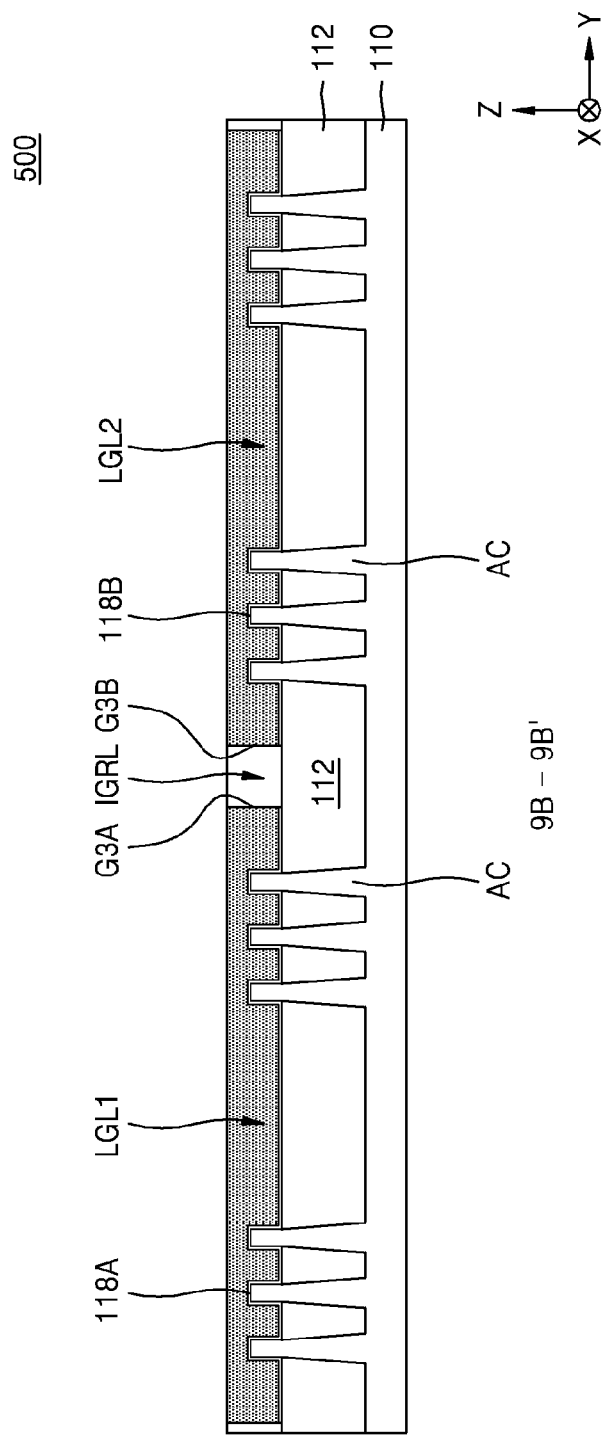
FIG. 9B is a cross-sectional view of the integrated circuit device of FIG. 9A cut along line 9B-9B.

FIG. 9A is a plan view illustrating certain elements of an integrated circuit device 500 according to example embodiments of the inventive concept. FIG. 9B is a cross-sectional view of the integrated circuit device 500 cut along line 9B-9B' of FIG. 9A. Like reference numerals in FIGS. 9A and 9B denote like elements as in FIGS. 1A through 7, and description thereof will be omitted.

Referring to FIGS. 9A and 9B, the integrated circuit device 500 may include a plurality of cells LC1 and LC2 that are formed on a substrate 110 and each include at least one logic circuit and a cell boundary 510. The plurality of cells LC1 and LC2 may be referred to as a first cell LC1 and a second cell LC2 that are adjacent to each other.

The first cell LC1 and the second cell LC2 respectively include a first device region 520A and a second device region 520B. In the first cell LC1 and the second cell LC2, a plurality of active regions AC extend in the first device region 520A and the second device region 520B in the first direction (X direction).

A device isolation layer 112 is formed between two respective active regions of the plurality of active regions AC on the substrate 110. The plurality of active regions AC protrude from the device isolation layer 112 in the form of fins.

In the first cell LC1, a plurality of first gate insulation layers 118A and a plurality of first gate lines LGL1 extend to cross the plurality of active regions AC in the second direction (Y direction). In the second cell LC2, a plurality of second gate insulation layers 118B and a plurality of second gate lines LGL2 extend to cross the plurality of active regions AC and in a straight line with the plurality of first gate lines LGL1. The plurality of second gate insulation layers 118B and the plurality of second gate lines LGL2 are spaced apart from the plurality of first gate insulation layers 118A and the plurality of first gate lines LGL1 with an inter-gate insulation region IGRL interposed therebetween.

The integrated circuit device 500 may include the various characteristics of the integrated circuit devices 100, 200, and 300 according to the description above with reference to FIGS. 1A through 5.

From among the plurality of first gate lines LGL1 and the plurality of second gate lines LGL2, a first gate line LGL1 and a second gate line LGL2 that are adjacent to each other with the inter-gate insulation region IGRL interposed therebetween may have a configuration corresponding to the first gate line GLA and the second gate line GLB described with reference to FIGS. 1A through 3E.

The inter-gate insulation region IGRL interposed between the first gate line LGL1 and the second gate line LGL2 adjacent to each other may be disposed between the cell boundary 510 of the first cell LC1 and the cell boundary 510 of the second cell LC2.

Referring to FIGS. 9A and 9B, the inter-gate insulation region IGRL having a length L corresponding to a width LCW of the first cell LC1 and the second cell LC2 between the first cell LC1 and the second cell LC2 adjacent to each other and having a width W corresponding to a distance D between the adjacent first and second cells LC1 and LC2 is illustrated. However, a size and a shape of the inter-gate insulation region IGRL may be modified and changed in various manners within the scope of the spirit of the inventive concept. In some embodiments, the inter-gate insulation region IGRL may have the same or similar structure as the inter-gate insulation region IGR1 described with reference to FIGS. 1A through 1E, the inter-gate insulation region IGR2 described with reference to FIGS. 2A through 2E, or the inter-gate insulation region IGR3 described with reference to FIGS. 3A through 3E.

The plurality of active regions AC may be formed of a plurality of fin-type active regions protruding from the substrate 110. Also, a transistor may be formed at each point of intersection between the plurality of first gate lines LGL1 and the plurality of second gate lines LGL2 and the plurality of active regions AC. The plurality of first gate lines LGL1 and the plurality of second gate lines LGL2 may be shared by a plurality of FinFET devices formed on the substrate 110.

The first cell LC1 and the second cell LC2 are standard cells that perform desired logic functions such as a counter, a buffer, or the like, and may be used to form various types of logic cells including a plurality of circuit elements such as a transistor, a register or the like. For example, the first cell LC1 and the second cell LC2 may each form an AND gate, NAND gate, OR gate, NOR gate, exclusive OR (XOR) gate, exclusive NOR (XNOR) gate, inverter (INV), adder (ADD), buffer (BUF), delay (DLY) element, filter (FILL), multiplexer (MXT/MXIT), OAI (OR/AND/INVERTER), AO (AND/OR) gate, AOI (AND/OR/INVERTER), D flip-flop, reset flip-flop, master-slave flip-flop, or latch. However, the above-described cells are example, and the logic cells according to the inventive concept are not limited to the above-described cells.

Next, a method of manufacturing an integrated circuit device according to example embodiments of the inventive concept will be described in detail with reference to the attached drawings. Like reference numerals denote like elements as in FIGS. 1A through 9B, and description thereof will be omitted.

Figure 19A:
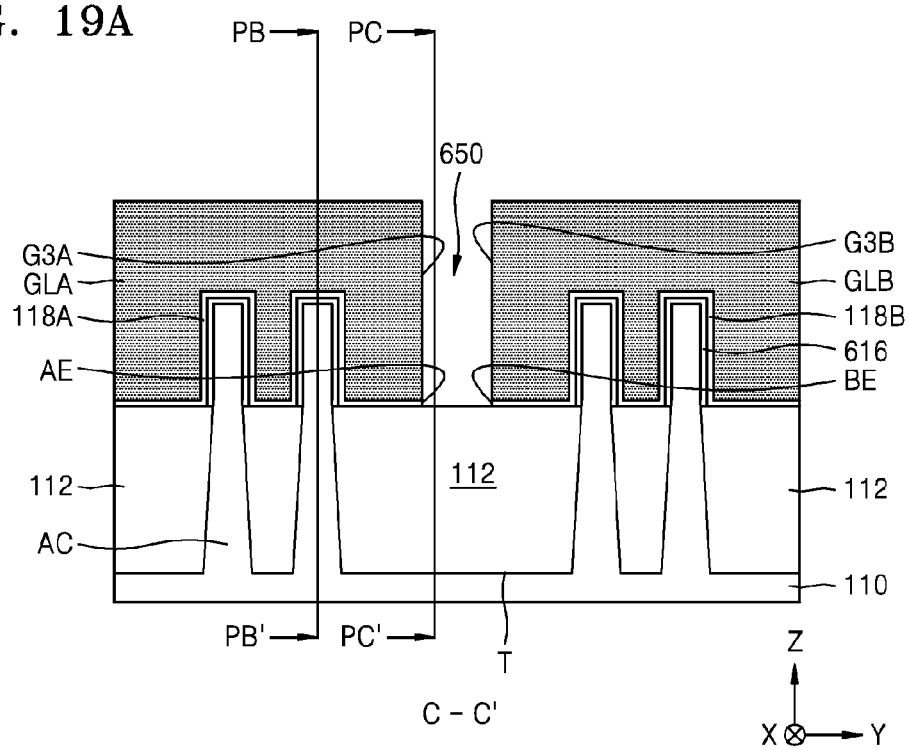
Figure 19B:
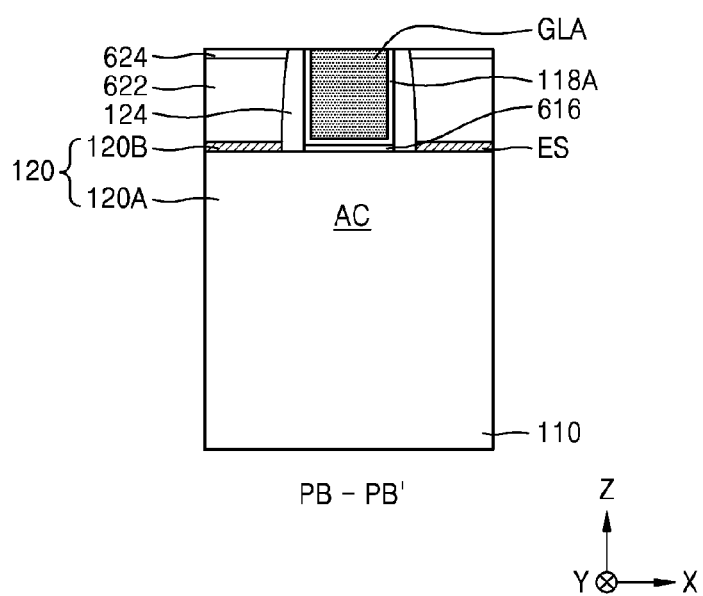
Figure 19C:
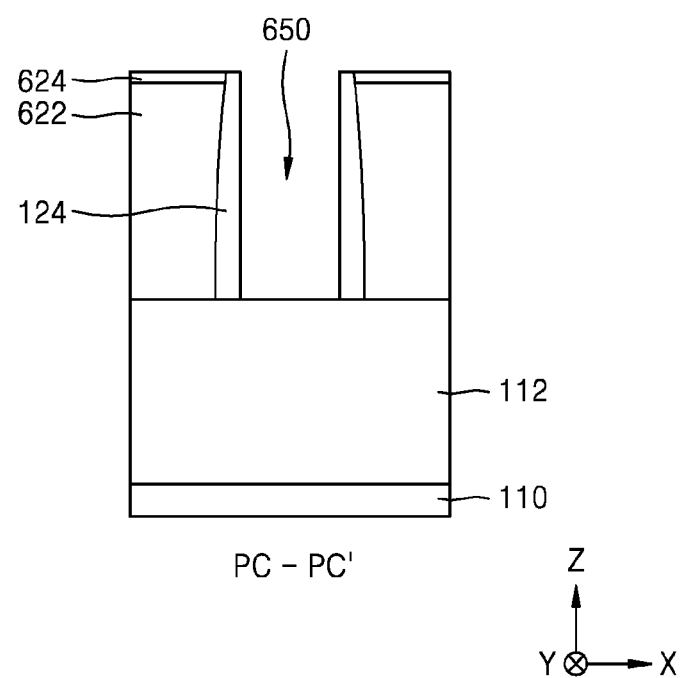
Figure 20A:
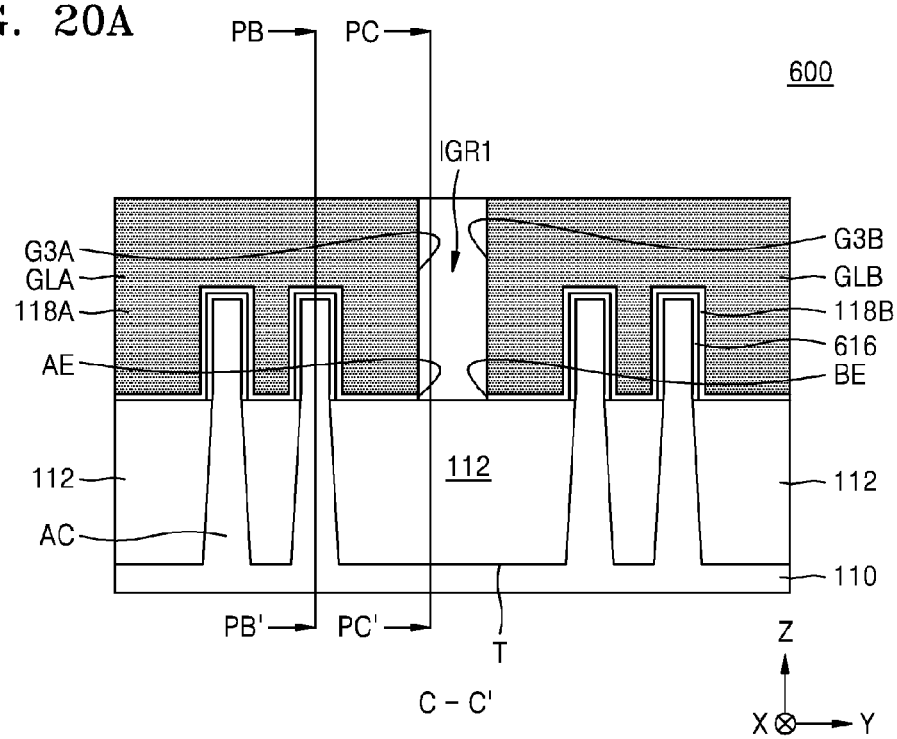
Figure 20B:
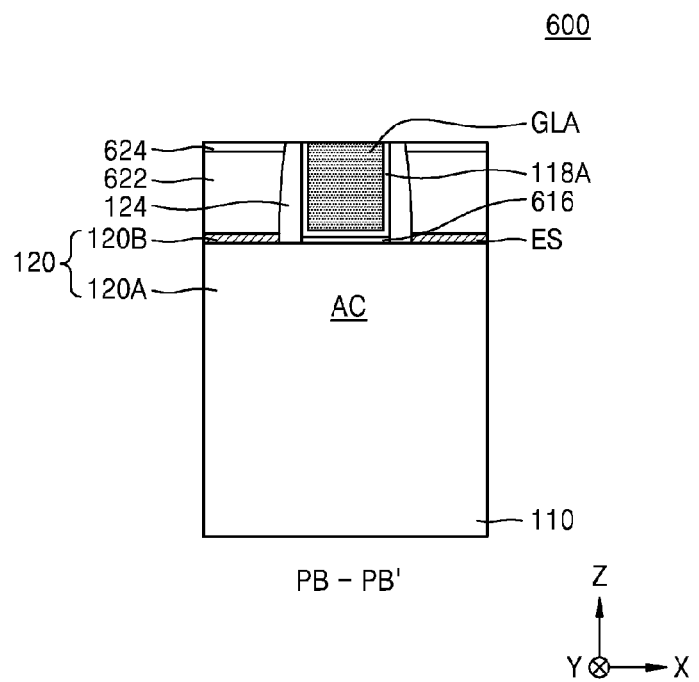
Figure 20C:
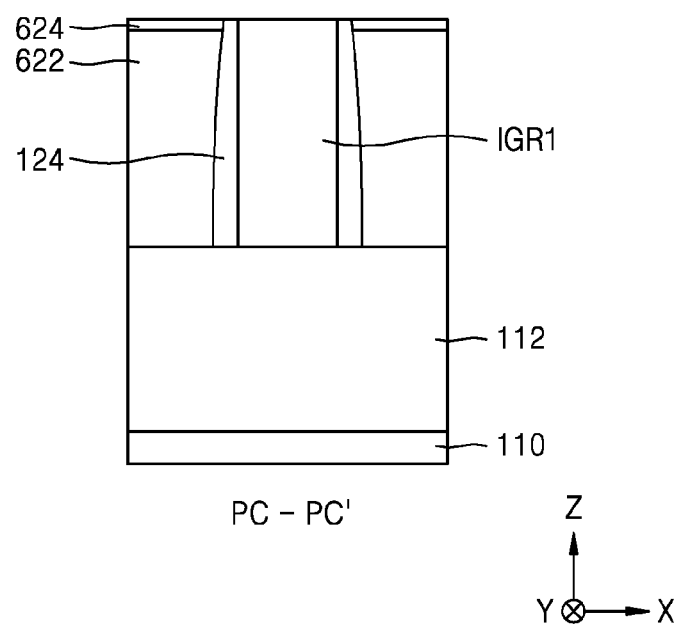

FIGS. 10A through 20C are cross-sectional views illustrating a method of manufacturing an integrated circuit device 600 according to example embodiments of the inventive concept in a process order (refer to FIGS. 20A through 20C). In detail, FIGS. 10A through 20A are cross-sectional views illustrating a portion of the integrated circuit device 600 corresponding to the cross-section cut along line C-C' of FIG. 1B in a process order. FIGS. 10B through 20B are respective cross-sectional views of the integrated circuit device of FIGS. 10A through 20A cut along line PB-PB'. FIGS. 10C through 20C are respective cross-sectional views of the integrated circuit device of FIGS. 10A through 20A cut along line PC-PC'.

A method of manufacturing the integrated circuit device 600 having a similar structure to the integrated circuit device 100 illustrated in FIGS. 1A through 1E, according to an example embodiment, will be described with reference to FIGS. 10A through 20C.

Figure 10A:
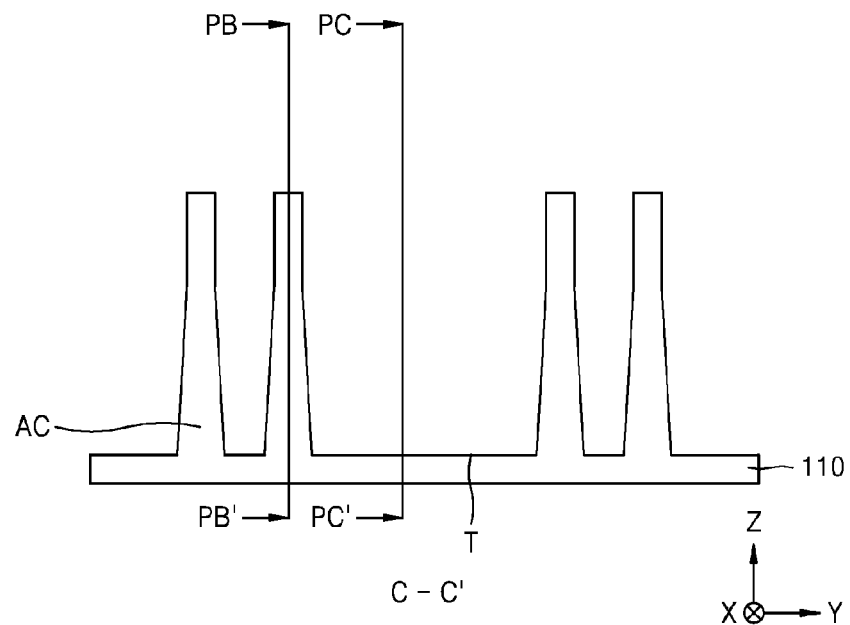
Figure 10B:
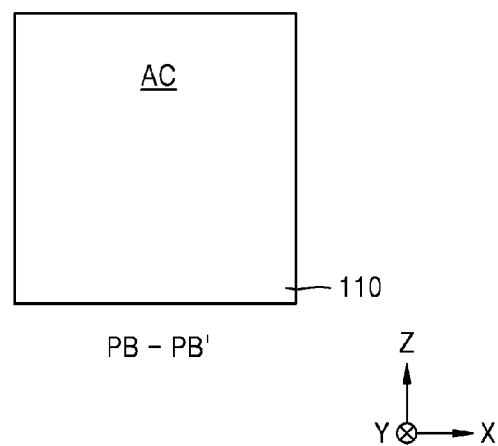
Figure 10C:
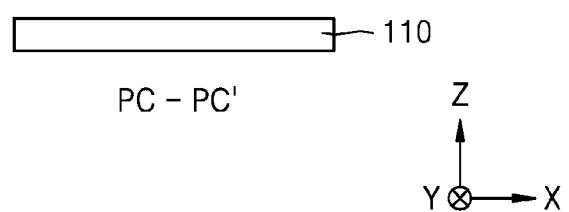

Referring to FIGS. 10A through 10C, a substrate 110 is provided, and a portion of the substrate 110 is etched to form a trench T that defines a plurality of active regions AC protruding from the substrate 110 upward and extending in the first direction (X direction).

The plurality of active regions AC may include P-type or N-type impurity diffusion regions (not shown) according to a channel type of a MOS transistor, to be formed in the plurality of active regions AC.

Figure 11A:
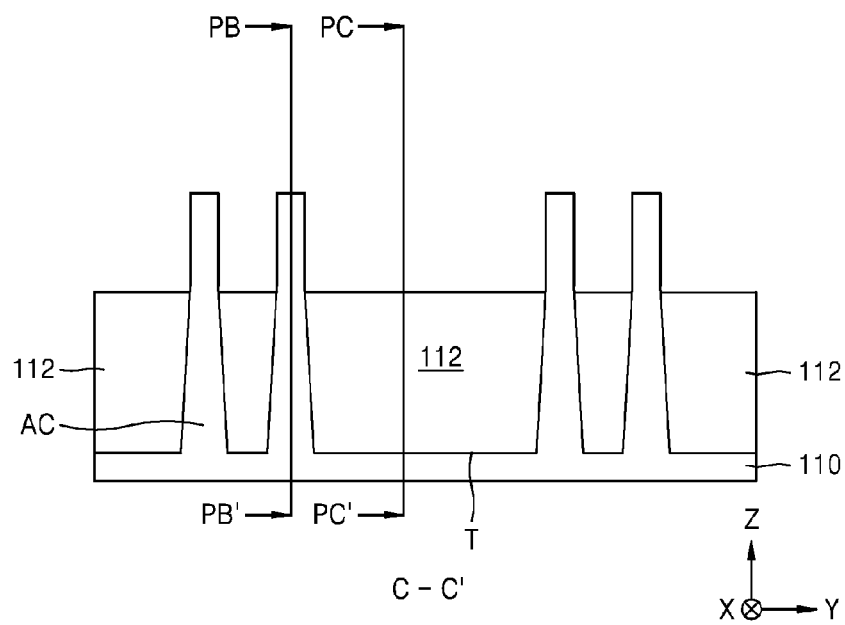
Figure 11B:
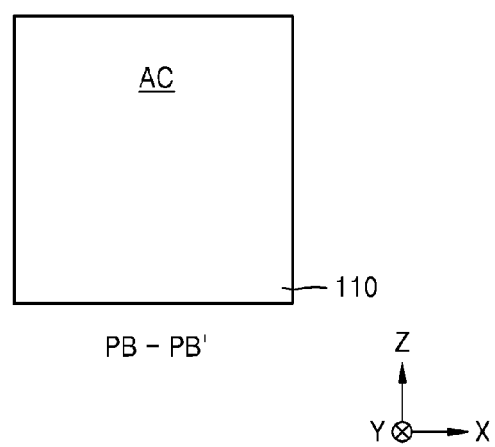
Figure 11C:
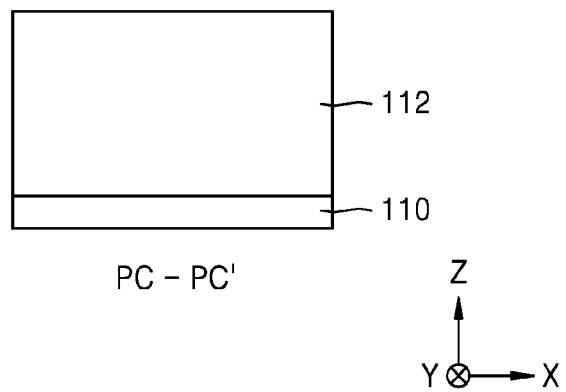

Referring to FIGS. 11A through 11C, an insulation layer covering the plurality of active regions AC is formed on the substrate 110, and a portion of the insulation layer is removed to form a device isolation layer 112 which is formed of a portion of the insulation layer remaining in the trench T.

The plurality of active regions AC may be defined by the device isolation layer 112.

In some embodiments, in order to remove a portion of the insulation layer such that the device isolation layer 112 is left, an etch back process may be used. After forming the device isolation layer 112, the plurality of active regions AC protrude from an upper surface of the device isolation layer 112 to be exposed.

The device isolation layer 112 may be formed, for example, of a silicon oxide layer, a silicon nitride layer, a silicon oxynitride layer, or a combination of these. The device isolation layer 112 may include an insulation liner formed of a thermal oxide layer and a buried insulation layer burying the trench T on the insulation liner.

Figure 12A:
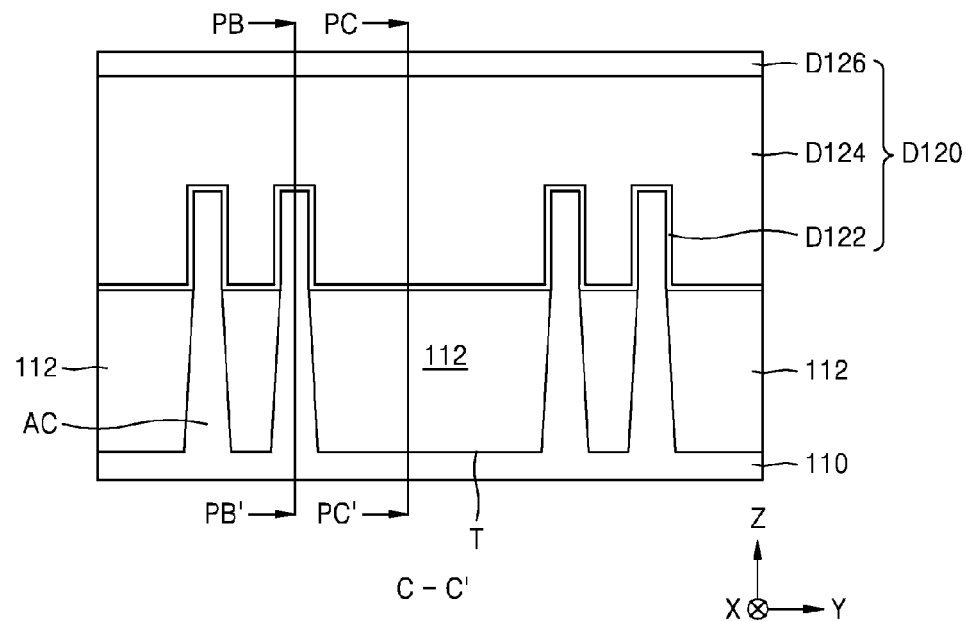
Figure 12B:
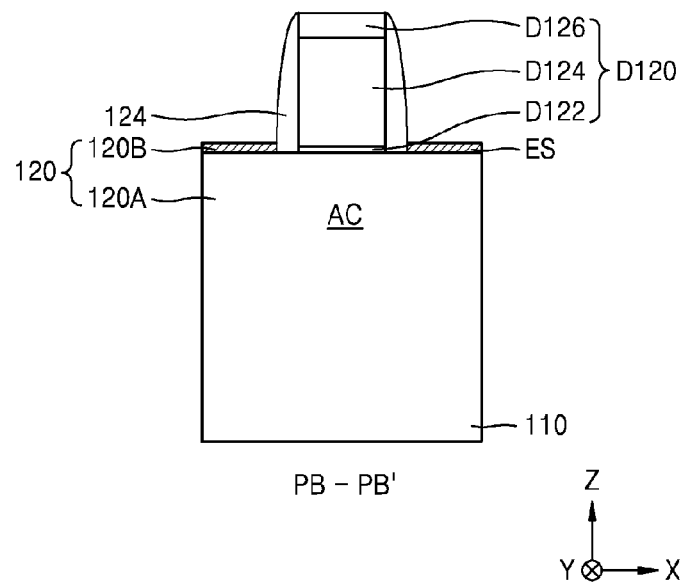
Figure 12C:
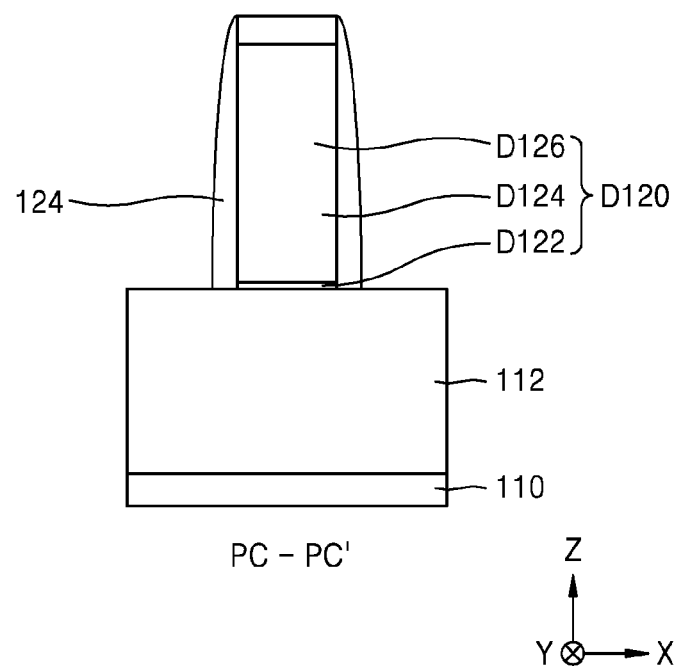

Referring to FIGS. 12A through 12C, a dummy gate structure D120 extending on the plurality of active regions AC to cross the plurality of active regions AC is formed.

The dummy gate structure D120 may include a dummy gate insulation layer D122, a dummy gate line D124, and a dummy gate capping layer D126 that are sequentially stacked on the plurality of active regions AC. In some embodiments, the dummy gate insulation layer D122 may include a silicon oxide. The dummy gate line D124 may include a polysilicon. The dummy gate capping layer D126 may include at least one of a silicon oxide, a silicon nitride, and a silicon oxynitride.

Then, an insulation spacer 124 is formed on two sidewalls of the dummy gate structure D120. The insulation spacer 124 may be formed of a silicon nitride, a silicon oxynitride or a combination of these.

Then, a semiconductor layer ES is formed on the plurality of active regions AC exposed at two sides of the dummy gate structure D120 by using an epitaxial growth process, and a first source/drain region 120A and a second source/drain region 120B are formed in a portion of the plurality of active regions AC and the semiconductor layer ES formed on the portion of the plurality of active regions AC.

The first source/drain region 120A and the second source/drain region 120B may have an elevated source/drain region shape. Also, an upper surface of the second source/drain region 120B may be at a higher level than an upper surface of the active regions AC.

In some embodiments, the first source/drain region 120A and the second source/drain region 120B are not limited to the shape illustrated in FIG. 12B. For example, the first source/drain region 120A and the second source/drain region 120B may have a cross-section cut along a Y-Z plane that is polygonal, for example, rectangular, octagonal, hexagonal, circular, or oval.

Figure 13A:
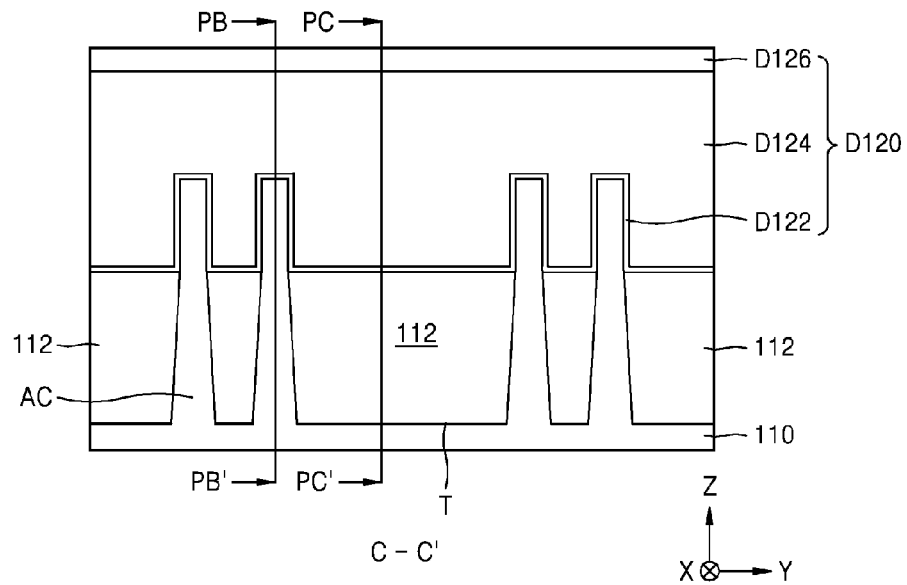
Figure 13B:
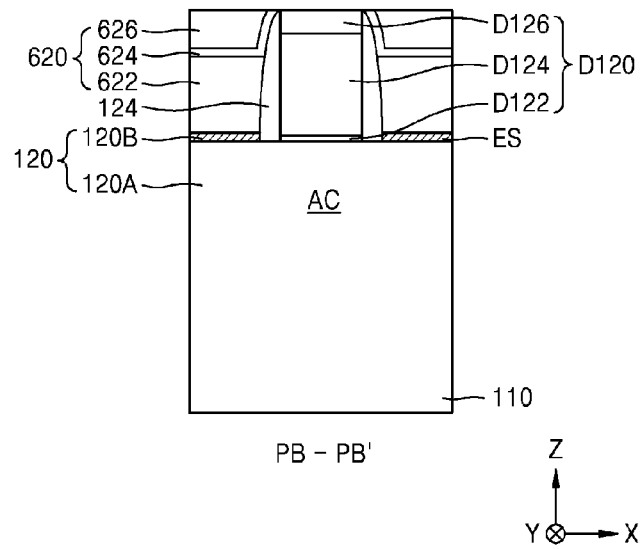
Figure 13C:
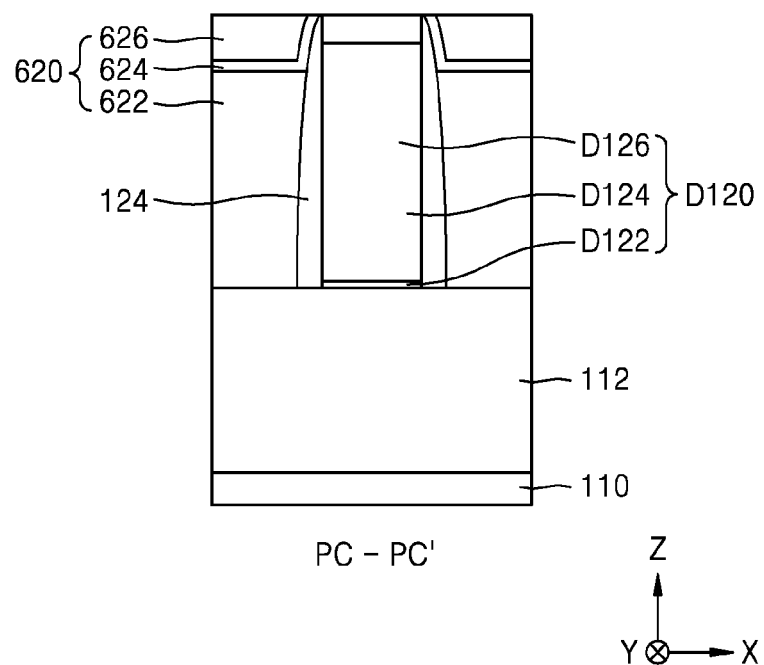

Referring to FIGS. 13A through 13C, an insulation layer 620 covering the device isolation layer 112, the first source/drain region 120A, the second source/drain region 120B, the dummy gate structure D120, and the insulation spacer 124 is formed.

The insulation layer 620 may include a first insulation layer 622, a second insulation layer 624, and a third insulation layer 626 that are sequentially formed from the bottom. In some embodiments, the first insulation layer 622 and the third insulation layer 626 may be formed of an oxide layer, and the second insulation layer 624 may be formed of a nitride layer, but are not limited thereto.

In one embodiment, to form the insulation layer 620, the first insulation layer 622 is formed to have a thickness sufficient for covering the device isolation layer 112, the first source/drain region 120A, the second source/drain region 120B, the dummy gate structure D120, and the insulation spacer 124, and then the first insulation layer 622 is recessed so that a level of an upper surface of the first insulation layer 622 is lower than a level of a lower surface of the dummy gate capping layer D126 as illustrated in FIGS. 13B and 13C, thereby exposing the dummy gate structure D120 again. Next, the second insulation layer 624 may be formed on the first insulation layer 622 and the dummy gate structure D120, and then the third insulation layer 626 may be formed on the second insulation layer 624. Then, a portion of the third insulation layer 626 is removed using a polishing operation such as a chemical mechanical polishing (CMP) operation from the upper portion until the second insulation layer 624 is exposed, and a portion of the second insulation layer 624 exposed on the dummy gate structure D120 is removed using an etch back operation to expose the dummy gate structure D120 again to thereby obtain a resultant product having a cross-sectional structure as illustrated in FIGS. 13B and 13C.

Figure 14A:
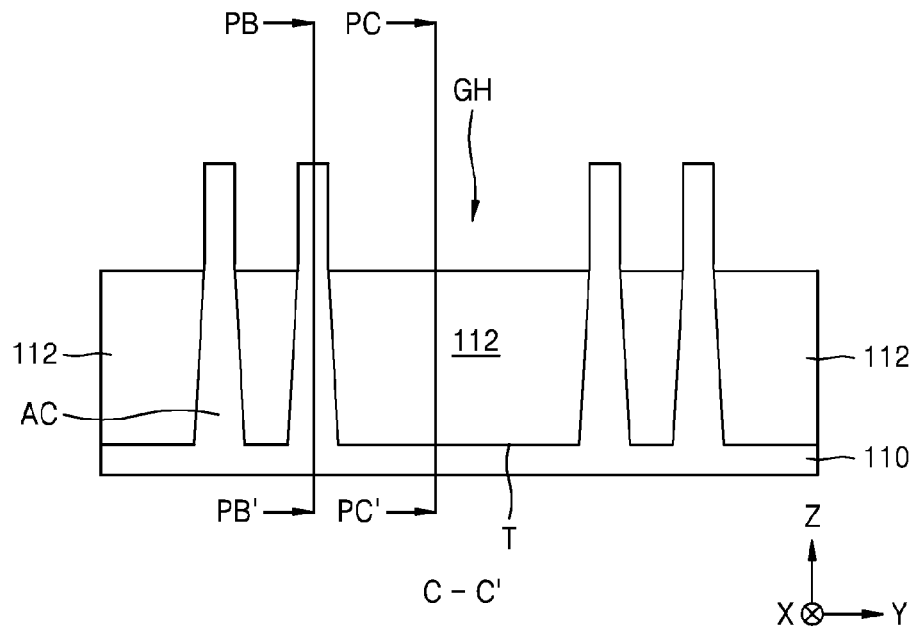
Figure 14B:
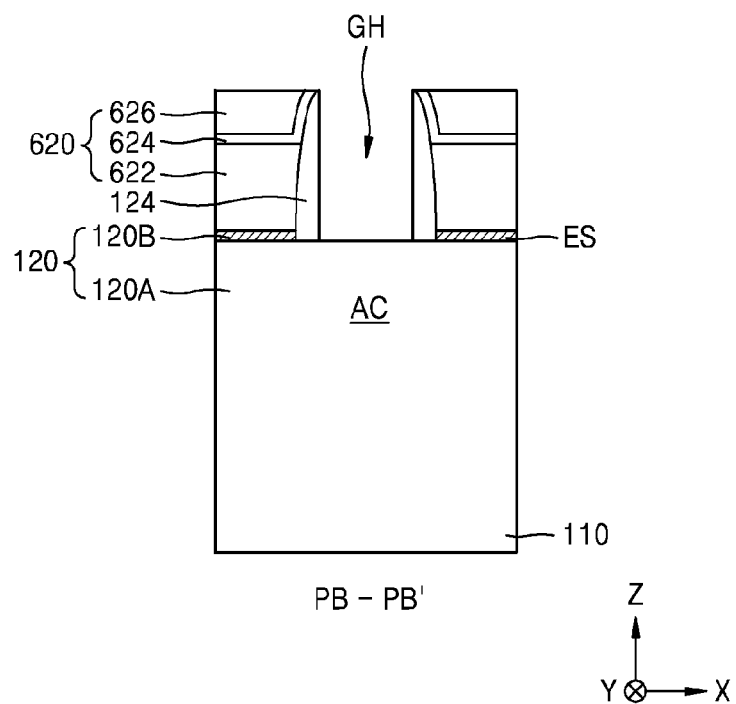
Figure 14C:
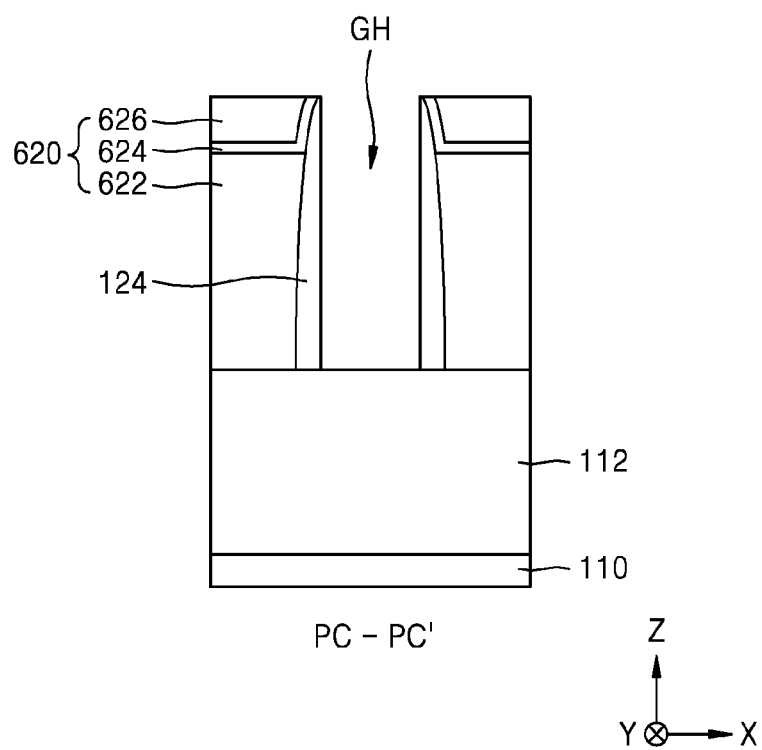

Referring to FIGS. 14A and 14C, a portion of the dummy gate structure D120 exposed through the insulation layer 620 is removed to form a gate hole GH.

The insulation spacer 124 and the active regions AC may be exposed through the gate hole GH.

Figure 15A:
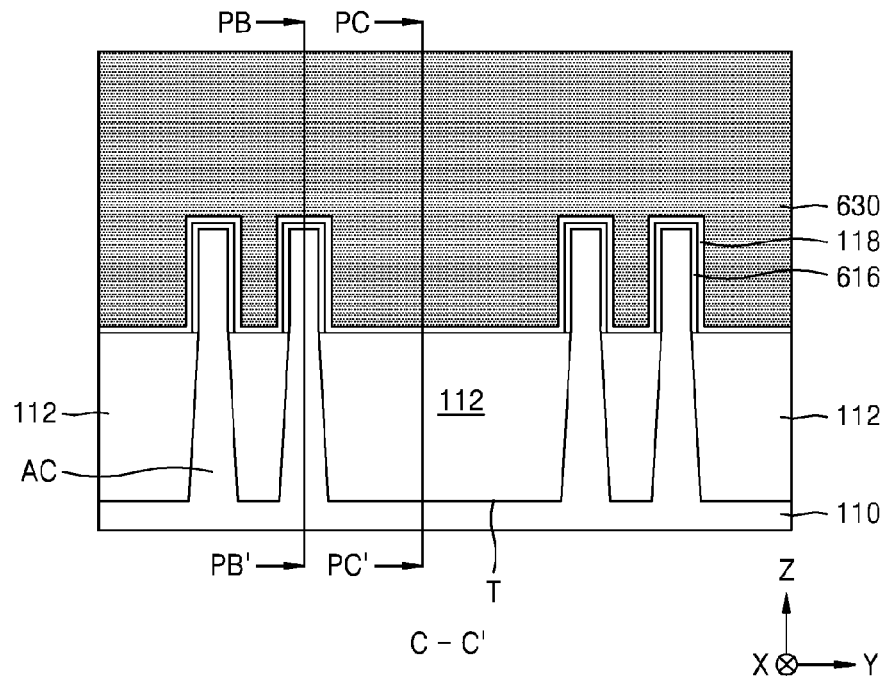
Figure 15B:
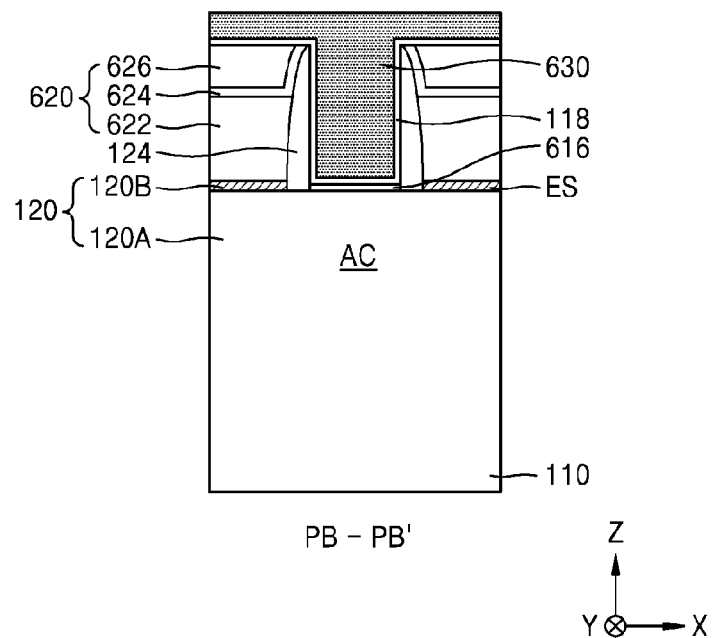
Figure 15C:
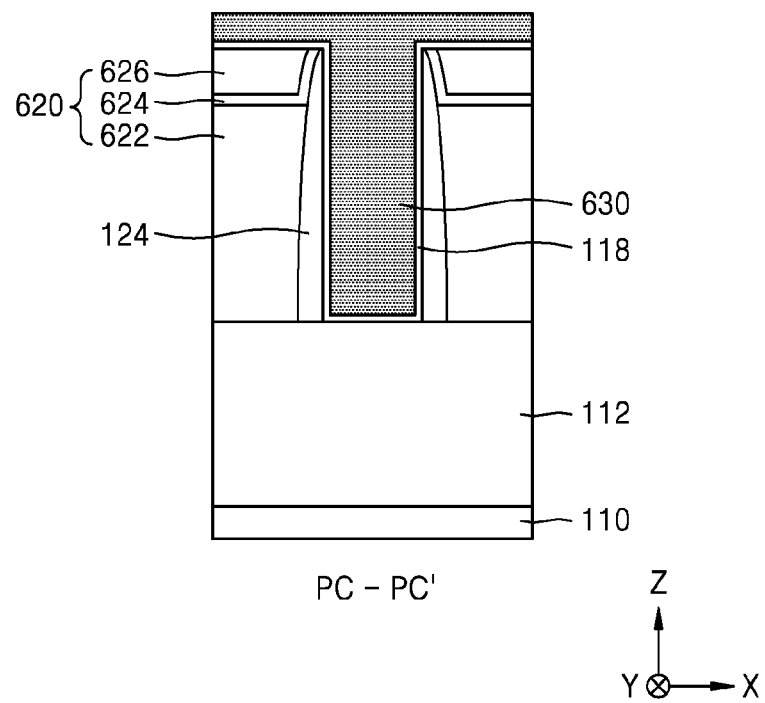

Referring to FIGS. 15A through 15C, a plurality of interface layers 616, a gate insulation layer 118, and a gate layer 630 are formed in the gate hole GH (refer to FIGS. 14A through 14C).

A process of forming the plurality of interface layers 616 may include oxidizing a portion of the active regions AC exposed in the gate hole GH. The plurality of interface layers 616 may perform the function of preventing interface defects between a plurality of gate insulation layers 118 formed thereon and the active regions AC therebelow. In some embodiments, the plurality of interface layers 616 may be formed of a silicon oxide layer, a silicon oxynitride layer, a silicate layer, or a combination of these. In some embodiments, a process of forming the plurality of interface layers 616 may be omitted. If the process of forming the plurality of interface layers 616 is omitted, a structure in which a gate insulation layer is immediately formed on an active region may be obtained in a similar manner as illustrated in FIGS. 1A through 5.

The gate insulation layers 118 may be formed, for example, of a silicon oxide layer, a high-k dielectric layer, or a combination of these. The high-k dielectric layer may be formed of a material having a higher dielectric constant than a silicon oxide layer. For example, the gate insulation layer 118 may have a dielectric constant of about 10 to about 25.

The gate layer 630 may be a conductive layer and may have a structure in which a metal nitride layer, a metal layer, a conductive capping layer, and a gap-fill metal layer are sequentially stacked. The description of the first gate line GLA, the second gate line GLB, the gate line GL1, and the gate line GL2 with reference to FIGS. 1A through 5 applies to the details regarding materials of the gate layer 630. In some embodiments, an ALD process, a MOALD process, a CVD process, a MOCVD process, or a PVD process may be used to form the gate layer 630. However, the method of forming the gate layer 630 is not limited to the described processes.

In some embodiments, when forming the gate layer 630, a partial metal layer is formed on the gate insulation layer 118 in order to improve reliability between a high-k dielectric layer which the gate insulation layer 118 is formed of and a metal layer stack structure which the gate layer 630 is formed of. Further, a polysilicon sacrificial layer for annealing may be deposited on the partial metal layer, and after annealing is performed on the resultant product, the polysilicon sacrificial layer for annealing may be removed. Next, a remaining metal layer may be formed on the annealed portion of the partial metal layer to thereby form the gate layer 630.

Figure 16A:
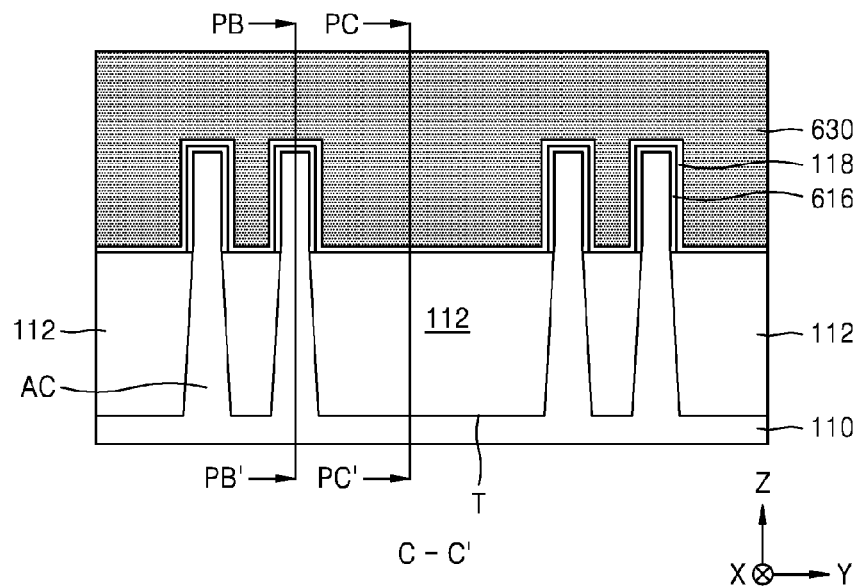
Figure 16B:
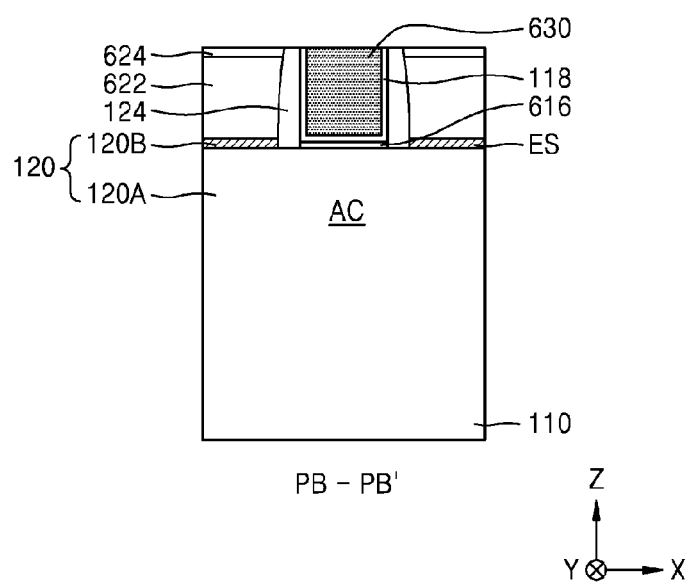
Figure 16C:
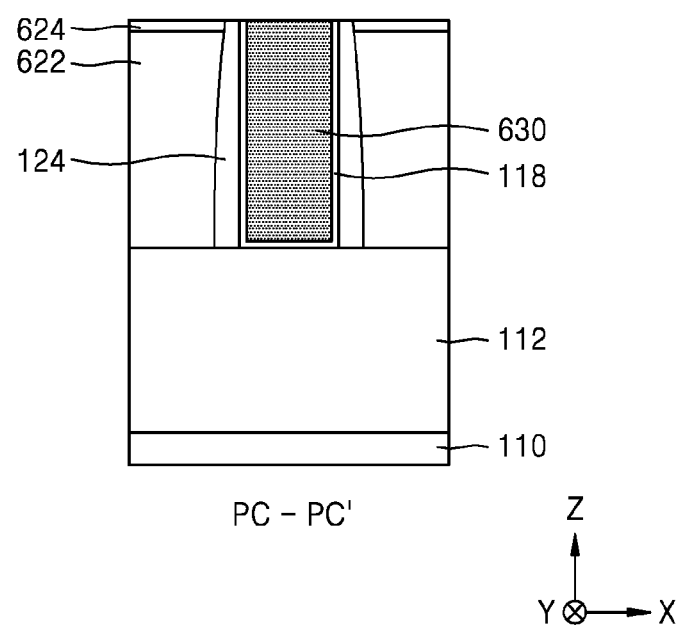

Referring to FIGS. 16A through 16C, portions of the gate insulation layer 118 and the gate layer 630 are removed from the resultant product of FIGS. 15A and 15B so that the gate insulation layer 118 and the gate layer 630 are left only in the gate hole GH (refer to FIGS. 14A and 14B).

In one embodiment, when removing portions of the gate insulation layer 118 and the gate layer 630, a second insulation layer 624 included in the insulation layer 620 is used as a planarization stopper layer to perform a planarization process until a planar upper surface of the second insulation layer 624 is exposed.

As a result, the insulation spacer 124 and the insulation layer 620 are consumed from respective upper surfaces thereof by a predetermined thickness so that thicknesses thereof in a Z-direction may be reduced, and the gate insulation layer 118, the insulation spacer 124, and the second insulation layer 624 may be exposed around an upper surface of the gate layer 630.

Figure 17A:
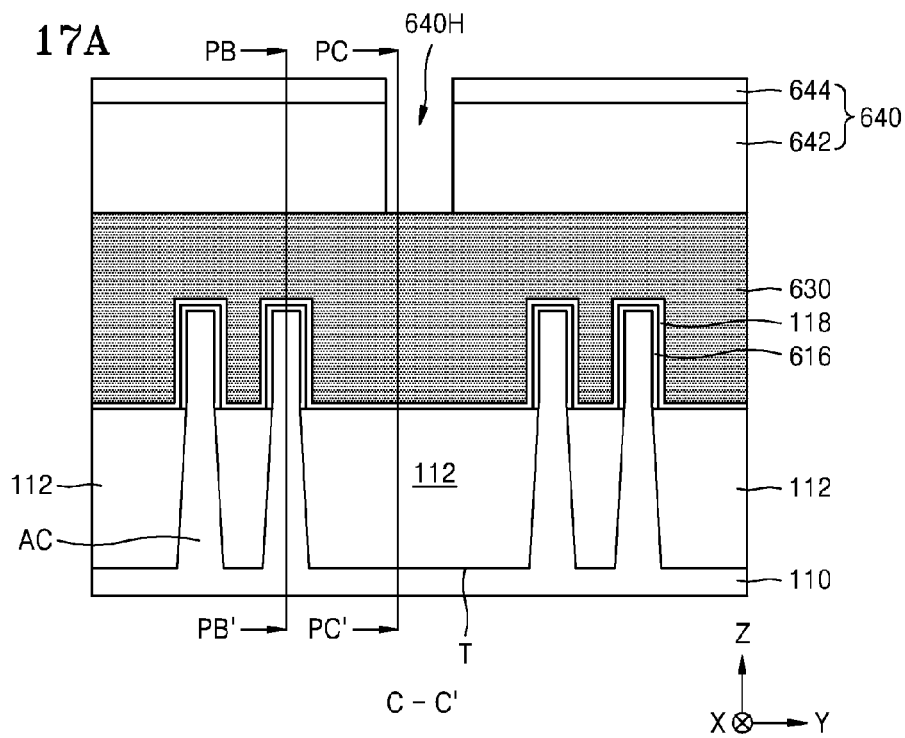
Figure 17B:
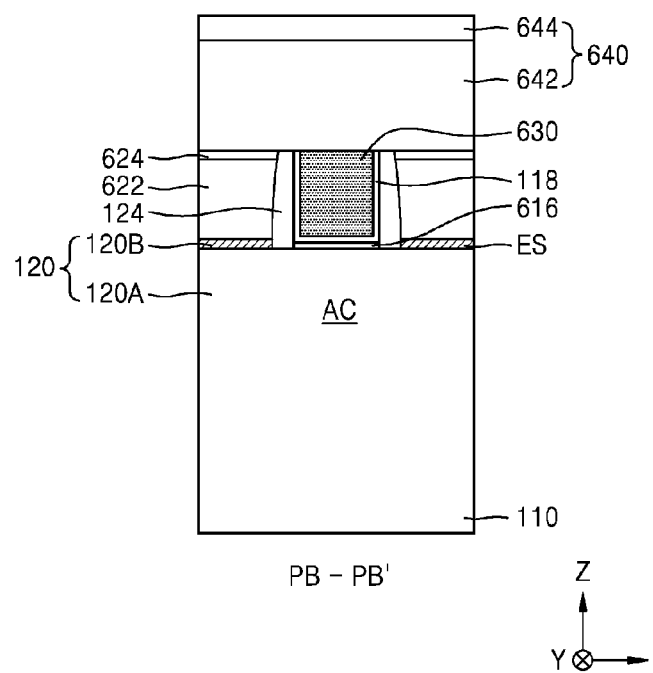
Figure 17C:
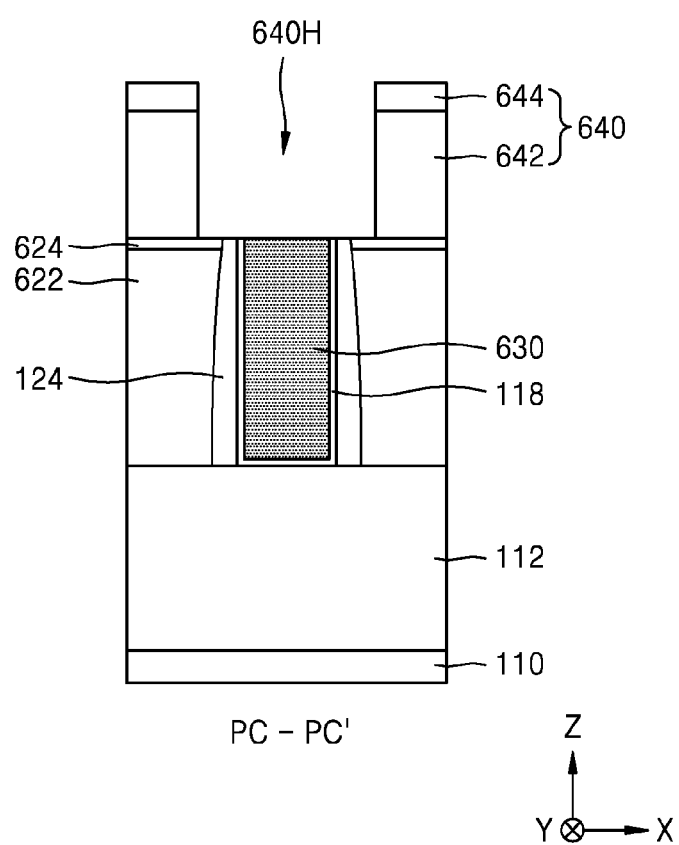

Referring to FIGS. 17A through 17C, a gate separation mask pattern 640 that exposes a portion of the upper surface of the gate layer 630 and a portion of an upper surface of the gate insulation layer 118 is formed on the gate layer 630.

A mask hole 640H that exposes a portion of the upper surface of the gate layer 630 and a portion of the upper surface of the gate insulation layer 118 is formed in the gate separation mask pattern 640.

The gate separation mask pattern 640 may be formed of a single layer or multiple layers. In FIGS. 17A and 17B, the gate separation mask pattern 640 formed of a double layer including a first hard mask layer 642 and a second hard mask layer 644 is illustrated. In some embodiments, the first hard mask layer 642 and the second hard mask layer 644 may be each formed of a silicon oxide layer, a silicon nitride layer, a polysilicon layer or a carbon-containing layer such as a spin-on hard mask (SOH) material. The carbon-containing layer formed of a SOH material may be formed of an organic compound having a relatively high carbon content of about 85 wt % to about 99 wt % based on the total weight. For example, the organic compound may be formed of a hydrocarbon compound including an aromatic ring, such as phenyl, benzene, or naphthalene, or a derivative thereof. For example, the first hard mask layer 642 may be formed of a carbon-containing layer formed of a SOH material, and the second hard mask layer 644 may be formed of a silicon oxide layer.

Figure 18A:
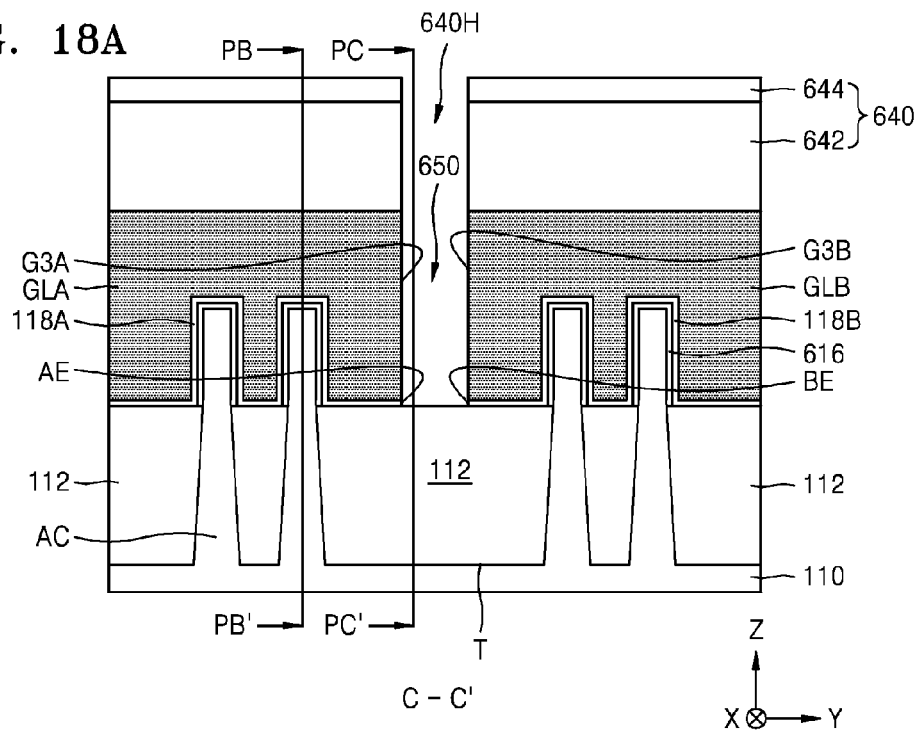
Figure 18B:
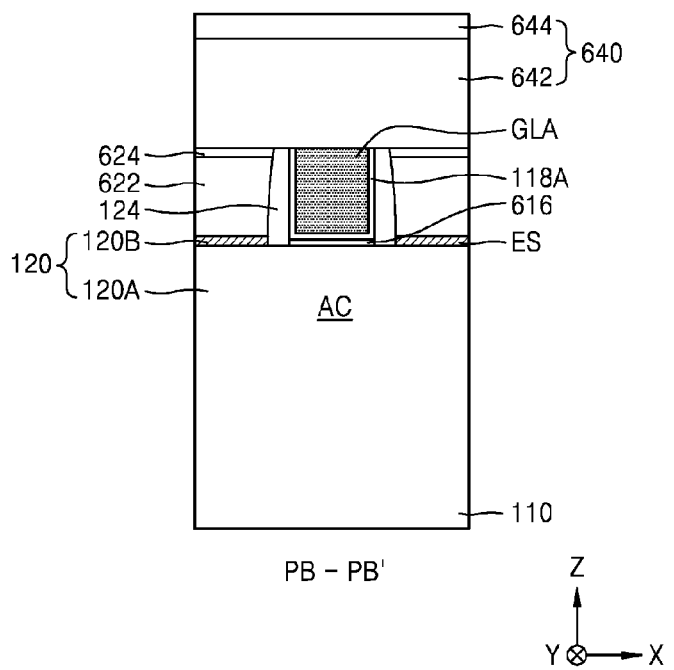
Figure 18C:
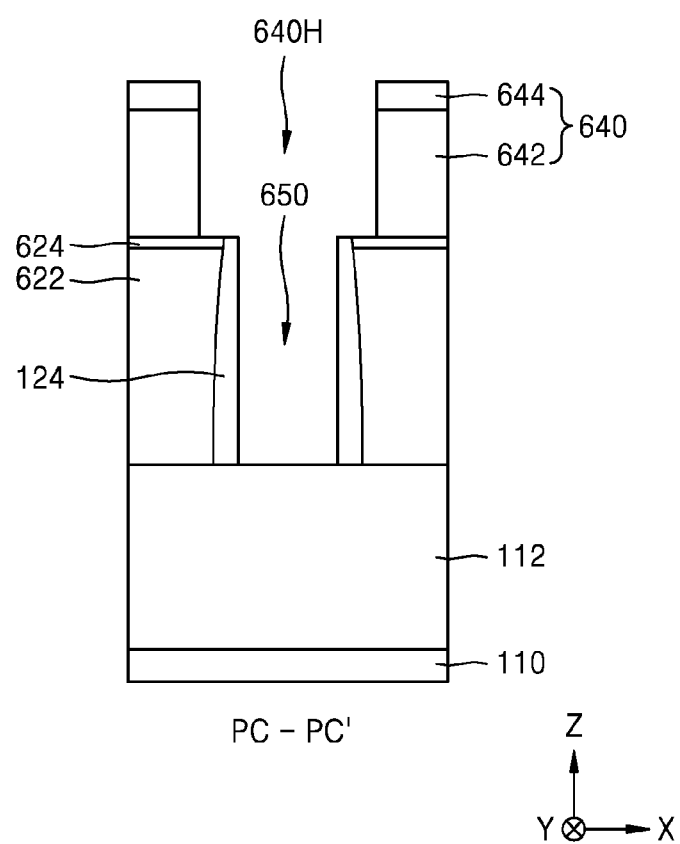

Referring to FIGS. 18A through 18C, the exposed portions of the gate layer 630 and the gate insulation layer 118 (refer to FIGS. 17A through 17C) are removed using the gate separation mask pattern 640, the insulation spacer 124, and the second insulation layer 624 as an etching mask so as to form the first gate line GLA and the second gate line GLB formed of remaining portions of the gate layer 630 and the first gate insulation layer 118A and the second gate insulation layer 118B formed of remaining portions of the gate insulation layer 118.

As a result, space 650 that exposes a portion of an upper surface of the device isolation layer 112 is formed between the first gate line GLA and the first gate insulation layer 118A and the second gate line GLB and the second gate insulation layer 118B.

After the first gate line GLA, the second gate line GLB, the first gate insulation layer 118A, and the second gate insulation layer 118B are formed, a portion of the upper surface of the device isolation layer 112 is exposed through the mask hole 640H and the space 650 formed in the gate separation mask pattern 640, and the first short-axis sidewall G3A of the first gate line GLA, the second short-axis sidewall G3B of the second gate line GLB, an end portion AE of the first gate insulation layer 118A, and an end portion BE of the second gate insulation layer 118B may be exposed.

According to the present example embodiment, the first gate line GLA and the second gate line GLB extend in the Y direction to respectively cross two active regions AC, but the inventive concept is not limited thereto. For example, the first gate line GLA and the second gate line GLB may extend to respectively cross one or three or more active regions.

Referring to FIGS. 19A through 19C, the mask pattern 640 for gate isolation (refer to FIGS. 18A through 18C) is removed to expose an upper surface of the first gate line GLA, an upper surface of the second gate line GLB, an upper surface of the first gate insulation layer 118A, an upper surface of the second gate insulation layer 118B, and an upper surface of the second insulation layer 624.

Referring to FIGS. 20A and 20C, an inter-gate insulation region IGR1 filling the space 650 between the first gate line GLA and the first gate insulation layer 118A and the second gate line GLB and the second gate insulation layer 118B (refer to FIGS. 19A through 19C) is formed.

In order to form the inter-gate insulation region IGR1, an insulation material having a sufficient thickness to fill the space 650 and covering the upper surface of the second insulation layer 624 may be deposited, and the insulation material may be etched back or planarized until the upper surface of the second insulation layer 624 is exposed.

The inter-gate insulation region IGR1 may be formed, for example, of a silicon oxide, a silicon nitride, air space or a combination of these.

The inter-gate insulation region IGR1 may be formed to contact the first short-axis sidewall G3A of the first gate line GLA, the second short-axis sidewall G3B of the second gate line GLB, the end portion AE of the first gate insulation layer 118A, the end portion BE of the second gate insulation layer 118B, the insulation spacer 124, and the device isolation layer 112.

According to the method of manufacturing the integrated circuit device 600 according to the example embodiments of the inventive concept described with reference to FIGS. 10A through 20C, when forming a plurality of gate lines GLA and GLB used in the integrated circuit device 600 by using a replacement metal gate (RMG) process, a gate line 630 formed of a metal material used in a final structure is formed in space formed by removing the dummy gate line D124, and then the gate layer 630 is separated to form the plurality of gate lines GLA and GLB.

Integrated circuit devices are gradually becoming ultra large scale and minute due to scaling thereof. Accordingly, one attempt to maximize an ON-current of a FinFET has been made to gradually increase the height of a gate on a device isolation layer in order to increase the effect of using a sidewall formed by fins of the FinFET as a channel. As the height of the gate is increased, an RMG process for forming a plurality of gate lines GLA and GLB used in the integrated circuit device 600 is used, thereby resulting in a gradual decrease in a process window.

Unlike the method according to the embodiments described herein, when forming a plurality of gate lines GLA and GLB used in an integrated circuit device using a RMG process, for example, if a gate-cut process is used, in which, a dummy gate line is separated into a plurality of dummy gate lines, and then the plurality of dummy gate lines are replaced by metal gate lines used in a final structure, a window with respect to the gate-cut process on the dummy gate lines is reduced. In particular, when removing the plurality of dummy gate lines obtained by separating the dummy gate line according to the RMG process, process difficulty in terms of removing a remaining portion of a dummy gate line having a relatively small width between a fin active region and a gate-cut region increases. Also, in a manufacturing process of an integrated circuit device, similarly to description provided with reference to FIGS. 15A through 15C, when forming a plurality of metal gate lines used in a final structure in a plurality of spaces provided as a result of removing the plurality of dummy gate lines obtained by separating a dummy gate line, on a resultant product on which the gate-cut process is completed, a partial metal layer forming the metal layer stack structure forming a gate may be formed on the gate insulation layer in order to increase reliability between a high-k dielectric layer of which a gate insulation layer is formed and a metal layer stack structure of which a gate is formed, and then a polysilicon sacrificial layer for annealing may be deposited on the partial metal layer, and then the polysilicon sacrificial layer for annealing may be removed. In such a case, when forming a plurality of metal gate lines used in a final structure, the polysilicon sacrificial layer for annealing is filled in the relatively narrow space between the fin active region and the gate-cut region in the plurality of spaces left on the resultant product on which the gate-cut process is completed, and after the annealing, the polysilicon sacrificial layer for annealing, filled in the relatively narrow space between the fin active region and the gate-cut region is to be removed. However, the space between the fin active region and the gate-cut region is gradually reduced according to scaling of the integrated circuit device, and when removing the polysilicon sacrificial layer for annealing from the narrow space, the polysilicon sacrificial layer for annealing may not be completely removed but left to cause deterioration in characteristics of the integrated circuit device.

However, according to a method of manufacturing the integrated circuit device 600 of the example embodiments of the inventive concept, when forming the plurality of gate lines GLA and GLB used in the integrated circuit device 600 by using a RMG process, the gate layer 630 formed of a metal material used in a final structure is formed in space formed by removing the dummy gate line D124, and a gate-cut process is performed on the gate layer 630 to form the plurality of gate lines GLA and GLB. Thus, the problem in which a residue of the dummy gate line D124 remains around the gate-cut region or a residue of the polysilicon sacrificial layer for annealing is not completely removed may be prevented from the start.

Also, as the gate-cut process is performed after the first source/drain region 120A and the second source/drain region 120B are formed, when forming the first source/drain region 120A and the second source/drain region 120B, defects generated in the first source/drain region 120A and the second source/drain region 120B due to the gate-cut region may be prevented.

FIGS. 21A through 25B are cross-sectional views illustrating a method of manufacturing an integrated circuit device according to certain example embodiments of the inventive concept in a process order. In detail, FIGS. 21A through 25A are cross-sectional views illustrating a portion of an integrated circuit device corresponding to a cross-section cut along a line C-C' of FIG. 1B. FIGS. 21B through 25B are respective cross-sectional views of the integrated circuit device of FIGS. 21A though 25A cut along a line PC-PC'. Like reference numerals in FIGS. 21A through 25B denote like elements as in FIGS. 10A through 20C, and description thereof will be omitted.

Figure 21A:
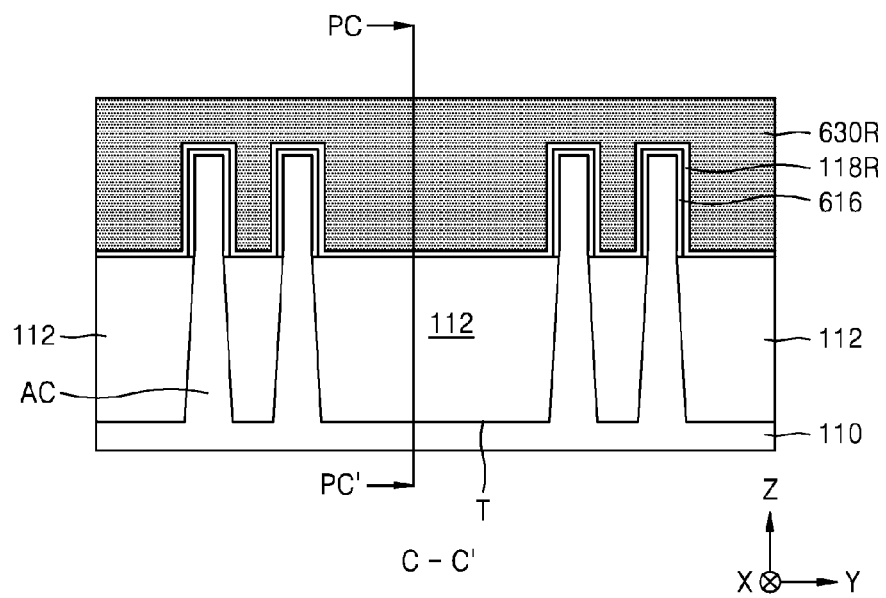
Figure 21B:
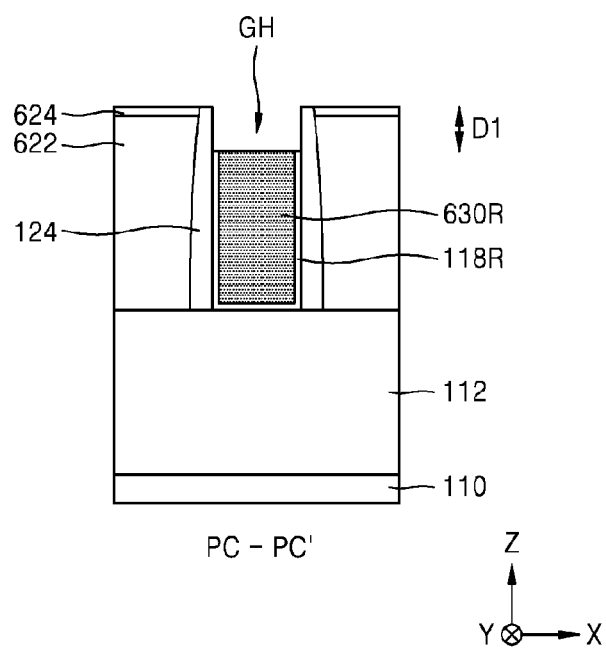

Referring to FIGS. 21A and 21B, processes up to a process of forming a plurality of interface layers 616, a gate insulation layer 118, and a gate layer 630 in a gate hole GH using the method described with reference to FIGS. 10A through 15C are performed, and then, in a similar manner as described with reference to FIGS. 16A through 16C, portions of the gate insulation layer 118 and the gate layer 630 are removed from resultant product of FIGS. 15A and 15B. However, according to the present example embodiment, while portions of the gate insulation layer 118 and the gate layer 630 are removed, after the upper surface of the second insulation layer 624 is exposed, the second insulation layer 624 and the insulation spacer 124 are used as an etching mask to further etch the gate insulation layer 118 and the gate layer 630 by a first thickness D1. As a result, a recessed gate insulation layer 118R and a recessed gate layer 630R are left in the gate hole GH, and a partial space at an inlet of the gate hole GH corresponding to the first thickness D1 is left on upper surfaces of the recessed gate insulation layer 118R and the recessed gate layer 630R.

Figure 22A:
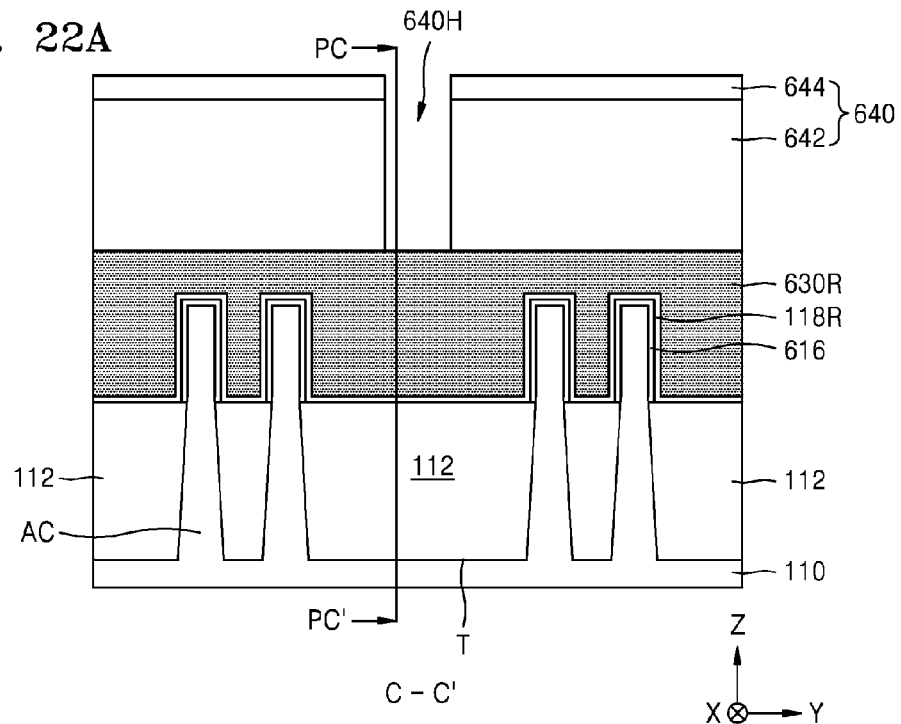
Figure 22B:
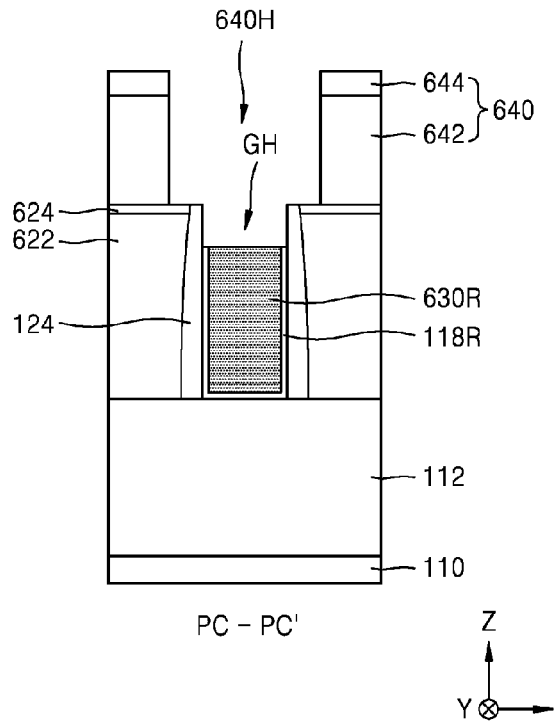

Referring to FIGS. 22A and 22B, in a similar method to the method described with reference to FIGS. 17A through 17C, a gate separation mask pattern 640, which exposes a portion of the recessed gate insulation layer 118R and a portion of the recessed gate layer 630R is formed on a resultant product of FIGS. 21A and 21B.

A mask hole 640H exposing the portion of the recessed gate insulation layer 118R and the portion of the recessed gate layer 630R is formed in the gate separation mask pattern 640. The mask hole 640H is connected to the partial space at the inlet of the gate hole GH.

Figure 23A:
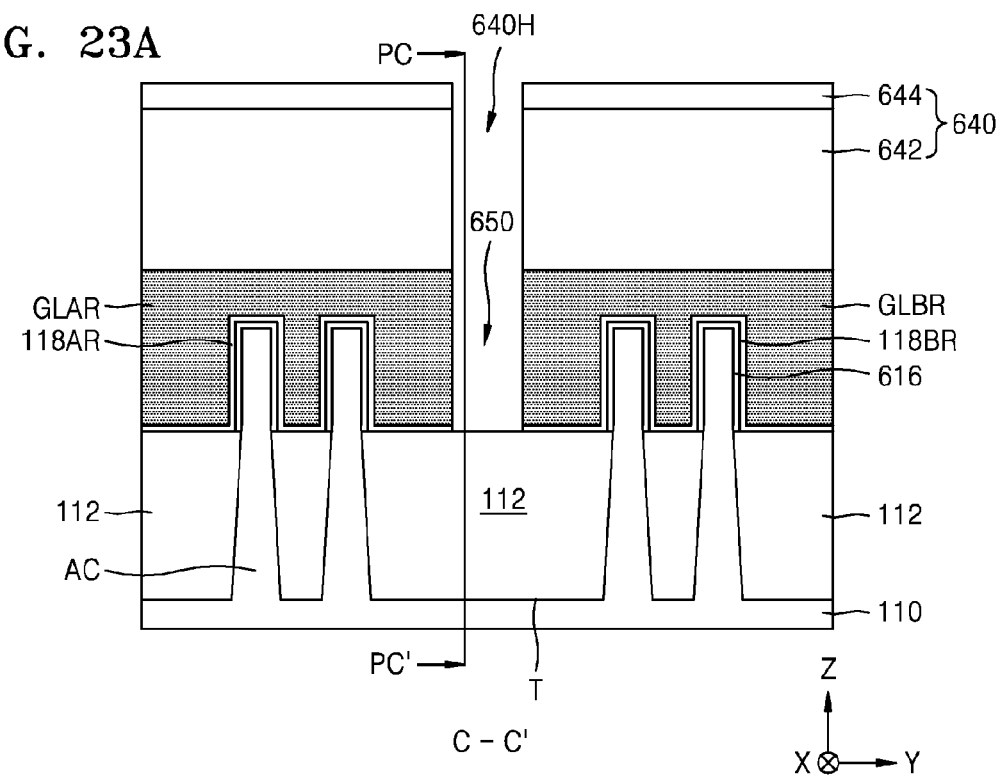
Figure 23B:
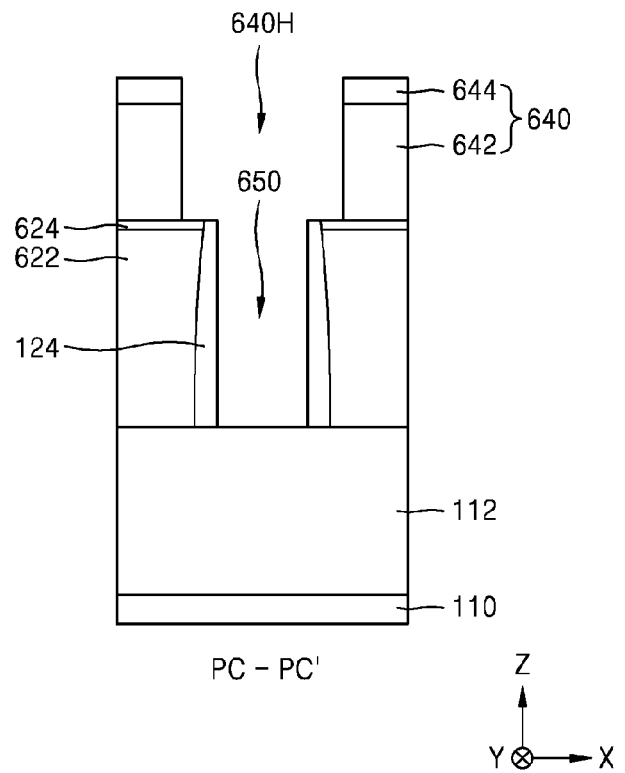

Referring to FIGS. 23A and 23B, by using a method similar to the method described with reference to FIGS. 18A and 18C, the gate separation mask pattern 640, the insulation spacer 124, and the second insulation layer 624 are used as an etching mask to remove exposed portions of the recessed gate layer 630R and the recessed gate insulation layer 118R, thereby forming a first recessed gate line GLAR and a second recessed gate line GLBR formed of a remaining portion of the recessed gate layer 630R and a first recessed gate insulation layer 118AR and a second recessed gate insulation layer 118BR formed of a remaining portion of the recessed gate insulation layer 118R.

As a result, space 650 that exposes a portion of an upper surface of the device isolation layer 112 is formed between the first recessed gate line GLAR and the recessed gate insulation layer 118AR and the second recessed gate line GLBR and the second recessed gate insulation layer 118BR.

Figure 24A:
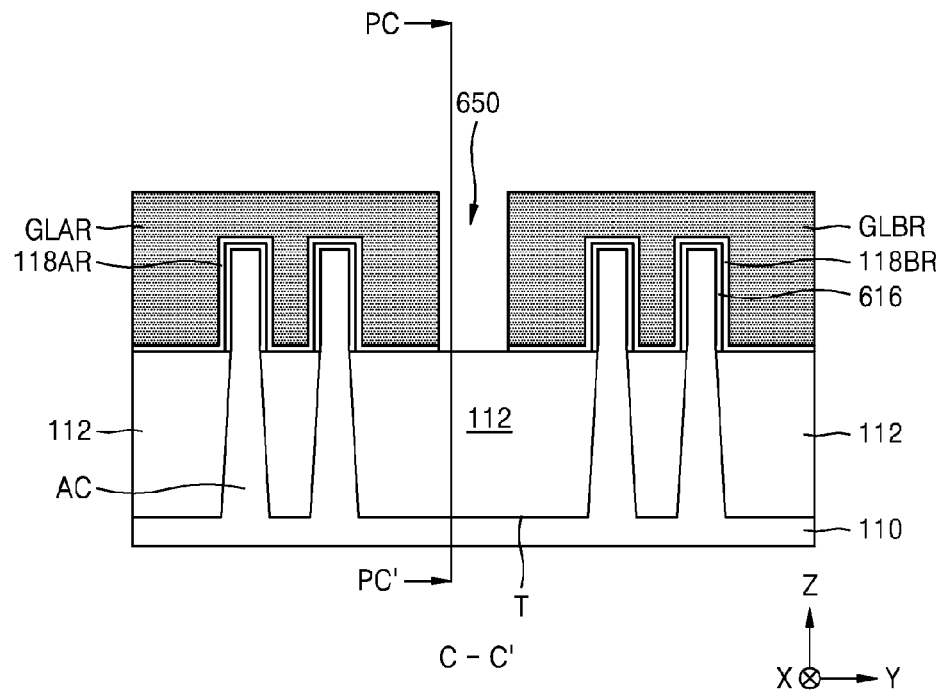
Figure 24B:
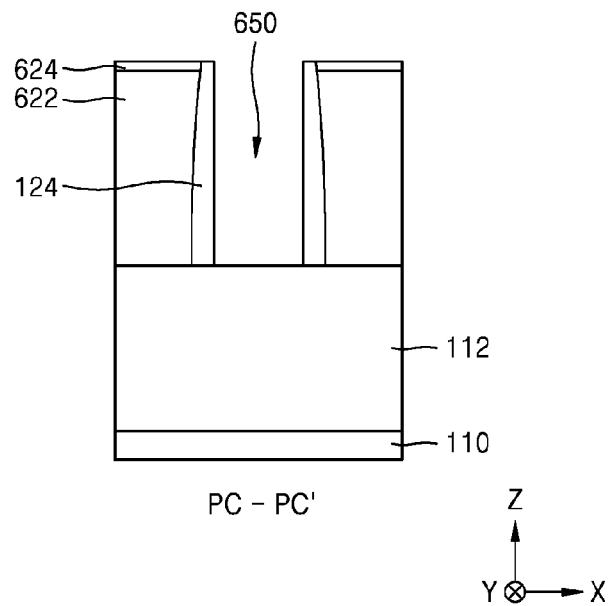

Referring to FIGS. 24A and 24B, the mask pattern 640 for gate isolation is removed so as to expose an upper surface of the first recessed gate line GLAR, an upper surface of the first recessed gate insulation layer 118AR, an upper surface of the second recessed gate line GLBR, and an upper surface of the second recessed gate insulation layer 118BR.

Figure 25A:
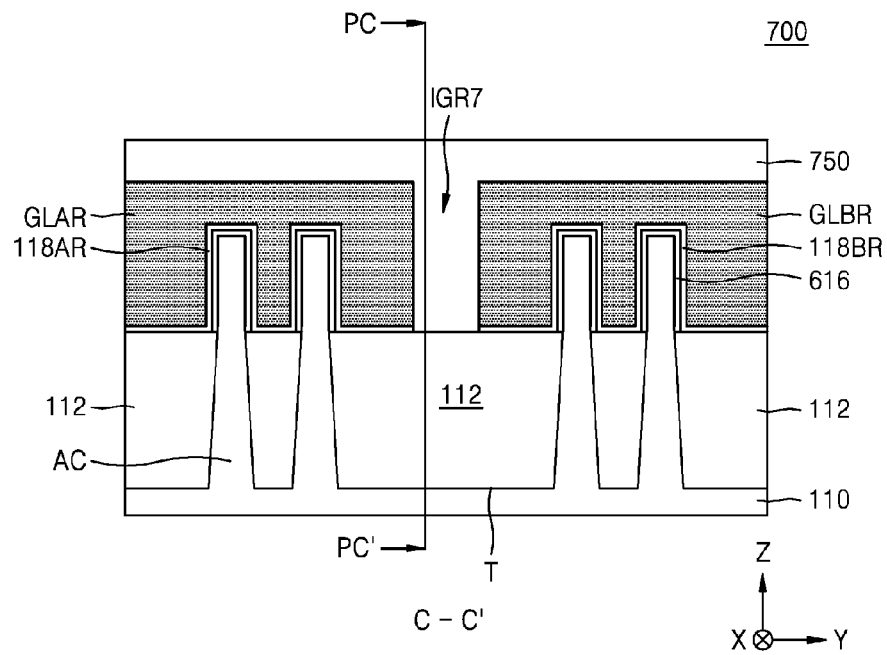
Figure 25B:
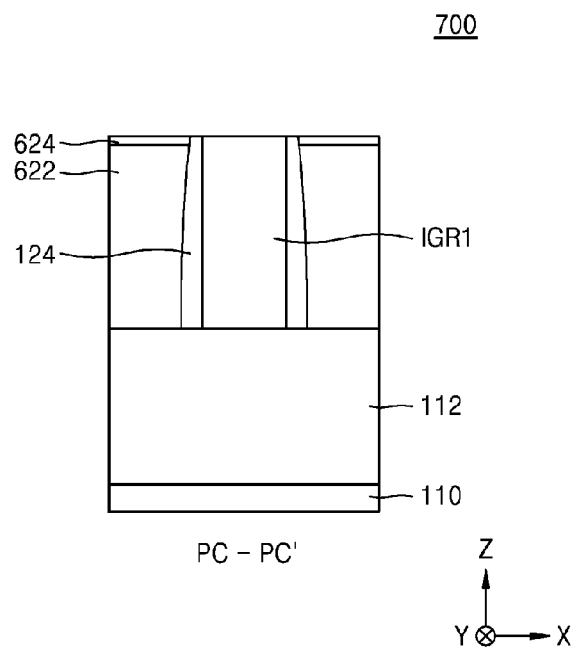

Referring to FIGS. 25A and 25B, an inter-gate insulation region IGR7 that fills the space 650 (see FIGS. 24A and 24B) between the first recessed gate line GLAR and the recessed gate insulation layer 118AR and the second recessed gate line GLBR and the second recessed gate insulation layer 118BR is formed using a method similar to the method described with reference to FIGS. 20A through 20C.

In order to form the inter-gate insulation region IGR7, an insulation material having a sufficient thickness to fill the space 650 and covering an upper surface of the second insulation layer 624 may be deposited, and the insulation material may be etched back or planarized until the upper surface of the second insulation layer 624 is exposed.

Details of the materials of the inter-gate insulation region IGR7 are the same as description of the inter-gate insulation region IGR1 described with reference to FIGS. 20A through 20C.

While the inter-gate insulation region IGR7 is formed, an insulation capping layer 750 that is integrally connected to the inter-gate insulation region IGR7 and extends to cover upper surfaces of the first recessed gate line GLAR, the recessed gate insulation layer 118AR, the second recessed gate line GLBR, and the second recessed gate insulation layer 118BR may be simultaneously formed.

A second thickness D2 of the insulation capping layer 750 may correspond to the first thickness D1 illustrated in FIG. 21B.

According to the method of manufacturing the integrated circuit device 700 according to the example embodiments of the inventive concept described with reference to FIGS. 21A through 25B, similarly to the method of manufacturing the integrated circuit device 600 according to the example embodiments of the inventive concept described with reference to FIGS. 10A through 20C, when forming a plurality of recessed gate lines GLAR and GLBR used in the integrated circuit device 700 by using a RMG process, a recessed gate layer 630R formed of a metal material used in a final structure in a space formed by removing the dummy gate line D124 is formed, and then the recessed gate layer 630R is separated to form the plurality of recessed gate lines GLAR and GLBR. Thus, the problem in which a residue of the dummy gate line D124 remains around the gate-cut region or a residue of the polysilicon sacrificial layer that is not completely removed may be prevented from the start.

In addition, as the gate-cut process is performed after the first source/drain region 120A and the second source/drain region 120B are formed, when forming the first source/drain region 120A and the second source/drain region 120B, defects that may be caused in the first source/drain region 120A and the second source/drain region 120B due to the gate-cut region may be prevented.

Figure 26:
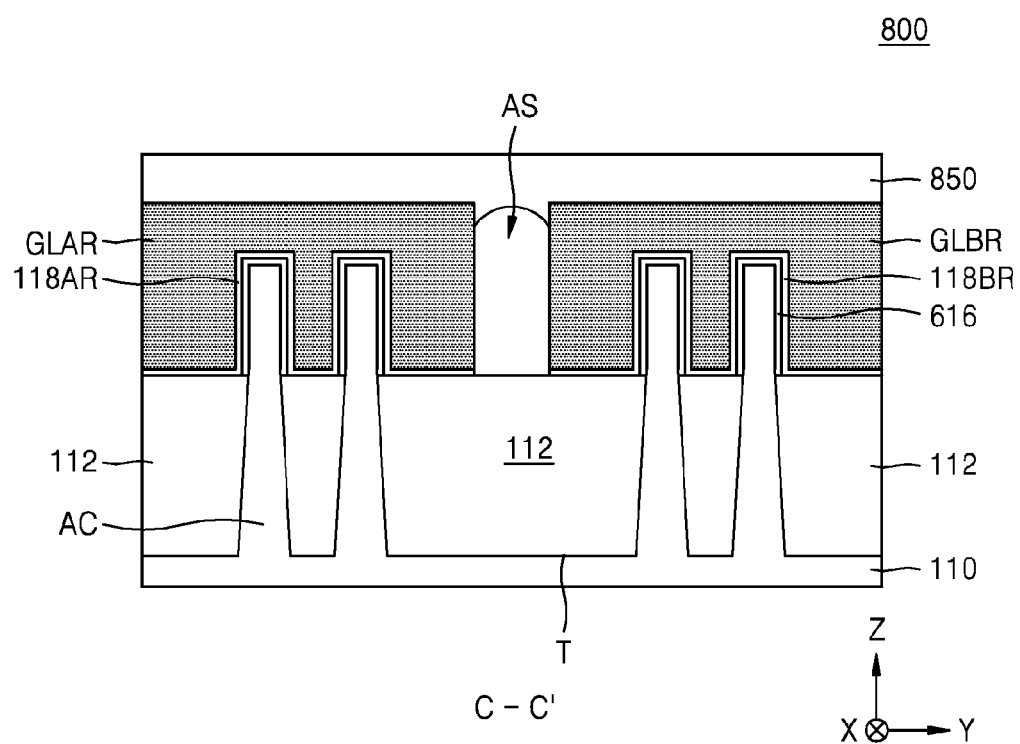
FIG. 26 is a cross-sectional view of a method of manufacturing an integrated circuit device according to certain example embodiments of the inventive concept.

FIG. 26 is a cross-sectional view of a method of manufacturing an integrated circuit device 800 according to certain example embodiments of the inventive concept.

The integrated circuit device 800 having an insulation region IGR8 having air space and a method of manufacturing the integrated circuit device 800 will be described with reference to FIG. 26.

Referring to FIG. 26, according to the method described with reference to FIGS. 21A through 24B, processes are performed up to a process of removing the mask pattern 640 for gate isolation, which exposes an upper surface of the first recessed gate line GLAR, an upper surface of the first recessed gate insulation layer 118AR, an upper surface of the second recessed gate line GLBR, and an upper surface of the second recessed gate insulation layer 118BR.

Next, while the space 650 (refer to FIGS. 24A and 24B) between the first recessed gate line GLAR and the first recessed gate insulation layer 118AR and the second recessed gate line GLBR and the second recessed gate insulation layer 118BR is exposed, the insulation capping layer 850 is formed.

When forming the insulation capping layer 850, an insulation material covering the upper surfaces of the first recessed gate line GLAR, the first recessed gate insulation layer 118AR, the second recessed gate line GLBR, and the second recessed gate insulation layer 118BR may be deposited so that air space AS is left in the space 650.

When performing a process of depositing the insulation material to form the insulation capping layer 850, a deposition process condition may be controlled such that the air space AS is left while the space 650 is not completely filled. In some embodiments, in order that the air space AS is left in the space 650, a process condition with a relatively deteriorated step coverage may be selected in the process of depositing the insulation material performed to form the insulation capping layer 850. The insulation capping layer 850 may be formed, for example, of an oxide layer, a nitride layer, or a combination of these. For example, the insulation capping layer 850 may be formed of a high density plasma (HDP) oxide layer.

According to the integrated circuit device 800 illustrated in FIG. 26, as the air space AS is formed in the space 650 between the first recessed gate line GLAR and the recessed gate insulation layer 118AR and the second recessed gate line GLBR and the second recessed gate insulation layer 118BR. A relative permittivity between the first recessed gate line GLAR and the second recessed gate line GLBR adjacent to each other may be reduced, and capacitance between adjacent conductive lines may be reduced.

While example structures and manufacturing methods are described above regarding integrated circuit devices having a structure similar to that of the integrated circuit device 100 illustrated in FIGS. 1A through 1E, such as the integrated circuit device 600, the integrated circuit device 700 further including the insulation capping layer 750, and the integrated circuit device 800 including the air space AS, various modifications and changes may be made within the scope of the inventive concept to manufacture, based on description provided above with reference to FIGS. 10A through 26, the integrated circuit device 200 illustrated in FIGS. 2A through 2E, the integrated circuit device 300 illustrated in FIGS. 3A through 3E, the integrated circuit devices 100, 400A, and 400B illustrated in FIGS. 7A through 8, the integrated circuit device 500 illustrated in FIGS. 9A and 9B, or other various integrated circuit devices having a similar structure to these.

While the integrated circuit devices including a FinFET having a three-dimensional channel and methods of manufacturing the integrated circuit devices are described with reference to FIGS. 1A through 26, the inventive concept is not limited thereto. For example, various modifications and changes may be made within the scope of the present disclosure to provide integrated circuit devices including a planar MOSFET having the characteristics according to the disclosed embodiments and methods of manufacturing the integrated circuit devices.

Figure 27:
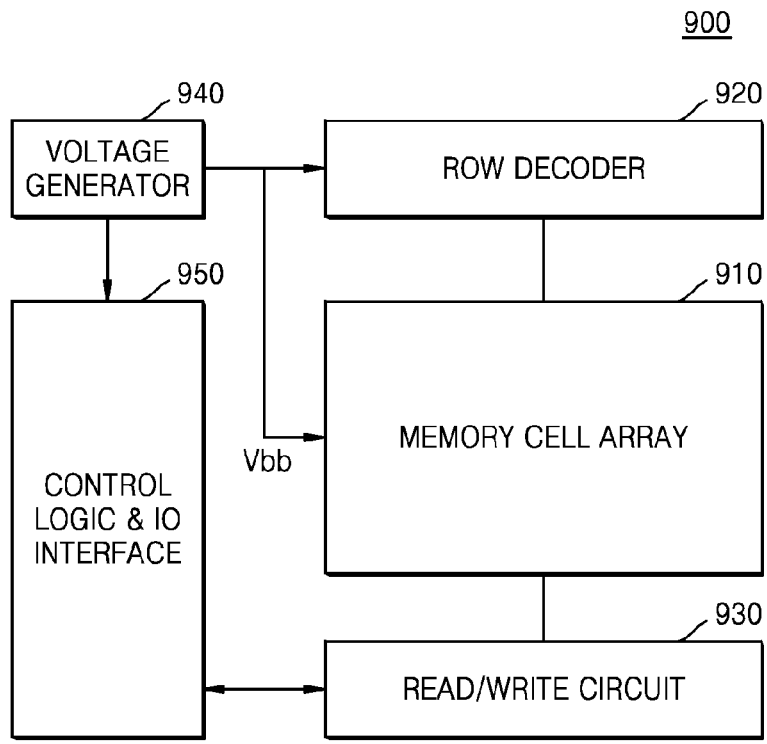
FIG. 27 is a block diagram illustrating an integrated circuit device according to example embodiments of the inventive concept.

FIG. 27 is a block diagram illustrating a non-volatile memory device 900 according to example embodiments of the inventive concept. The non-volatile memory device 900 including an integrated circuit device according to example embodiments of the inventive concept will be described with reference to FIG. 27.

Referring to FIG. 27, the nonvolatile memory device 900 may be provided in the form of, for example, a semiconductor device such as a NAND flash memory device. However, the nonvolatile memory device 900 is not limited to a NAND flash memory device but may also be, for example, a NOR flash memory, a resistive random access memory (RRAM), a phase-change RAM (PRAM), a magnetoresistive random access memory (MRAM), or a ferroelectric random access memory.

The nonvolatile memory device 900 may be implemented to have a three-dimensional array structure. The nonvolatile memory device 900 may be applied not only to a flash memory device that includes a charge storage layer formed of a conductive floating gate, but also to a charge trap flash (CTF) memory device that includes a charge storage layer formed of an insulation layer.

The nonvolatile memory device 900 may include a memory cell array 910, a row decoder circuit 920, a read/write circuit 930, a voltage generation circuit 940, and a control logic and input and output interface block 950.

The memory cell array 910 may include memory cells including word lines arranged in a row direction and bit lines arranged in a column direction. The memory cells may form memory blocks.

The row decoder circuit 920 may be controlled by the control logic and input and output interface block 950, and may select and drive the word lines of the memory cell array 910.

The read/write circuit 930 is controlled by the control logic and input and output interface block 950 and may operate as a read circuit or a write circuit according to an operational mode. For example, in a read operation, the read/write circuit 930 may operate as a read circuit that reads data from the memory cell array 910 under control of the control logic and input and output interface block 950. In a write operation (or programming operation), the read/write circuit 930 may operate as a write circuit that writes data to the memory cell array 910 under control of the control logic and input and output interface block 950.

The voltage generation circuit 940 is controlled by the control logic and input and output interface block 950, and may generate voltages to operate the nonvolatile memory device 900. For example, the voltage generation circuit 940 may generate a programming voltage, a pass voltage, a verification voltage or a selection voltage to be supplied to the word lines of the memory cell array 910 or a well bias voltage Vbb to be supplied to a substrate of the memory cell array 910 or a well formed in the substrate. The well bias voltage Vbb may be one of 0 V and a negative voltage according to an operational mode.

The control logic and input and output interface block 950 may control an overall operation of the nonvolatile memory device 900. The control logic and input and output interface block 950 may provide a data transmission channel between the nonvolatile memory device 900 and an external device such as a memory controller or a host. When a programming operation is requested, the control logic and input and output interface block 950 may control the voltage generation circuit 940 such that the substrate including the memory cells or the well formed in the substrate is biased to a negative voltage.

The control logic and input and output interface block 950 forms a semiconductor device that includes at least one of the integrated circuit devices 100, 200, 300, 400, 400A, 400B, 500, 600, 700, and 800 according to the disclosed embodiments or an integrated circuit device that is modified or changed based on these integrated circuit devices within the scope of the present disclosure.

Figure 28:
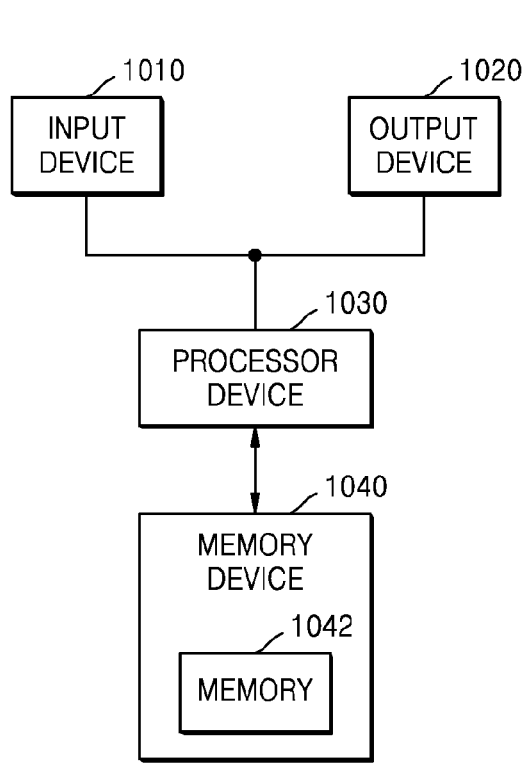
FIG. 28 is a diagram for explaining an example of an electronic system including an integrated circuit device according to example embodiments of the inventive concept.

FIG. 28 is a diagram for explaining an electronic system 1000 provided with an integrated circuit device according to example embodiments of the inventive concept.

Referring to FIG. 28, the electronic system 1000 may be an electronic device that includes an input device 1010, an output device 1020, a processor device 1030, and a memory device 1040.

The processor device 1030 may control the input device 1010, the output device 1020, and the memory device 1040 via a corresponding interface. The processor device 1030 may include at least one from among a microprocessor, a digital signal processor, a microcontroller, and logic devices capable of performing operations similar to those of the at least one microprocessor, the digital signal processor, and the microcontroller.

At least one of the processor device 1030 and the memory device 1040 may be a semiconductor device that includes at least one of the integrated circuit devices 100, 100A, 200, 300, 400, 500, 600, 700, and 800 according to the disclosed embodiments or an integrated circuit device that is modified or changed based on these integrated circuit devices within the scope of the present disclosure.

The input device 1010 and the output device 1020 may each include, for example, a keypad, a keyboard or a display device.

The memory device 1040 may include a memory 1042 such as a volatile memory device or a nonvolatile memory device such as a flash memory device. The electronic system 1000 may be provided for use by a user. For example, it may be a cell phone, laptop computer, tablet, or other electronic device that receives input from and outputs information to a user.

Figure 29:
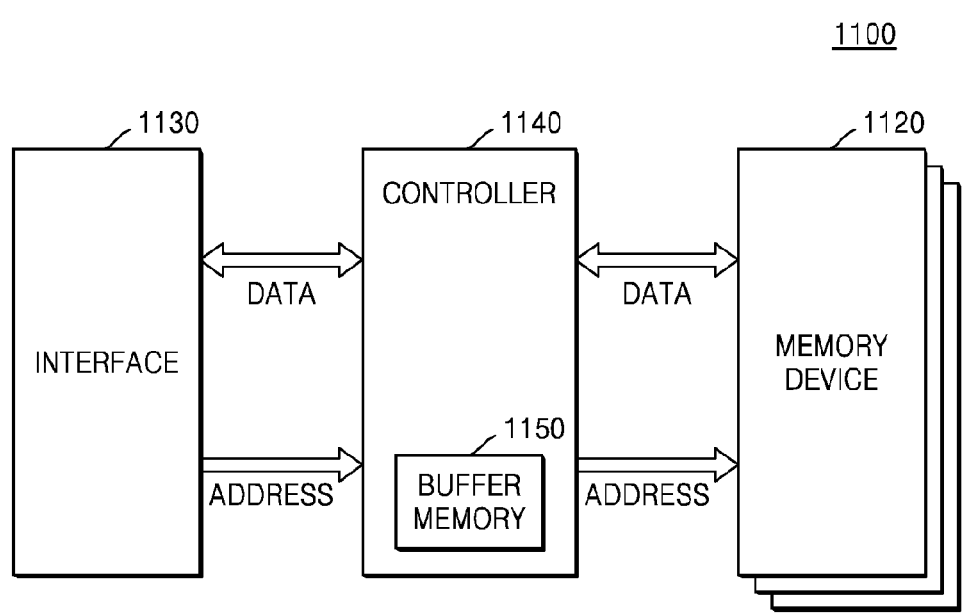
FIG. 29 is a block diagram illustrating an example of a memory system including an integrated circuit device according to the inventive concept.

FIG. 29 is a block diagram illustrating a memory system 1100 including an integrated circuit device according to certain example embodiments.

Referring to FIG. 29, the memory system 1100 may be provided as an electronic device that includes an interface unit 1130, a controller 1140, and a memory device 1120.

The interface unit 1130 may provide an interface between a memory system such as the electronic system 1000 illustrated in FIG. 29 and a host. The interface unit 1130 may include a data exchange protocol corresponding to the host to interface with the host. The interface unit 1130 may communicate with the host by using one of various interface protocols such as a universal serial bus (USB), a multimedia card (MMC), a peripheral component interconnect-express (PCI-E), a serial-attached SCSI (SAS), a serial advanced technology attachment (SATA), a parallel advanced technology attachment (PATA), a small computer system interface (SCSI), an enhanced small disk interface (ESDI), and integrated drive electronics (IDE).

The controller 1140 may receive data and an address from the outside via the interface unit 1130. The controller 1140 may access a memory device, for example, the memory device 1040 illustrated in FIG. 28, based on data and an address received from the host. The controller 1140 may transmit data read from the memory device 1120 via the interface unit 1130 to the host.

The controller 1140 may include a buffer memory 1150. The buffer memory 1150 may temporarily store write data received from the host or data read from the memory device 1120.

The memory device 1120 may be provided as a storage medium of the memory system 1100. For example, the memory device 1120 may be a PRAM, an MRAM, a resistive RAM (ReRAM), a ferroelectric RAM (FRAM), a NOR flash memory, or a combination of these. The memory device 1120 may be an electronic device that includes at least one of the integrated circuit devices 100, 100A, 200, 300, 400, 500, 600, 700, and 800 according to the disclosed embodiments or an integrated circuit device that is modified or changed based on these integrated circuit devices within the scope of the present disclosure.

The memory system 1100 illustrated in FIG. 29 may be provided in various electronic devices. For example, it may be mounted in an information processing unit such as a personal digital assistant (PDA), a portable computer, a web tablet, a digital camera, a portable media player (PMP), a mobile phone, a wireless phone, or a laptop computer. The memory system 1100 may be formed of a MultiMediaCard (MMC), a Secure Digital (SD) card, a micro SD card, a memory stick, an ID card, a Personal Computer Memory Card International Association (PCMCIA) card, a chip card, a universal serial bus (USB) card, a smart card, a Compact Flash (CF) card or the like.

While the present disclosure has been particularly shown and described with reference to example embodiments thereof, it will be understood that various changes in form and details may be made therein without departing from the spirit and scope of the following claims.

What is claimed is:

1. An integrated circuit device comprising:
   a plurality of active regions formed on a substrate and extending in a first direction;
   a first gate line and a second gate line formed on the substrate, extending in a straight line in a second direction and crossing the plurality of active regions, wherein the first gate line and the second gate line are spaced apart from each other;
   a first gate insulation layer extending in the second direction and covering a first surface of the first gate line facing a portion of the plurality of active regions and a first long-axis sidewall of the first gate line, while not covering a first short-axis sidewall of the first gate line facing the second gate line;
   a second gate insulation layer extending in the second direction and covering a second surface of the second gate line facing another portion of the plurality of active regions and a second long-axis sidewall of the second gate line, while not covering a second short-axis sidewall of the second gate line facing the first gate line; and
   an inter-gate insulation region interposed between the first gate line and the second gate line and abutting the first short-axis sidewall and the second short-axis sidewall.

2. The integrated circuit device of claim 1, wherein the first gate line and the second gate line each include a metal.

3. The integrated circuit device of claim 1, wherein the plurality of active regions are formed of a plurality of fin-type active regions protruding from the substrate,
   wherein the first gate line extends to cover a first group active region including at least one fin-type active region selected from the plurality of fin-type active regions, and
   the second gate line extends to cover a second group active region including at least one fin-type active region selected from the plurality of fin-type active regions and spaced apart from the first group active region.

4. The integrated circuit device of claim 1, wherein the first gate line and the second gate line each have a planar upper surface extending in the second direction, and the planar surfaces are positioned at a first level on the substrate.

5. The integrated circuit device of claim 1, wherein the first gate insulation layer and the second gate insulation layer are spaced apart from each other, and the inter-gate insulation region is between the first gate insulation layer and the second gate insulation layer.

6. The integrated circuit device of claim 1, wherein the first gate insulation layer and the second gate insulation layer are integrally connected to each other.

7. The integrated circuit device of claim 1, further comprising a third gate insulation layer interposed between the substrate and the inter-gate insulation region,
   wherein the first gate insulation layer and the second gate insulation layer are integrally connected to each other via the third gate insulation layer.

8. The integrated circuit device of claim 1, further comprising:
   a first insulation spacer covering the first long-axis sidewall of the first gate line, wherein the first gate insulation layer is between the first insulation spacer and the first long-axis sidewall; and
   a second insulation spacer covering the second long-axis sidewall of the second gate line, wherein the second gate insulation layer is between the second insulation spacer and the second long-axis sidewall,
   wherein the first insulation spacer and the second insulation spacer are integrally connected to each other.

9. The integrated circuit device of claim 8, further comprising a third insulation spacer covering a portion of the inter-gate insulation region,
   wherein the first insulation spacer and the second insulation spacer are integrally connected to each other via the third insulation spacer.

10. The integrated circuit device of claim 1, further comprising:
    a first insulation spacer covering the first long-axis sidewall of the first gate line, wherein the first gate insulation layer is between the first insulation spacer and the first long-axis sidewall; and
    a second insulation spacer covering the second long-axis sidewall of the second gate line, wherein the second gate insulation layer is between the second insulation spacer and the second long-axis sidewall,
    wherein the first insulation spacer and the second insulation spacer are spaced apart from each other, and the inter-gate insulation region is between the first insulation spacer and the second insulation spacer.

11. The integrated circuit device of claim 1, wherein the plurality of active regions, the first gate line, the second gate line, the first gate insulating layer, the second gate insulating layer, and the inter-gate insulation region form part of a static random access memory (SRAM) array comprising a plurality of SRAM cells formed on the substrate.

12. The integrated circuit device of claim 11, wherein the SRAM array further comprises:
a plurality of inverters each comprising a pull up transistor and a pull down transistor;
a plurality of pass transistors respectively connected to output nodes of the plurality of inverters,
wherein the first gate line is shared by a pull up transistor and a pull down transistor of a first inverter selected from the plurality of inverters, and
the second gate line is shared by two pass transistors selected from the plurality of pass transistors.

13. The integrated circuit device of claim 11, wherein the SRAM array further comprises:
a plurality of inverters each comprising a pull up transistor and a pull down transistor;
a plurality of pass transistors respectively connected to output nodes of the plurality of inverters,
wherein the first gate line is shared by a pull up transistor and a pull down transistor of a first inverter selected from the plurality of inverters, and
the second gate line is shared by a pull up transistor and a pull down transistor of a second inverter selected from the plurality of inverters.

14. The integrated circuit device of claim 11, wherein the SRAM array further comprises a plurality of NMOS transistors and a plurality of PMOS transistors,
wherein the first gate line and the second gate line are each shared by a plurality of transistors including channels of the same conductivity type as one another, selected from the plurality of NMOS transistors and the plurality of PMOS transistors.

15. The integrated circuit device of claim 11, wherein the SRAM array further comprises a plurality of NMOS transistors and a plurality of PMOS transistors,
wherein the first gate line and the second gate line are each shared by a plurality of transistors including channels of different conductivity types, selected from the plurality of NMOS transistors and the plurality of PMOS transistors.

16. The integrated circuit device of claim 11, wherein the SRAM array further comprises a plurality of NMOS transistors and a plurality of PMOS transistors,
wherein one of the first gate line and the second gate line is shared by a plurality of transistors including channels of the same conductivity type as one another, selected from the plurality of NMOS transistors and the plurality of PMOS transistors, and
the other of the first gate line and the second gate line is shared by a plurality of transistors including channels of different conductivity types, selected from the plurality of NMOS transistors and the plurality of PMOS transistors.

17. The integrated circuit device of claim 11, wherein the plurality of active regions are formed of a plurality of fin-type active regions protruding from the substrate,
wherein the first gate line extends to cover two sidewalls and an upper surface of a first fin-type active region selected from the plurality of active regions, and
the second gate line extends to cover two sidewalls and an upper surface of a second fin-type active region selected from the plurality of active regions and spaced apart from the first fin-type active region.

18. The integrated circuit device of claim 11, wherein the first gate line and the second gate line each comprise a metal layer extending in the second direction and having a planar upper surface parallel to the substrate, and the metal layers are positioned at a first level on the substrate.

19. The integrated circuit device of claim 1, wherein:
the substrate includes a plurality of cells each having a cell boundary and including at least one logic circuit;
the plurality of active regions are included among a first cell and a second cell adjacent to each other among the plurality of cells;
the first gate line is included in the first cell; and
the second gate line is included in the second cell.

20. The integrated circuit device of claim 19, wherein the inter-gate insulation region is disposed between the cell boundary of the first cell and the cell boundary of the second cell.

21. The integrated circuit device of claim 19, wherein the plurality of active regions are formed of a plurality of fin-type active regions protruding from the substrate, and
the first gate line and the second gate line are shared by a plurality of fin field effect transistors (FinFET) formed on the substrate.

22. The integrated circuit device of claim 19, wherein the first gate line and the second gate line are shared by a plurality of planar metal oxide semiconductor field effect transistors (MOSFET) formed on the substrate.

23. The integrated circuit device of claim 19, wherein the first gate line and the second gate line each comprise a metal layer extending in the second direction and having a planar upper surface parallel to the substrate, wherein the metal layers are positioned at a first level on the substrate.

\* \* \* \* \*